United States Patent [19]
Osakabe et al.

[11] Patent Number: 6,076,596
[45] Date of Patent: *Jun. 20, 2000

[54] COOLING APPARATUS FOR HIGH-TEMPERATURE MEDIUM BY BOILING AND CONDENSING REFRIGERANT

[75] Inventors: Hiroyuki Osakabe, Chita-gun; Kiyoshi Kawaguchi, Toyota; Masahiko Suzuki, Hoi-gun, all of Japan

[73] Assignee: Denso Corporation, Kariya, Japan

[ * ] Notice: This patent is subject to a terminal disclaimer.

[21] Appl. No.: 09/058,211

[22] Filed: Apr. 10, 1998

Related U.S. Application Data

[63] Continuation-in-part of application No. 08/818,731, Mar. 14, 1997.

[30] Foreign Application Priority Data

| Mar. 14, 1996 | [JP] | Japan | 8-57359 |
| Mar. 14, 1996 | [JP] | Japan | 8-57360 |
| Jul. 29, 1996 | [JP] | Japan | 8-198644 |
| Aug. 20, 1996 | [JP] | Japan | 8-218184 |
| Dec. 13, 1996 | [JP] | Japan | 8-334094 |
| Jan. 17, 1997 | [JP] | Japan | 9-6255 |
| Apr. 10, 1997 | [JP] | Japan | 9-092262 |
| Sep. 8, 1997 | [JP] | Japan | 9-242540 |

[51] Int. Cl.⁷ .................................. F28D 15/00
[52] U.S. Cl. ................. 165/104.33; 165/104.21; 361/700; 257/715
[58] Field of Search ................ 165/104.33, 80.3, 165/153, 67, 76; 257/715; 361/700

[56] References Cited

U.S. PATENT DOCUMENTS

| 5,417,280 | 5/1995 | Hayashi et al. | 165/153 |
| 5,832,989 | 11/1998 | Osakabe et al. | 165/104.33 |

FOREIGN PATENT DOCUMENTS

| 409179A1 | 1/1991 | European Pat. Off. . | |
| 3544185A1 | 6/1987 | Germany . | |
| 53-109249 | 9/1978 | Japan . | |
| 353145141 | 12/1978 | Japan | 165/104.33 |
| 56-51848 | 5/1981 | Japan . | |
| 0138692 | 10/1981 | Japan | 165/104.33 |
| 0149588 | 11/1981 | Japan | 165/104.33 |
| 56-14757 | 11/1981 | Japan . | |
| 60-194289 | 10/1985 | Japan . | |
| 0001041 | 1/1986 | Japan | 165/104.33 |
| 62-151755 | 9/1987 | Japan . | |
| 62-162847 | 10/1987 | Japan . | |
| 1-263491 | 10/1989 | Japan . | |
| 1-305275 | 12/1989 | Japan . | |
| 2-3320 | 1/1990 | Japan . | |
| 2-93270 | 4/1990 | Japan . | |
| 2-233993 | 9/1990 | Japan . | |
| 2-251187 | 10/1990 | Japan . | |
| 4-174294 | 6/1992 | Japan . | |
| 4-267593 | 9/1992 | Japan . | |
| 5-60476 | 3/1993 | Japan . | |
| 5-102687 | 4/1993 | Japan . | |
| 5-141811 | 6/1993 | Japan . | |
| 5-87995 | 11/1993 | Japan . | |
| 6-12554 | 1/1994 | Japan . | |
| 6-53376 | 2/1994 | Japan . | |
| 7-30023 | 1/1995 | Japan . | |
| 7-113589 | 5/1995 | Japan . | |
| 7-39895 | 5/1995 | Japan . | |
| 8-31996 | 2/1996 | Japan . | |
| 8-78589 | 3/1996 | Japan . | |
| 8-321570 | 12/1996 | Japan . | |
| 9-307306 | 11/1997 | Japan . | |
| 2202681 | 9/1988 | United Kingdom . | |
| 9005380 | 5/1990 | WIPO | 165/104.33 |

*Primary Examiner*—Christopher Atkinson
*Attorney, Agent, or Firm*—Pillsbury Madison & Sutro LLP

[57] ABSTRACT

A cooling apparatus includes a refrigerant tank having a surface to which heating devices are attached and containing liquid refrigerant which is boiled and evaporated by heat transferred from the heating devices, and a radiator for radiating heat of the boiled and vaporized refrigerant in a radiating passage thereof. In the radiating passage, a inner fin and a projection to position and fix the inner fin are provided, and a predetermined gap is provided between the projection and a bottom surface of the radiating passage. Thus the refrigerant condensed and liquefied in the radiating passage can reach an outflow communicating portion while flowing through the fluid passage formed as the gap.

9 Claims, 45 Drawing Sheets

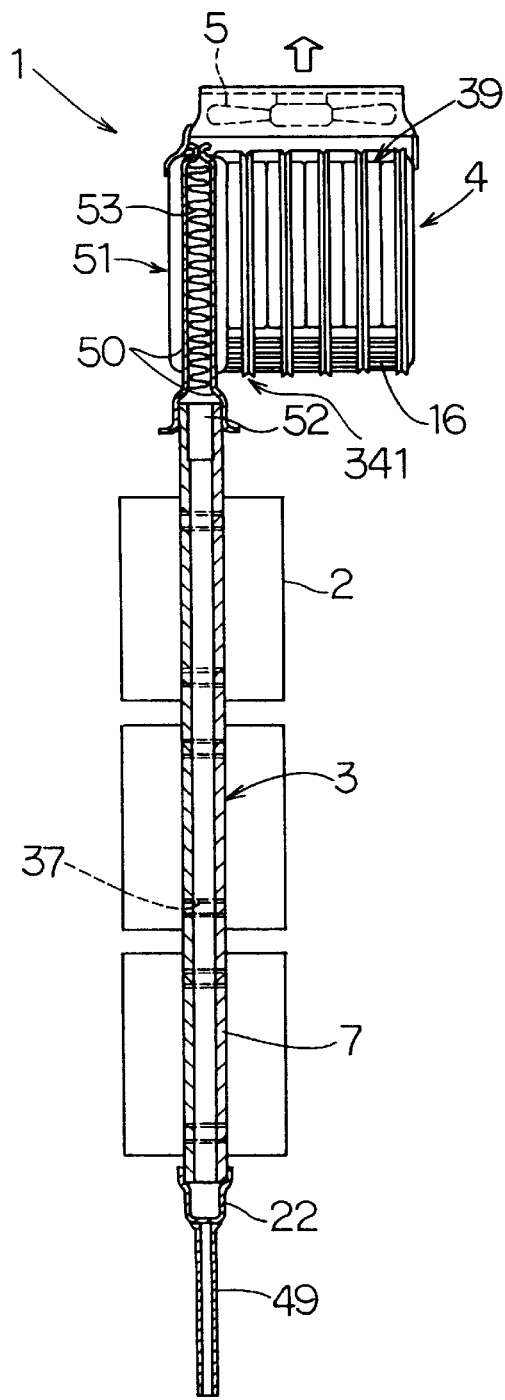
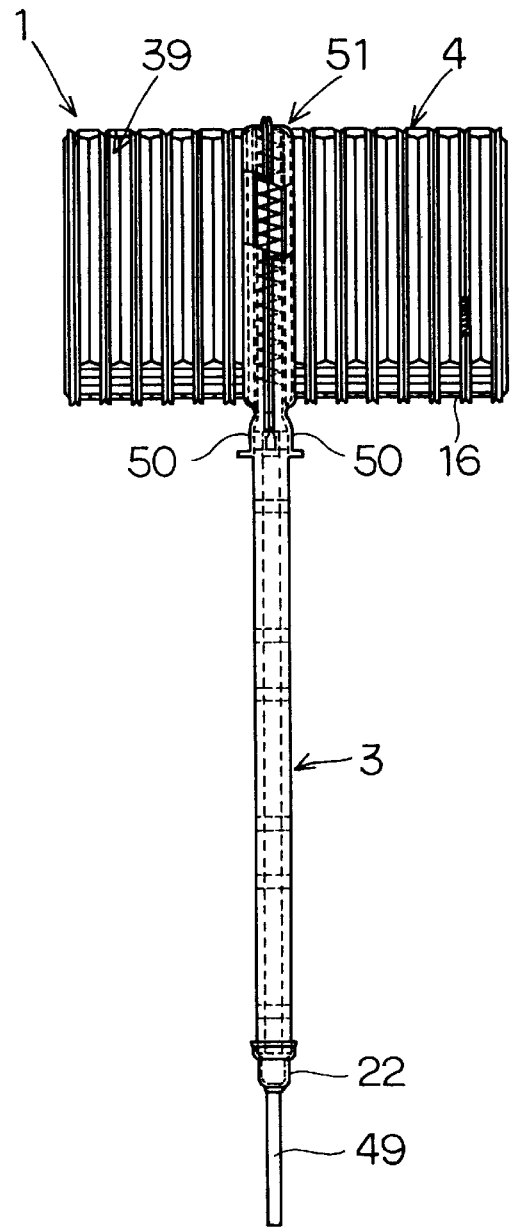

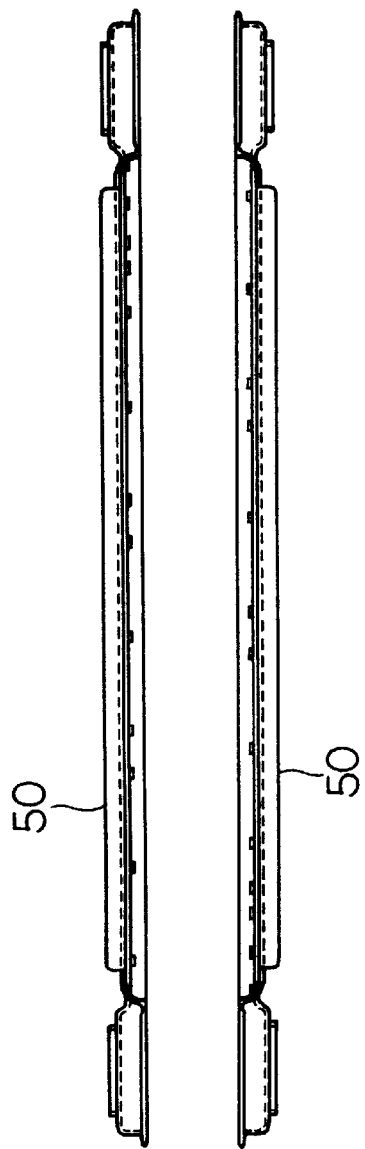
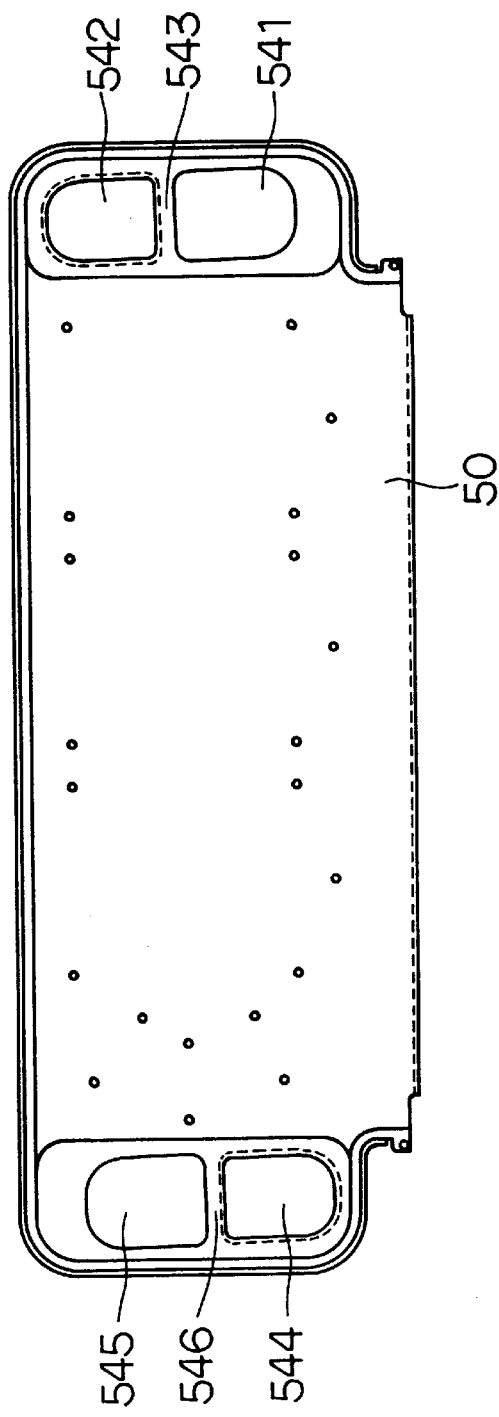
FIG. 16A
FIG. 16B

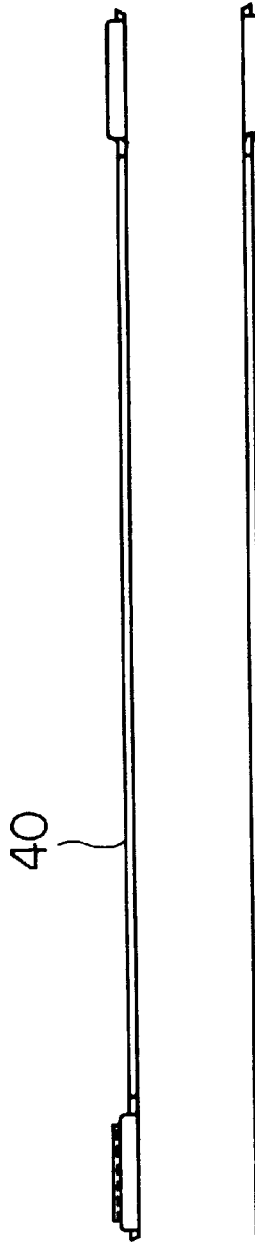
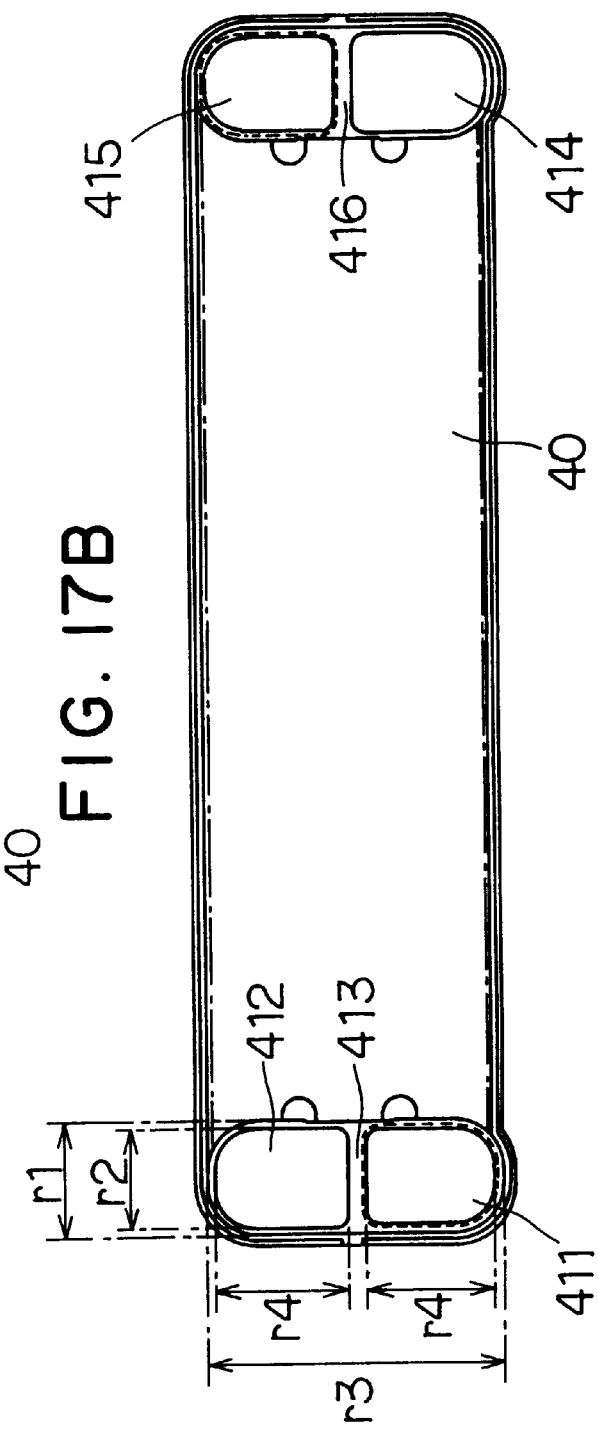

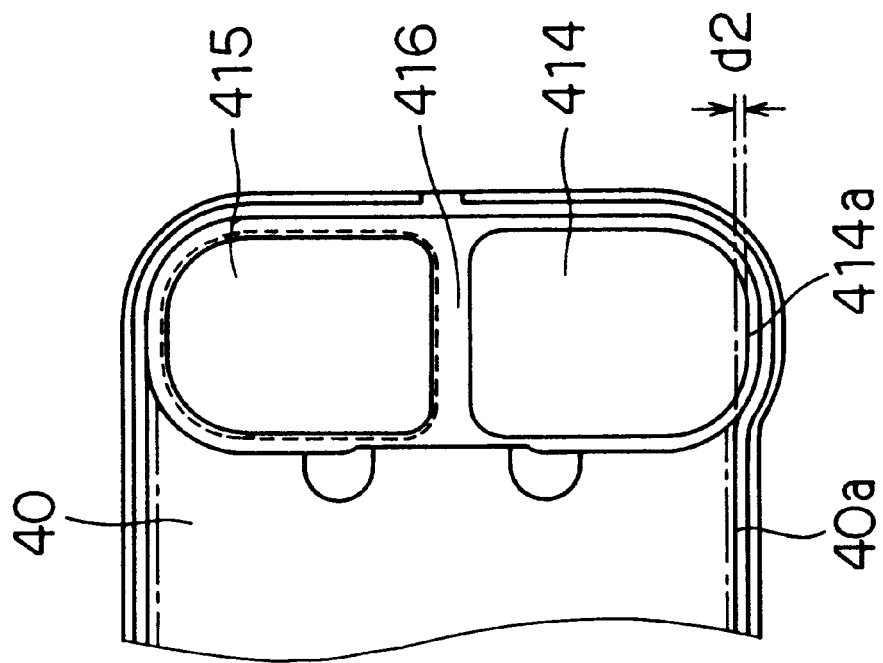
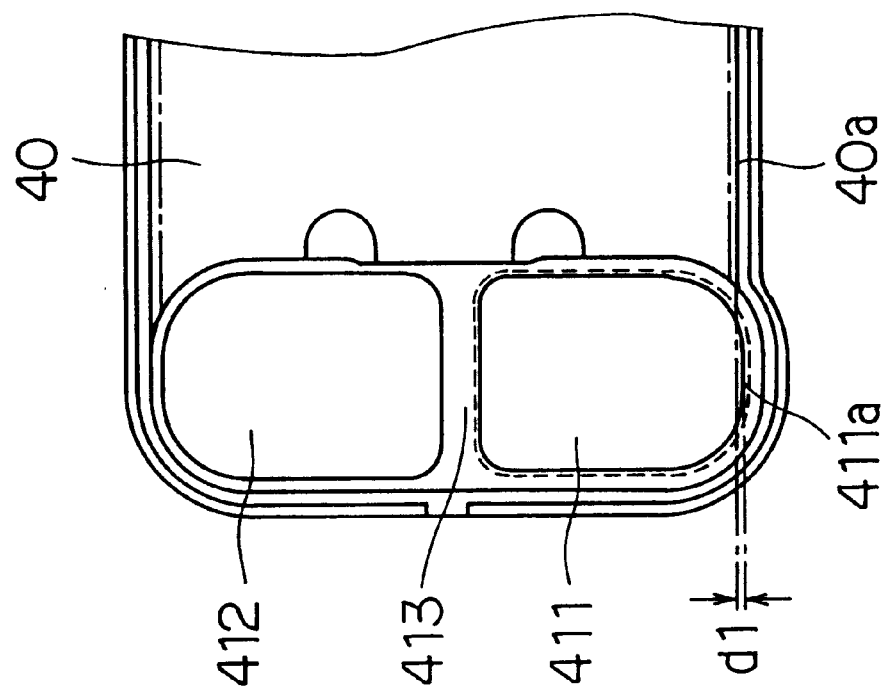

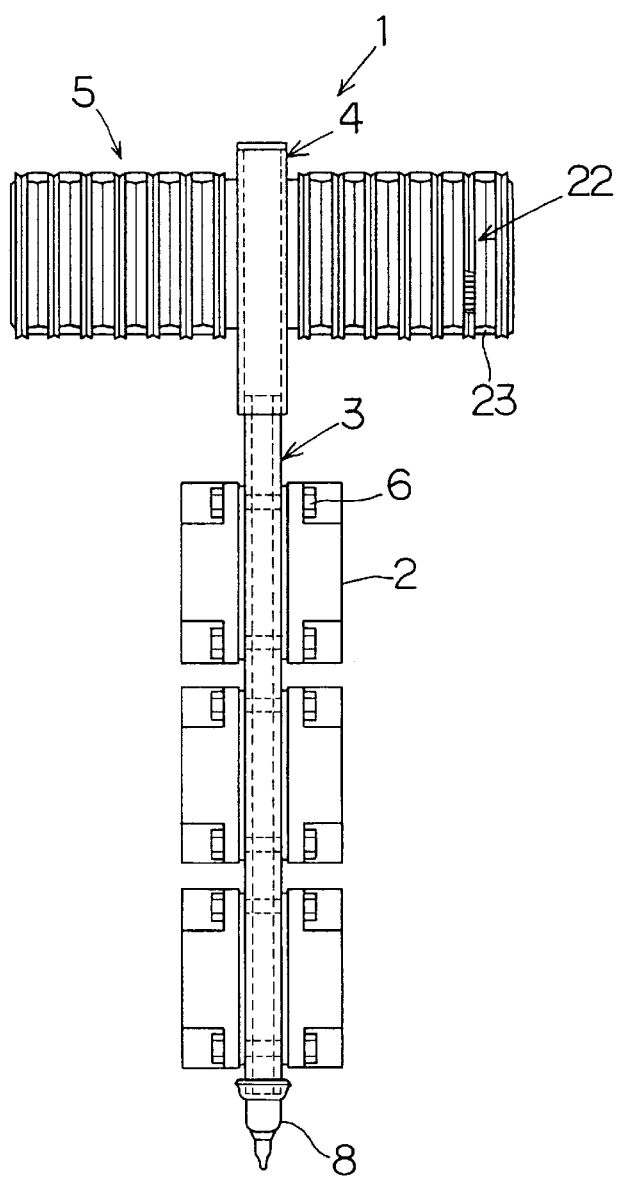
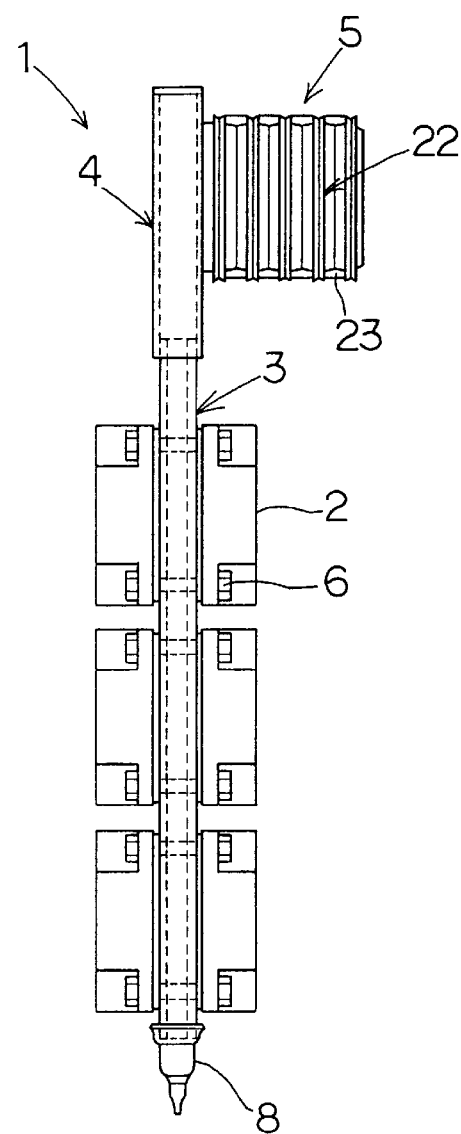

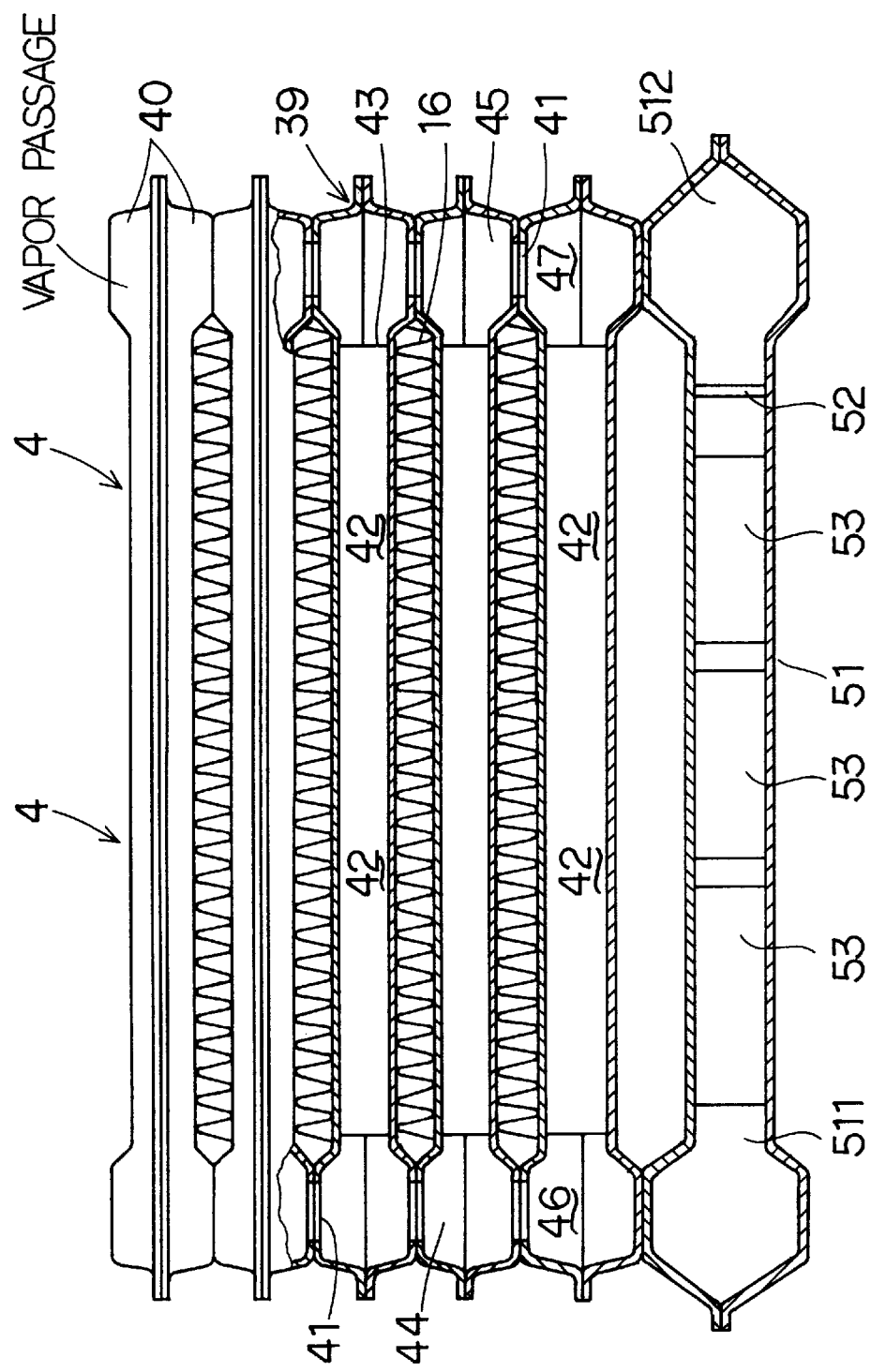

A — A

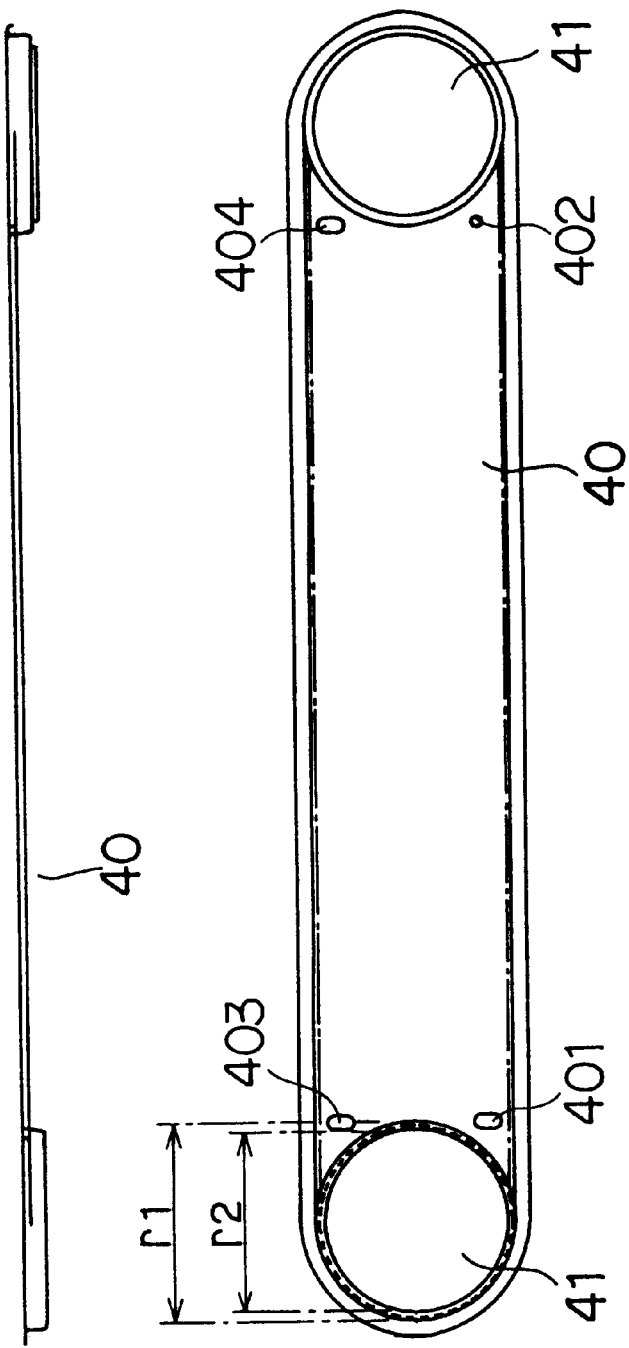
FIG. 42A
FIG. 42B

ID_596
COOLING APPARATUS FOR HIGH-TEMPERATURE MEDIUM BY BOILING AND CONDENSING REFRIGERANT

CROSS REFERENCE TO THE RELATED APPLICATIONS

This application is a continuation-in-part of U.S. patent application Ser. No. 08/818,731 filed Mar. 14, 1997, and based on and claims priority of Japanese Patent Application Nos. Hei. 8-57359 filed on Mar. 14, 1996, Hei. 8-57360 filed on Mar. 14, 1996, Hei. 8-198644 filed on Jul. 29, 1996, Hei. 8-218184 filed on Aug. 20, 1996, Hei. 8-334094 filed on Dec. 13, 1996, Hei. 9-6255 filed on Jan. 17, 1997, Hei. 9-92262 filed on Apr. 10, 1997, and Hei. 9-242540 filed on Sep. 8, 1997, the contents of which are incorporated herein by reference.

BACKGROUND OF THE INVENTION

1. Field of the Invention:

The present invention relates to a cooling apparatus for a high-temperature medium by boiling and condensing refrigerant, capable of absorbing heat generated from a high-temperature medium such as a heating body of a semiconductor device or electric device, to cool the high-temperature medium.

2. Description of Related Art:

There have been known cooling apparatuses for a high-temperature medium by boiling and condensing refrigerant, for cooling heat generated from a high-temperature medium such as a heating body. Among those known cooling apparatuses, as disclosed in JP-A-56-147457, JP-U-62-151755, or JP-A-6-53376, there is a cooling apparatus capable of preventing a flooding of ascending refrigerant which has been boiled and vaporized and liquid refrigerant which has been cooled in a radiator and is returning to a refrigerant tank, within the apparatus, i.e., the flooding being a phenomenon in which both refrigerants collide with each other, to perform a heat exchanging operation efficiently.

The cooling apparatus disclosed in JP-A-56-147457 includes a refrigerant tank for containing a refrigerant to be boiled and evaporated by heat generated by a heating body, an inflow passage having a substantially uniform diameter communicating with the refrigerant tank, a radiator having a plurality of radiating passages communicating with the inflow passage, and an outflow passage through which the refrigerant condensed and liquefied in the radiator is returned to the refrigerant tank.

According to this cooling apparatus, bubbles of the refrigerant blow up and the gas-phase refrigerant flows through the inflow passage into the refrigerant passage to transfer heat.

Generally, disposing an inner fin inside the refrigerant passage in the radiator for improving the radiating performance is well known. Thus, it is considerable that the inner fin is disposed inside the refrigerant passage in the cooling apparatus disclosed in JP-A-56-147457. Also, it is considerable that a projection is provided for positioning and fixing the inner fin when the inner fin is disposed.

However, when the projection is disposed to contact a bottom surface of the refrigerant passage, the liquid refrigerant condensed in the refrigerant passage is blocked by the projection in a flow passage reaching the outflow communicating portion. That is, the refrigerant flowing in the lowest portion (bottom surface portion) of the refrigerant passage is dammed by the projection and stored in the refrigerant passage. As a result, an amount of the refrigerant used in a refrigerant circuit is reduced. Thus, the heat transmitting area in the refrigerant passage is reduced thereby deteriorating the radiating performance.

Further, in the cooing apparatus disclosed in JP-A-6-53376, when the cooling apparatus is inclined so that the condensed liquid flows in reverse, the condensed liquid cannot return to the refrigerant tank. In the cooling apparatus disclosed in JP-U-62-151755, the refrigerant passage is inclined to return the condensed liquid into the tank. However, the entire height and width of the apparatus are enlarged, i.e., the size of the apparatus is enlarged, to incline the refrigerant passage.

SUMMARY OF THE INVENTION

A first object of the present invention to provide a cooling apparatus capable of preventing the radiating performance from deteriorating.

A second object of the present invention is to provide a cooling apparatus capable of suppressing a radiating area from being reduced by a liquid refrigerant condensed in a refrigerant passage.

A third object of the present invention is to provide a cooling apparatus capable of preventing the flow of the refrigerant from being shut by a projection to fix an inner fin.

A fourth object of the present invention is to provide a cooling apparatus capable of returning the condensed liquid refrigerant to a refrigerant tank even when the cooling apparatus is inclined in a direction by which the condensed liquid flows in reverse in the radiating passage, without enlarging the size thereof.

According to a first aspect of the present invention, a predetermined gap is provided between the projection and a bottom surface of a refrigerant passage, thus, the refrigerant condensed and liquefied in the radiating passage can reach an outflow communicating portion while flowing through the fluid passage formed by the gap. Accordingly, as the refrigerant is suppressed from being stored in the radiating passage, the refrigerant amount used in the refrigerant circuit can be prevented from being reduced. The radiating area in the refrigerant passage can be prevented from being reduced thereby improving the radiating performance.

According to a second aspect of the present invention, a plurality of radiating tubes are provided between an inflow communicating portion. The plurality of radiating tubes are communicated with each other by a communicating passage. Thus, even when the cooling apparatus is inclined in the direction by which the condensed liquid flows in reverse in the radiating passage, the condensed liquid flowing in reverse drops through a communicating passage into an outflow chamber. After that, the condensed liquid returns into a condensed liquid passage in the refrigerant tank.

BRIEF DESCRIPTION OF THE DRAWINGS

Additional objects and advantages of the present invention will be more readily apparent from the following detailed description of preferred embodiments thereof when taken together with the accompanying drawings in which:

FIG. 9 is a cross sectional view taken along the line IX—IX of FIG. 7;

FIG. 15 is a side view of the cooling apparatus of FIG. 14;

FIGS. 16A and 16B are a side view and a plan view, respectively, of pressed plates constructing a connecting pipe;

FIGS. 17A and 17B are a side view and a plan view, respectively, of pressed plates constructing a radiating tube;

FIGS. 18A and 18B are enlarged fragmentary views of the pressed plates of FIGS. 17A and 17B.

FIG. 21 is a side view of the cooling apparatus according to the fifth embodiment;

FIG. 24 is a side view of the cooling apparatus according to the sixth embodiment of the present invention;

FIG. 31 is a cross sectional view taken along the line XXXI—XXXI of FIG. 28;

FIGS. 42A and 42B are a side view and a plan view, respectively, of formed plates for forming a radiating tube;

DETAILED DESCRIPTION OF THE PREFERRED EMBODIMENTS

First Embodiment

Figure 1:
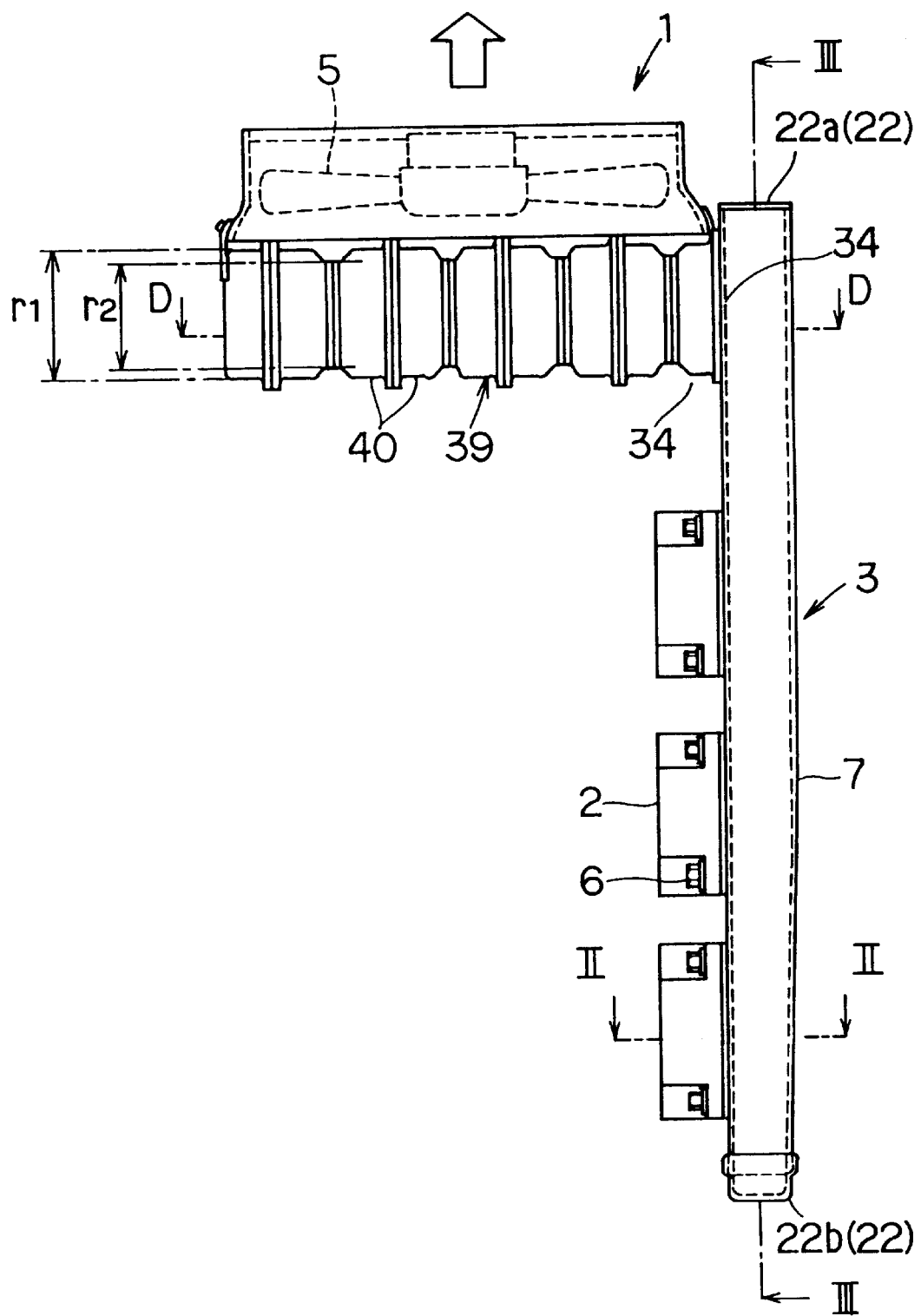
FIG. 1 is a side view of a cooling apparatus according to a first embodiment of the present invention.
Figure 2:
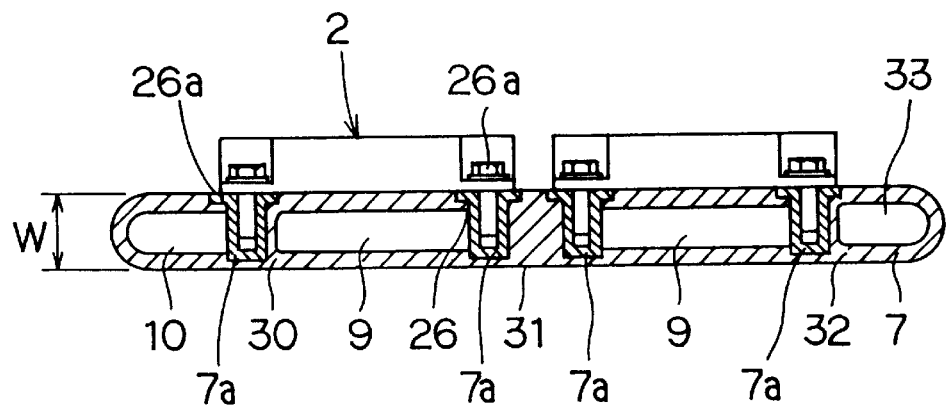
FIG. 2 is a cross sectional view taken along the line II—II of FIG. 1.
Figure 4A:
FIGS. 4A and 4B are a side view and a plan view, respectively, of formed plates for forming a radiating tube.
Figure 4B:
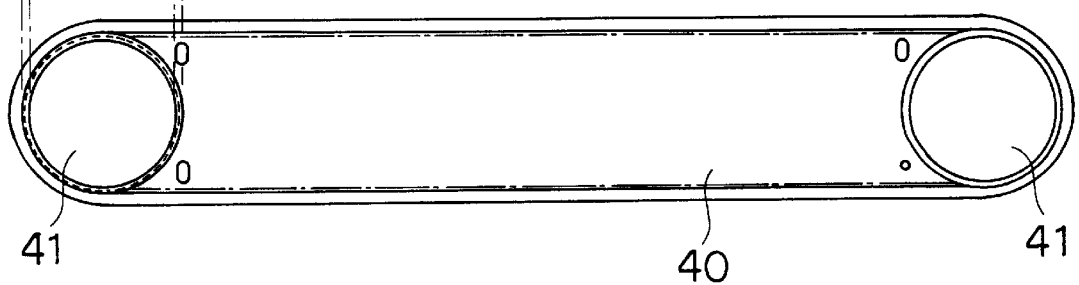
Figure 3:
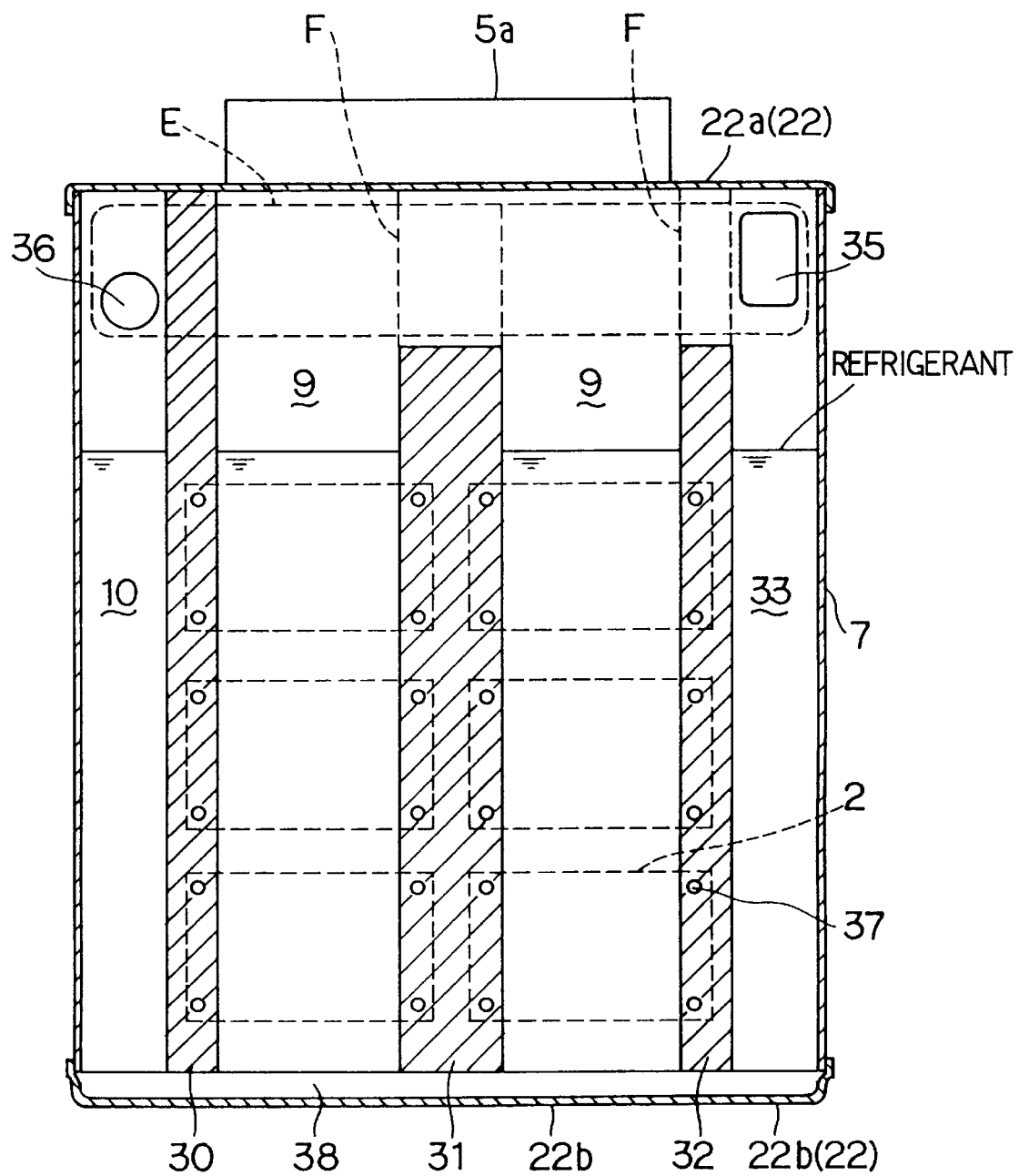
FIG. 3 is a cross sectional view taken along the line III—III of FIG. 1.
Figure 5:
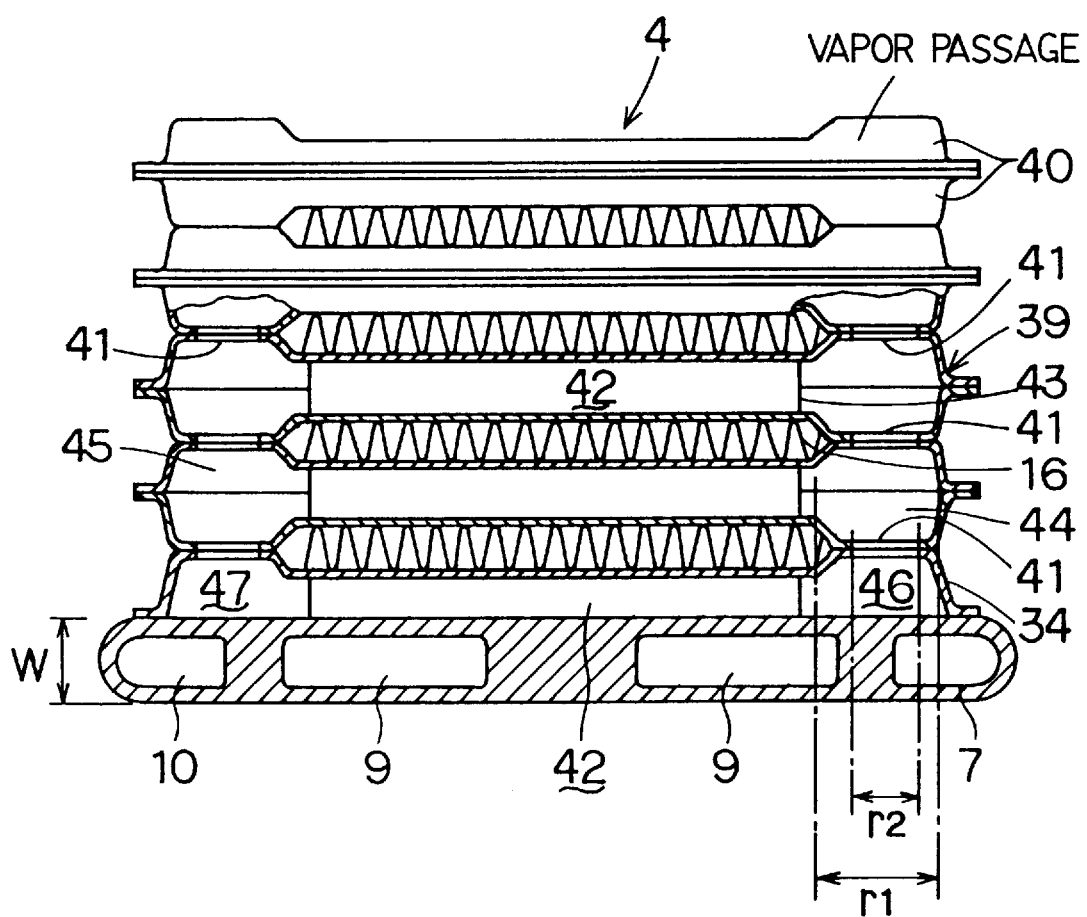
FIG. 5 is a cross sectional view taken along the line V—V of FIG. 1.

FIG. 1 is a side view of a cooling apparatus in a first embodiment according to the present invention. FIG. 2 is a cross sectional view taken along the line II—II of FIG. 1. FIG. 3 is a cross sectional view taken along the line III—III of FIG. 1. FIGS. 4A and 4B are a side view and a plan view, respectively, of pressed plates for forming a radiating tube. FIG. 5 is a cross sectional view taken along the line V—V of FIG. 1.

A cooling apparatus 1 according to the first embodiment cools IGBT modules 2 as high-temperature mediums, which constitute an inverter circuit included in an electric vehicle, a general electric controller or the like. The cooling apparatus 1 includes a refrigerant tank 3, a radiator 4 and a cooling fan 5.

As shown in FIG. 1, the IGBT modules 2 are fixed to the outer surface of a wall of the refrigerant tank 3 with bolts 6. Preferably, a heat-conductive grease is provided between the radiating plate of the IGBT module 2 and the outer wall of the refrigerant tank 3.

The refrigerant tank 3 includes a hollow extrusion member 7 formed by extruding an aluminum block, and end caps 22a and 22b attached to upper and lower open ends of the extrusion member 7, respectively. The other open end of the extrusion member 7 as an inlet and an outlet of the refrigerant communicates with the radiator 4.

As shown in FIGS. 2 and 3, the extrusion member 7 has a flat shape of a thickness W being less than the width and the length of the wall thereof to which the IGBT modules 2 are attached. An interior of the extrusion member 7 is partitioned by partition walls 30, 31 and 32 extending vertically into vapor passages 9, a condensed liquid passage 10, and an inoperative passage 33, which pass through the extrusion member 7 longitudinally. A refrigerant tank outlet 35 of the vapor passages 9 and a refrigerant tank inlet 36 of the condensed liquid passage 10 are formed in a portion of the wall of the extrusion member 7 to which the radiator 4 (radiating tubes 39) are connected by a connecting plate 34 (FIG. 1).

By cutting away each upper end portion of the partition walls 30, 31 and 32, a plurality of vapor passages 9, the condensed liquid passage 10 and the inoperative passage 33 open at a position slightly below the upper end of the extrusion member 7. The open end of each vapor passage 9 and the open end of the condensed liquid passage 10 serve as the refrigerant tank outlet 35 for the vaporized refrigerant and the refrigerant tank inlet 36 for the condensed liquid refrigerant, respectively. Internally threaded holes into which the bolts 6 are screwed are formed in thick wall portions 7a where the passages 10 and 11 are not formed, of the extrusion member 7.

The refrigerant tank outlet 35 is formed above the inoperative passage 33. Upper portions indicated by broken lines F in FIG. 3 of the partition wall 31 between the two vapor passages 9 and the partition wall 32 between the vapor passage 9 and the inoperative passage 33 are removed by an additional machining such as milling so that the refrigerant tank outlet 35 communicates with the vapor passages 9. Internally threaded holes 37 to which the bolts 6 for mounting the IGBT modules 2 to the refrigerant tank 3 are screwed are formed in the partition walls 30, 31 and 32. The inoperative passage 33 is formed to be balanced with the condensed liquid passage 10 when the extrusion member 7 is extruded, and such an inoperative passage is not used as a condensed liquid passage. Therefore, it is not always necessary to form the inoperative passage 33.

The end caps 22 are brazed to the upper and the lower end of the extrusion member 7. The upper end cap 22a is joined to the upper end of the extrusion member 7 so as to close the upper open end of the extrusion member 7. The lower end cap 22b is joined to the lower end of the extrusion member 7 so that a lower communicating passage 38 communicating the vapor passages 9, the condensed liquid passage 10 and the inoperative passage 33 with each other is formed between the lower end of the extrusion member 7 and the lower end cap 22b.

The radiator 4 is a so-called drawn cup type heat exchanger. As shown in FIG. 4A, the radiator 4 is formed by laminating alternately a plurality of radiating tubes 39 in parallel, each of which is formed by joining two symmetrical thin pressed plates 40. The radiator 4 is joined to the refrigerant tank 3 by a connecting plate 34 (FIG. 5).

As shown in FIG. 5, the connecting plate 34 is attached hermetically to the outer surface of the extrusion member 7 so as to cover the refrigerant tank outlet 35 and the refrigerant tank inlet 36 of the extrusion member 7. With a space surrounded by an outer wall surface of the extrusion member 7, the connecting plate 34 constitutes a liquid refrigerant return unit 341 (adhesion amount reducing means) having an inflow return chamber 461 (larger opening, expanded portion, first expanded portion) having a predetermined diameter r1 and communicating with the tank outlet 35 of the refrigerant tank 3, an outflow return chamber 471 having a predetermined diameter r1 and communicating with the tank inlet 36, and a return passage 421 interconnecting between the inflow return chamber 461 and the outflow return chamber 471.

A small-diameter opening 411 (small-diameter portion, restricting opening) having a small diameter r2 being smaller than the inner diameter of the inflow return chamber 461 is formed in a portion of a wall of the inflow return chamber 461, at an opposite side of the tank outlet 35. The liquid refrigerant return unit 341 communicates with the radiating tubes 39 through the small-diameter opening 411.

The radiating tube 39 is a hollow structure formed by joining the peripheral edge portions of the two substantially rectangular pressed plate 40 (FIG. 4A). The two pressed plates 40 are formed in the same shape by pressing plates of a metal having a high heat conductivity, such as aluminum, and each pressed plate 40 is provided at each opposite end portion thereof with a small-diameter opening 41 having a small diameter (small-diameter portion, restricting opening). As shown in FIG. 4B, the small-diameter openings 41 are substantially elliptic or rectangular punched holes. In this embodiment, the small-diameter openings 41 have a diameter r2, and a large-diameter opening having a diameter r1 (large-diameter portion) larger than the diameter r2 is formed around each small opening 41.

Each radiating tube 39 forms therein a flat radiating passage 42 at an entire center portion thereof, and both end portions form an inflow communicating chamber 44 (space connected to the refrigerant tank outlet 35) and an outflow communicating chamber 45 (space connected to the refrigerant tank inlet 36), respectively, each of which has a large-diameter. The radiator 4 formed by laminating the plurality of radiating tubes 39 includes a plurality of radiating passages 42, an inflow passage connected to one end of each radiating passage 42, and an outlet passage connected to the other end of each radiating passage 42. The inflow passage is formed by laminating the plurality of inflow communicating chambers 44. The outflow passage is formed by laminating the plurality of outflow communicating chambers 45. The inflow passage and the outflow passage are provided with the small-diameter openings 41 between the adjacent inflow communicating chambers 44 and between the adjacent outflow communicating chambers 45, respectively. Thus, each of the inflow passage and the outflow passage is formed to have therein a plurality of large-diameter portions (r1) and small-diameter portions (r2), which are disposed alternately. The small-diameter openings 41, which is formed by punching, serve as restricting openings which suppress the amount of the liquid refrigerant flowing from one of the adjacent inflow communicating chambers 44 into the other.

The radiating tubes 39 are laminated to be substantially perpendicular to the side surface of the refrigerant tank 3 and substantially horizontal to the surface of the liquid refrigerant contained in the refrigerant tank 3 in this embodiment; however, the radiating tubes 39 may be laminated while be inclined to be positioned upward as being away from the side surface of the refrigerant tank 3 for returning the liquid refrigerant collected in the radiating tubes 39 into the refrigerant tank 3 efficiently.

Radiating fins 16 are interposed between the adjacent radiating tubes 39 as shown in FIG. 5. The pressed plate 40 outside the outermost radiating tube 39 is provided with no small-diameter opening 41. When the pressed plate 40 provided with the small-diameter openings 41 is employed, the small-diameter openings 41 may be closed by end plates (not shown) or the like from the outside of the pressed plate 40.

Then, the small-diameter opening 411 of the liquid refrigerant return unit 341 communicates with the small-diameter opening 41 of the radiating tubes 39 so that the inflow passage consisting of the plurality of inflow communicating chambers 44 communicates with the inflow return chamber 461. Further, the outflow passage consisting of the plurality of outflow communicating chambers 45 communicates with the outflow return chamber 471 simultaneously. The radiator 4 is constructed as described above.

As shown in FIG. 1, the cooling fan 5, such as an axial-flow fan, is disposed on an upper surface of the radiator 4 to blow air vertically toward the radiator 4. The cooling fan 5 may be either a suction fan disposed at a downstream side of the radiator 4 or a forced draft fan disposed at an upstream side of the radiator 4. Furthermore, the cooling fan 5 may be a cross-flow fan and may be disposed in front of or behind the radiator 4.

An operation of the first embodiment will be described hereinafter.

Figure 6:
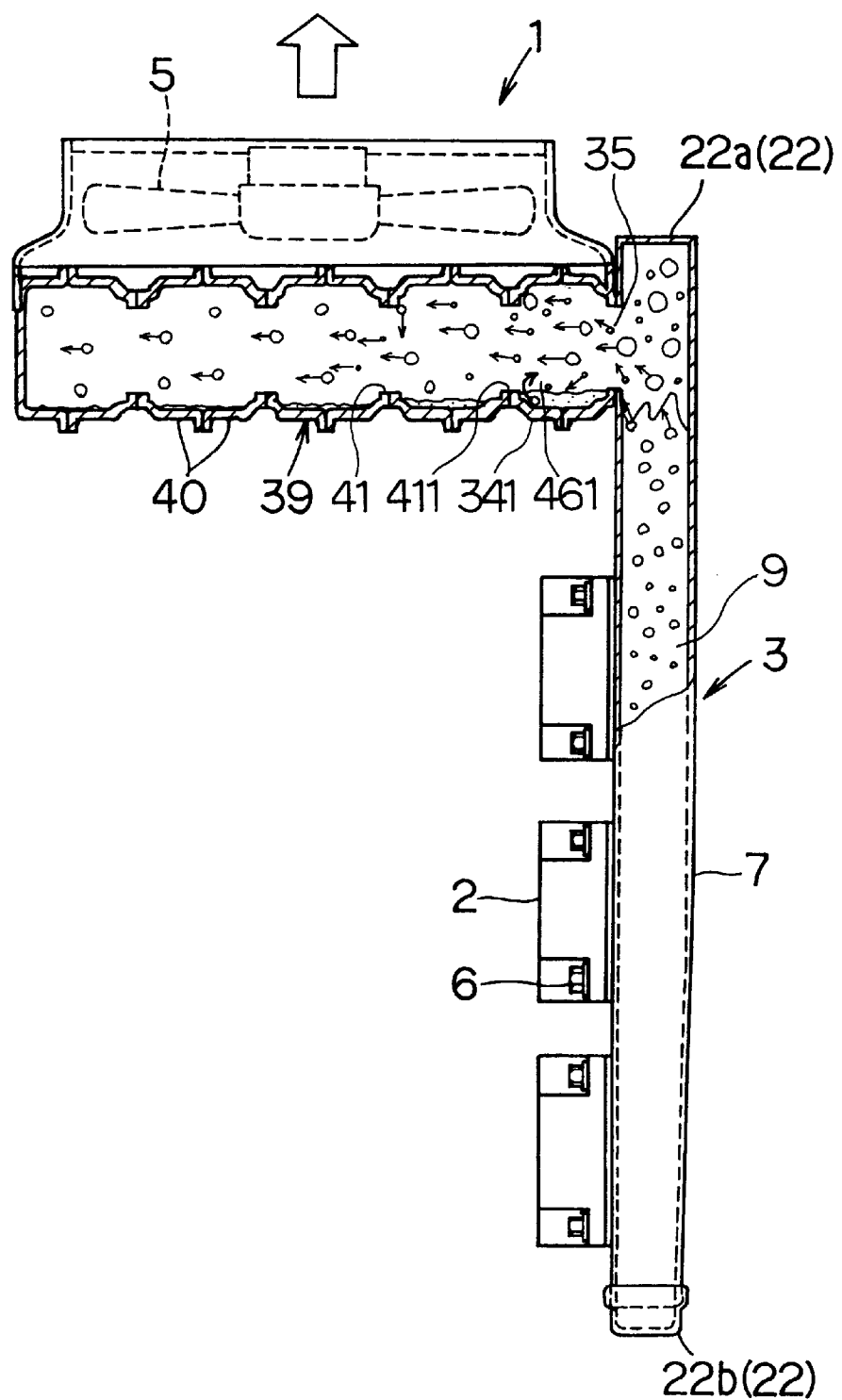
FIG. 6 is a partial cross sectional side view of a cooling apparatus according to a second embodiment of the present invention.

Referring to FIG. 6, the refrigerant is boiled by heat generated by and transferred from the IGBT modules 2. The refrigerant becomes bubbles and ascends through the vapor passages 9, and flows through the refrigerant tank outlet 35 into the outflow communicating chamber 461. Then, the refrigerant flows from the outflow communicating chamber 461 into the inflow communicating chambers 44 and is distributed to the radiating passages 42 of the radiating tubes 39 (FIG. 5). The vaporized refrigerant flowing through the radiating passages 42 condenses on the inner surfaces of the radiating passages 42 and the surfaces of inner fins 43, which are cooled at a low-temperature by receiving air blown from the cooling fan 5, and radiates heat of condensation. The refrigerant becomes droplets, and flows into the outflow side communication chamber 45 of the radiator 4 while flowing on the bottom surface of the radiating passage 42. The condensed liquid flows from the refrigerant tank inlet 36 into the condensed liquid passage 10, flows down through the condensed liquid passage 10 and returns through the bottom surface of passage formed in the end cap 22b (FIG. 3) to the vapor passages 9. The heat of condensation, radiated by the vaporized refrigerant, is transferred through the pressed plates 40 to the radiating fins 16, and is radiated from the radiating fins 16 to air flowing between each pair of adjacent radiating tubes 39.

Referring to FIG. 6, when the amount of the radiating heat becomes large, the refrigerant blows up bubbles in the refrigerant tank 3 and both of the gas-phase refrigerant and the liquid-phase refrigerant flow into the inflow return chamber 461. In FIG. 6, blank circles represent the gas-phase refrigerant and solid circles represent the liquid-phase refrigerant. The inflow return chamber 461 suppresses the liquid refrigerant of the mixed refrigerant from flowing into the radiating passages by the small-diameter opening 411. That is, the small-diameter openings 411 dams the liquid refrigerant. The dammed liquid refrigerant is returned through the return passage 421 into the refrigerant tank 3. Therefore, the amount of the liquid refrigerant to the gas-liquid mixed refrigerant flowing through the small-diameter opening 411 into the radiating passages 42 is reduced. Accordingly, it is possible to increase an effective area for condensation heat transfer in the radiating passages 42.

In other words, the inflow communicating chamber 461 of the radiator 4 includes the large-diameter portion (r1) and the small-diameter portions (r2) formed alternately, and the small-diameter portion (r2) suppresses the liquid refrigerant of the gas-liquid mixed refrigerant from flowing into the adjacent radiating passage 42. Therefore, the amount of the liquid refrigerant to the gas-liquid mixed refrigerant which flows through the small-diameter portion (r2) into the radiating passages 42 is reduced, so that it is possible to increase an effective area for condensation heat transfer in the radiating passages 42.

When the amount of radiating heat becomes large, the refrigerant blows up bubbles in the refrigerant tank 3, and the gas-liquid mixed refrigerant containing a large amount of bubbles, i.e., (a mixture of the gas-phase and the liquid-phase refrigerant), flows toward the tank outlet 35 (FIG. 3). If the inflow passage is straight, i.e., if the inflow passage has a uniform diameter, a large amount of the liquid-phase refrigerant flows together with the gas-phase refrigerant into the radiating passages 42 and the inlet portions of the radiating passages 42 are filled up with the liquid-phase refrigerant. In this state, heat is transferred not only by condensation but also by forced convection. Since the heat transfer efficiency of forced convection is far less than that of condensation, the radiating performance of the radiator 4 is deteriorated. Since this embodiment is provided with the small-diameter openings 411 in the inflow passage, the flow of the liquid refrigerant into the radiating passages 42 can be suppressed. Consequently, heat is transferred from the refrigerant to the radiator 4 in the radiating passages 42 mainly by condensation and hence the deterioration of the radiating performance of the radiator 4 can be prevented. The small-diameter openings 41 prevents the uneven distribution of the refrigerant to the radiating passages 42, so that the refrigerant is distributed evenly to the radiating passages 42 and hence the deterioration of the radiating performance of the radiator 4 can be prevented.

Furthermore, when the amount of radiating heat becomes large, bubbles contained inside the refrigerant in the refrigerant tank 3 increase, and the level of the liquid refrigerant rises. The tank serves as a blockage when the level of the liquid refrigerant rises. Therefore, the liquid refrigerant is suppressed from flowing into the radiating passages 42.

The lowermost portion of the small-diameter opening 411 is positioned higher by a predetermined height of (r1−r2)/2 than the bottom surface of the inflow return chamber 461. The portion having the predetermined height dams the falling liquid refrigerant, which has passed through the refrigerant tank outlet 35, by its own gravity. Thus, the flow of the liquid refrigerant into the radiating passages 42 can be suppressed. Since the refrigerant side tank outlet 35 is substantially elliptic or rectangular, the liquid refrigerant flowing by its own gravity can efficiently be dammed.

By employing the drawn cup type radiator 4, even when the number of IGBT modules 2 attached to the refrigerant tank 3 is increased and the total heat generated by the IGBT modules 2 is increased; the capacity of the radiator 4 can be easily changed. That is, by laminating radiating tubes 39 of the same shape one by one, the capacity of radiator 4 can be changed easily; and therefore, a radiator 4 having a capacity corresponding to a total amount of heat to be radiated can be provided at a low cost. Since the vapor passages 9 can be communicated with the tank outlet 35 simply by cutting upper portions of the partition walls 31 and 32 of the extrusion member 7, the circulation of the refrigerant can be controlled at a low cost without using any additional special parts.

The radiator 4 may be disposed so as to decline toward the refrigerant tank 3 to return the condensed liquid refrigerant from the radiator 4 into the refrigerant tank 3 (the condensed liquid passage 10).

Instead of the lower end cap 22b of the refrigerant tank 3, as shown in FIG. 3, lower end portions of the partition walls 30, 31 and 32 may be removed by an additional machining such as a milling, and a flat plate 48 (an end cap 22) may be brazed to the lower end of the extrusion member 7. In this way, it becomes easy to manufacture the lower end cap 22 (the flat plate 48).

Although the refrigerant tank inlet 36 and the refrigerant tank outlet 35 of this embodiment are formed on different levels, respectively, in this embodiment, the refrigerant tank inlet 36 and the refrigerant tank outlet 35 may be formed on the same level. The refrigerant tank inlet 36 and the refrigerant tank outlet 35 may be formed in the same shape.

The refrigerant tank 3 of the cooling apparatus 1 according to the first embodiment is structured by the extrusion member 7 formed by extruding. Accordingly, the cost of an extrusion die for extruding the extrusion member 7 can be less than that of pressing dies for pressing the parts. When the number of IGBT modules 2 is increased, if the IGBT modules 2 are disposed in multi-stages (longitudinally), an extrusion member 7 can be used by being cut into a proper length. Accordingly, it is not necessary to provide new pressing dies used when the pressed product is employed, and the cost of the dies can be greatly reduced.

Since the refrigerant tank 3 is structured by employing the extrusion member 7, a sufficient surface rigidity of the extrusion member 7, to which the IGBT modules 2 is attached, can be secured. Therefore, the contact thermal resistance between the mounting surface (the outer surface) of the support wall of the extrusion member 7 and the IGBT modules 2 can be reduced as compared with when the refrigerant tank is structured by assembling pressed thin members formed by pressing and IGBT modules 2. Thus, the radiating performance of the cooling apparatus 1 can be improved. Further, by employing the extrusion member 7, it is possible to secure the thick wall portions 7a having a sufficient thickness for forming bores with internal thread therein and is also possible to set the shape the vapor passages 9 and the condensed liquid passage 10 freely, which is advantageous in improving the pressure tightness when the refrigerant tank 3 is formed in a flat shape. That is, it is disadvantageous to form the refrigerant tank 3 in a flat shape to reduce the amount of the refrigerant in respect of the pressure tightness; however, by setting the shapes of the vapor passages 9 and the condensed liquid passage 10 properly, a sufficient tightness can be secured.

Further, when the thick wall portions 7a are provided with enough area for forming internally threaded holes, the same extrusion member 7 can be employed for various types of IGBT modules having different pitches of mounting screws therefor. In other words the various types of IGBT modules having different pitches of the mounting screws from each other can be mounted on the refrigerant tank 3 employing the same extrusion member 7. Accordingly, the refrigerant tank 3 can be standardized, and the cost when employing the standardized refrigerant tanks 3 for the various types of IGBT modules having different pitches of the screws can be reduced.

Since the interior of the refrigerant tank 3 is divided into the vapor passages 9 and the condensed liquid passage 10, the flow of the boiling refrigerant and that of the condensed refrigerant in the refrigerant tank 3 can be certainly separated from each other so that the flooding in which the boiling refrigerant and the condensed refrigerant collide can be prevented, and hence it is possible to obtain the high radiating performance. Since the vapor passages 9 and the condensed liquid passage 10 are separated from each other, the refrigerant flowing through the condensed liquid passage 10 is not heated directly by the heat generated by the IGBT modules 2, and hence the temperature of the refrigerant is set to be lower than that of the refrigerant in the vapor passages 9. The low-temperature refrigerant flows gradually from the condensed liquid passage 10 through communicating passage 17 into the vapor passages 9 to cool the IGBT modules 2 efficiently.

Second Embodiment

Figure 7:
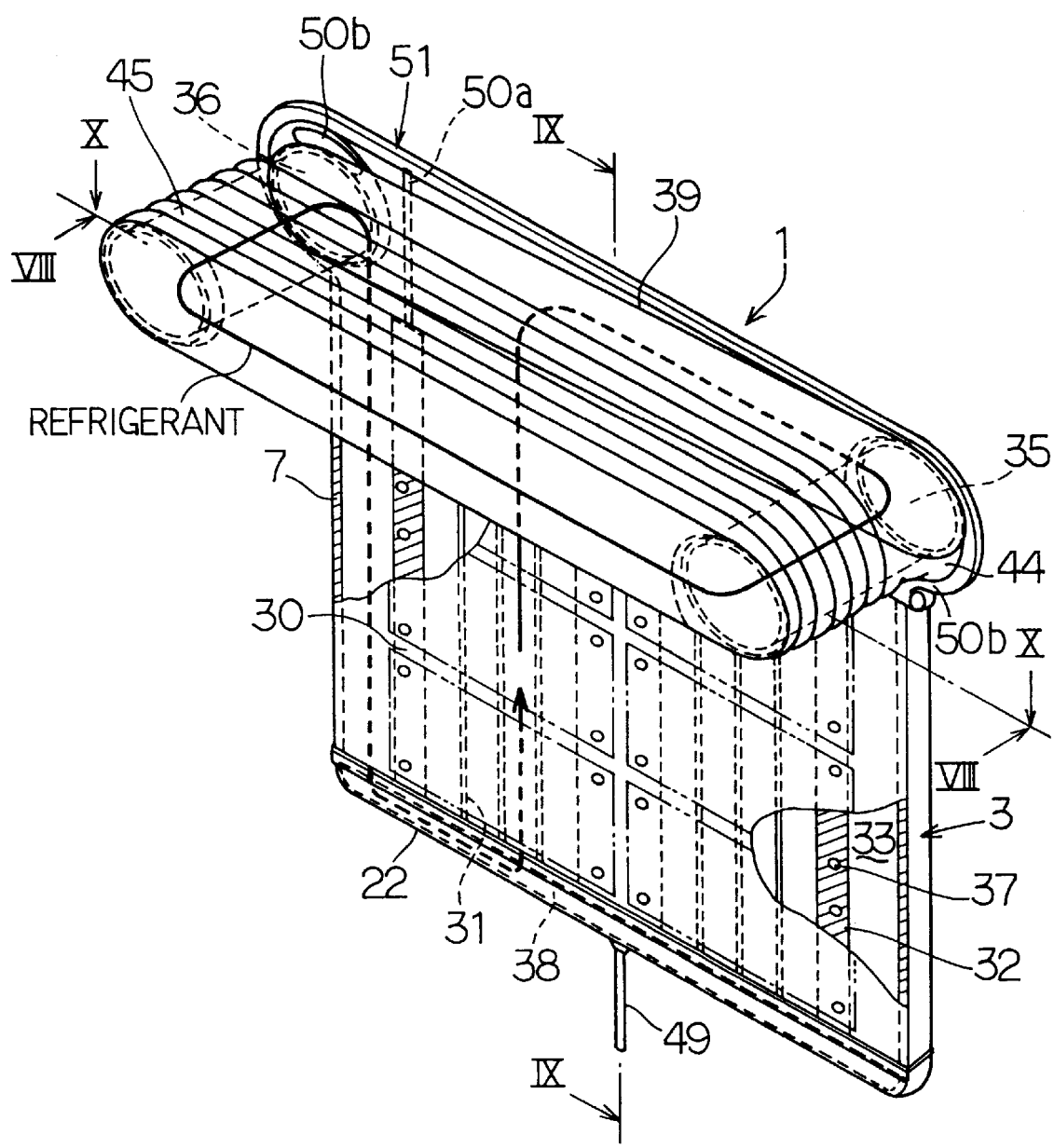
FIG. 7 is a perspective view of the cooling apparatus of FIG. 6.
Figure 8:
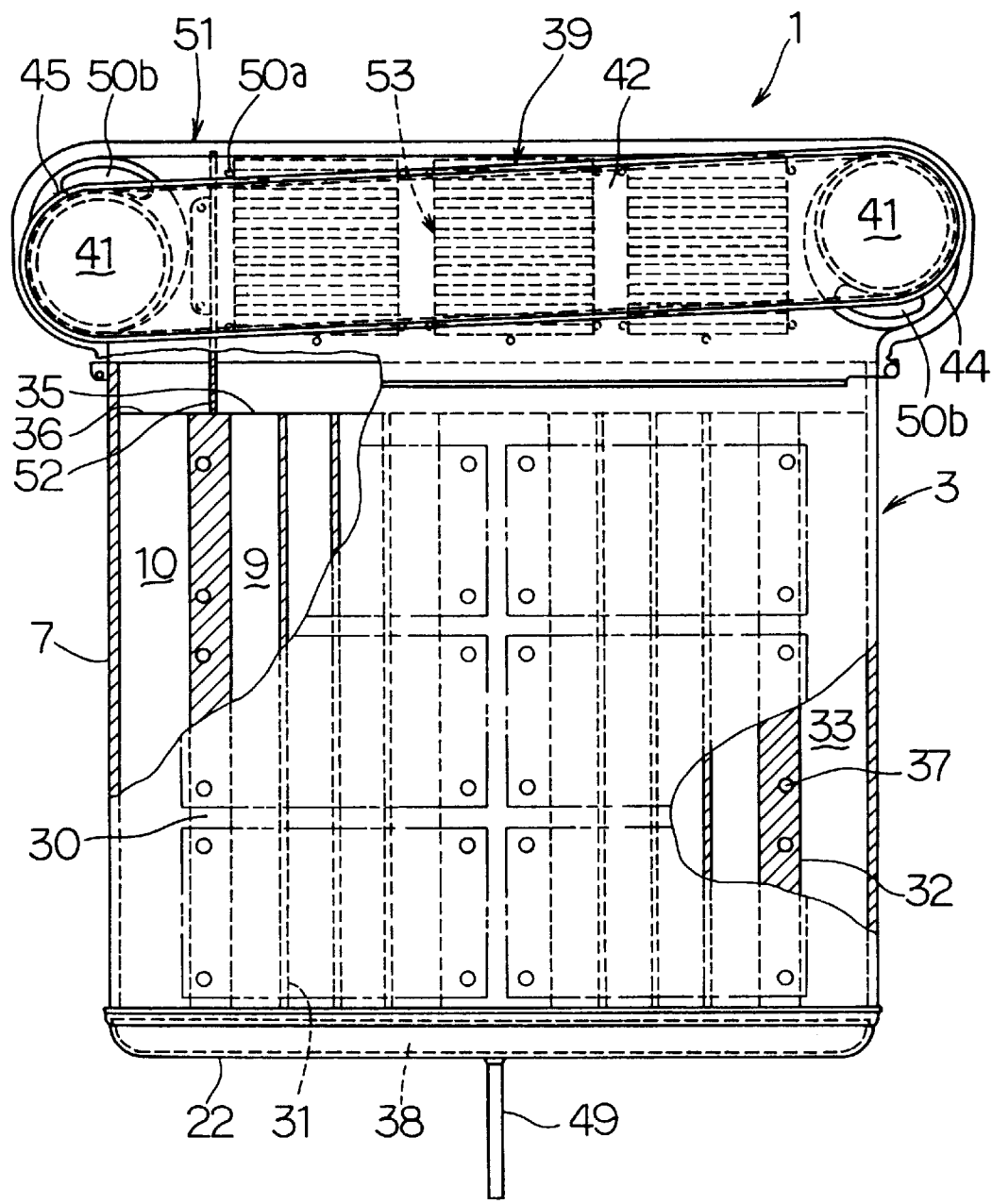
FIG. 8 is a cross sectional view taken along the line VIII—VIII in FIG. 7.
Figure 10:
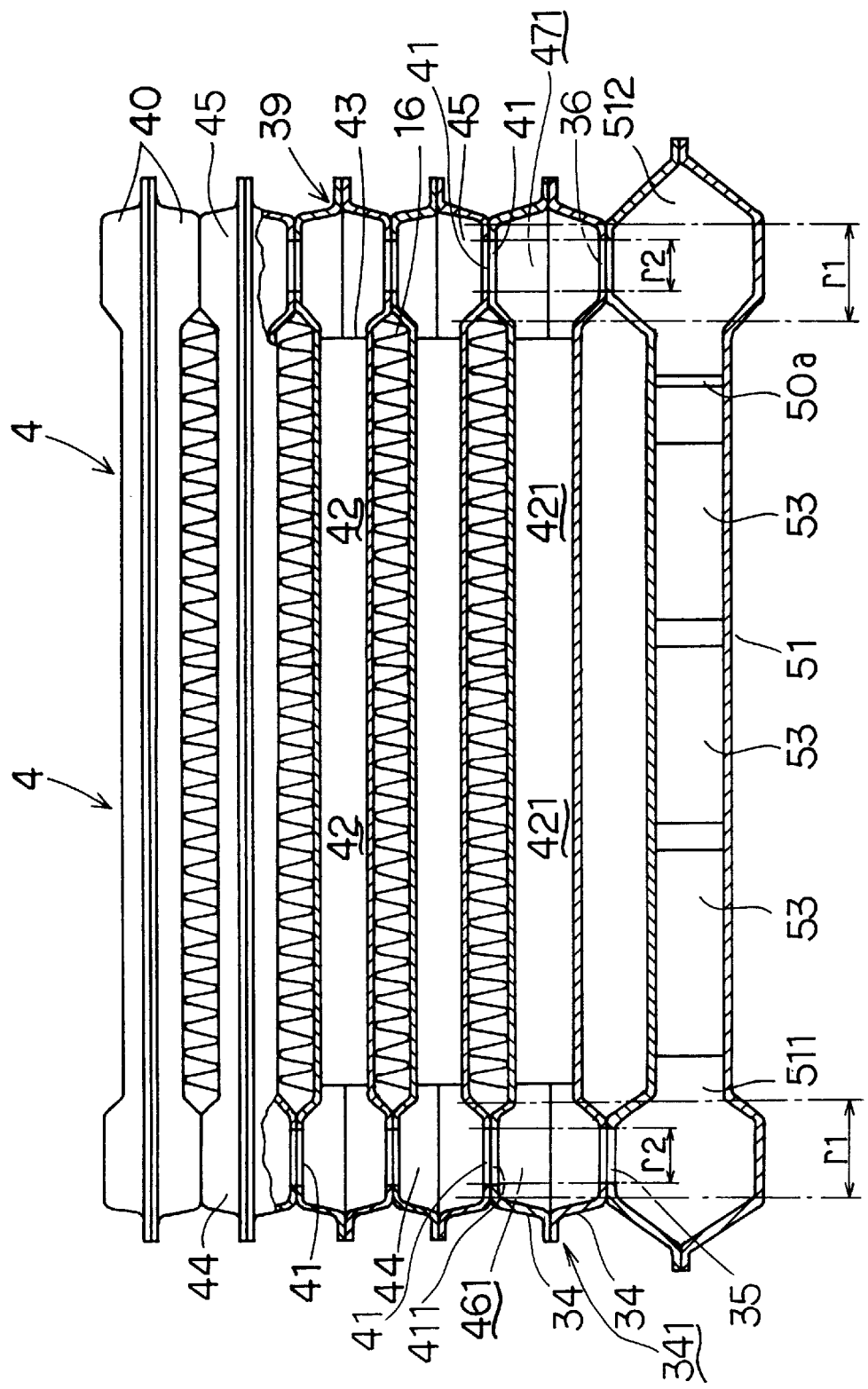
FIG. 10 is a cross sectional view taken along the line X—X of FIG. 7.

FIG. 7 is a perspective view of the cooling apparatus of FIG. 6. FIG. 8 is a sectional view taken on line VIII—VIII in FIG. 7. FIG. 9 is a sectional view taken on line IX—IX in FIG. 7. FIG. 10 is a sectional view taken on line X—X in FIG. 7.

Referring to FIGS. 7 to 10, in the second embodiment, radiating tubes 39 are inclined to return the liquid refrigerant condensed in the radiator 4 to a refrigerant tank 3 smoothly.

The refrigerant tank 3 includes an extrusion member 7 formed by extruding, for example, an aluminum block, and an end cap 22 attached to the open lower end of the extrusion member 7 (FIG. 7).

An interior of the extrusion member 7 is partitioned by partition walls 30, 31 and 32 extending vertically into vapor passages 9, a condensed liquid passage 10, and an inoperative passage 33, which pass through the extrusion member 7 longitudinally. Each open end of the vapor passages 9 and an open end of the condensed liquid passage 10 serve as a refrigerant tank outlet 35 and a refrigerant tank inlet 36, respectively.

The end cap 22 is made of aluminum same as the extrusion member 7, and is brazed integrally to the lower end of the extrusion member 7 so as to form a lower communicating passage 38 communicating the vapor passages 9, the condensed liquid passage 10 and the inoperative passage 33 of the extrusion member 7 with each other.

As shown in FIG. 7, to the end cap 22 attached a tube 49 for sealing refrigerant, through which the cooling apparatus 1 is washed, the refrigerant is supplied, and a degassing is performed. When degassing the cooling apparatus 1, the cooling apparatus 1 is turned over after filling the refrigerant therein, the radiator 4 is immersed in a hot water bath maintained to a temperature at which the saturated vapor pressure of the refrigerant is higher than the atmospheric pressure. Thus, the refrigerant within the cooling apparatus 1 is evaporated to release air, because the vaporized refrigerant has a specific gravity greater than air. After degassing, the tube 49 is caulked and sealed by welding or the like to seal the refrigerant in the cooling apparatus 1.

The radiator 4 is a so-called drawn cup type heat exchanger. The radiator 4, similarly to the radiator 4 in the first embodiment, is structured by laminating a connecting pipe 51 (connecting member) formed by joining two plates 50, and a plurality of radiating tubes 39 of the same hollow shape.

The connecting pipe 51 vertically covers an upper end of the refrigerant tank 3, and an interior of the connecting pipe 51 is divided by partition walls 52 into an inflow chamber 511 communicating with the refrigerant tank outlet 35 of the refrigerant tank 3, and an outflow chamber 512 communicating with the refrigerant tank inlet 36 as shown in FIG. 10. As shown in FIGS. 8 and 10, a plurality of inner fins 53 are disposed in the outflow chamber 512 of the connecting pipe 51, and are held by a plurality of positioning ribs 50a formed in the plates 50.

Figure 11:
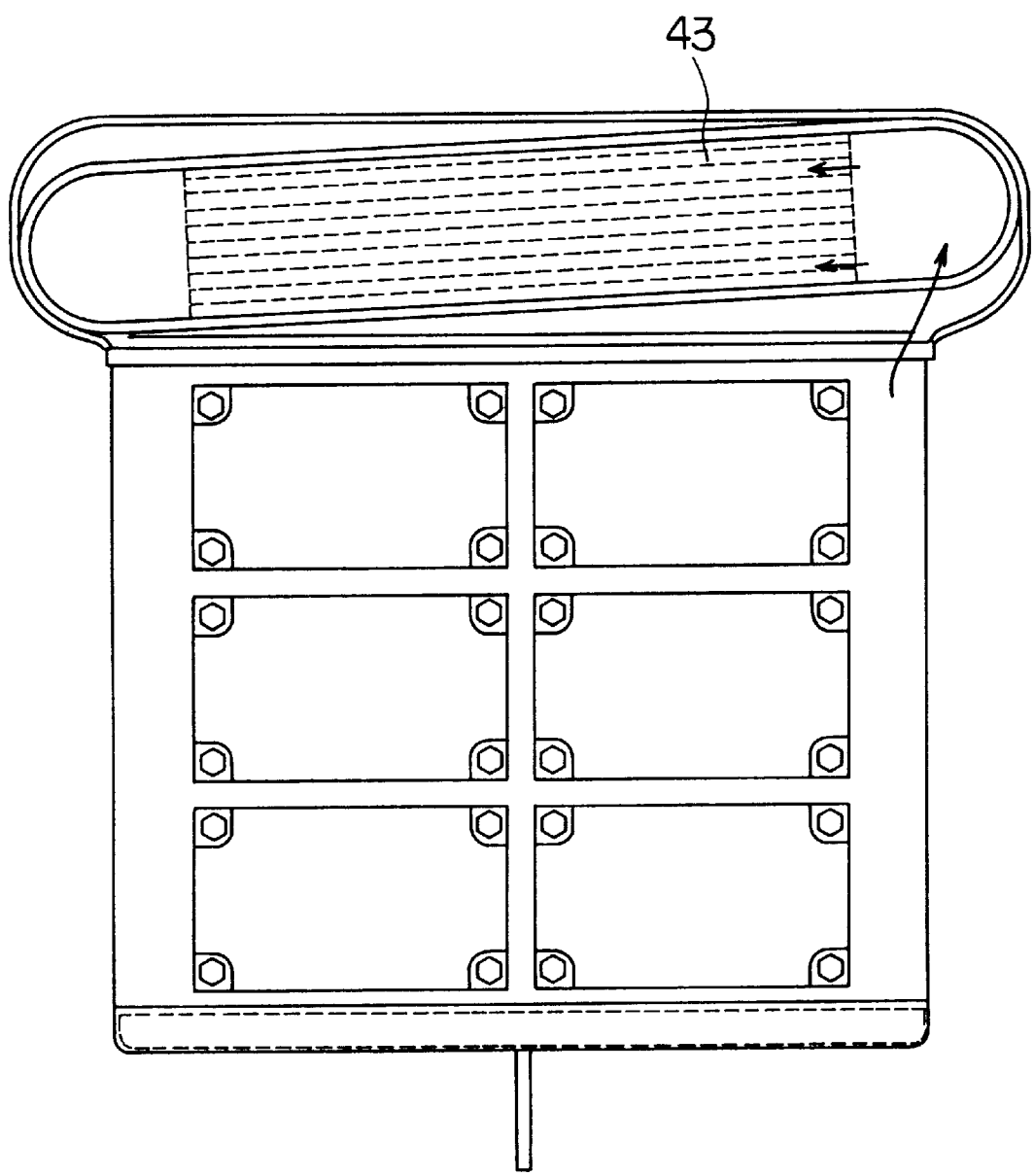
FIG. 11 is an explanatory view of internal structures of a return passage and a radiating passage in the cooling apparatus shown FIG. 7.

As shown in FIG. 10, two connecting plates 34, i.e., plate members, are joined together to form a liquid refrigerant return unit 341. The liquid refrigerant return unit 341 is hermetically joined to the side walls of the connecting pipe 51 to form an inflow return chamber 461 communicating with the vapor passages 9 and the inoperative passage 33 through the refrigerant tank outlet 35, an outflow return chamber 471 communicating with the condensed liquid passage 10 through the refrigerant tank inlet 36, and a return passage 421 interconnecting between the inflow return chamber 461 and the outflow return chamber 471. Inner fins 43 are disposed in the return passage 421 (FIG. 11). The connecting plates 34, similarly to the pressed plates 40, are provided with small-diameter openings 411. The return chambers 461 and 471 communicates with the radiating tubes 39 through the small-diameter openings 411.

The liquid refrigerant return unit 341 is composed of an inflow return chamber 461 (a large-diameter opening) having a predetermined inner diameter r1, which is communicated with the refrigerant tank outlet 35 of the refrigerant tank 3, an outflow return chamber 471 (a large-diameter portion) connected to the tank inlet 36, and a return passage 421 interconnecting between the inflow return chamber 461 and the outflow return chamber 471. A small-diameter opening 411 (a small-diameter portion, restricting opening) having a diameter smaller than that of the inflow return chamber 461 is formed in a portion of the inflow return chamber 461 at an opposite side of the tank outlet 35.

As shown in FIG. 4, the radiating tube 39 is a hollow structure formed by joining peripheral edge portions of two pressed plates 40 made of, for example, aluminum. The radiating tube 39 has an inflow passage and an outflow passage having small-diameter openings 41 at its opposite ends, respectively.

Each radiating tube 39 forms therein a flat radiating passage 42 at an entire center portion thereof, and both end portions form an inflow communicating chamber 44 (space connected to the refrigerant tank outlet 35) and an outflow communicating chamber 45 (space connected to the refrigerant tank inlet 36), respectively, each of which has a large-diameter. The inflow passage is formed by laminating the plurality of inflow communicating chambers 44. The outflow passage is formed by laminating the plurality of outflow communicating chambers 45. The inflow passage and the outflow passage are provided with the small-diameter openings 41 between the adjacent inflow communicating chambers 44 and between the adjacent outflow communicating chambers 45, respectively. Thus, each of the inflow passage and the outflow passage is formed to have therein a plurality of large-diameter portions (r1) and small-diameter portions (r2), which are disposed alternately. The small-diameter openings 41, which is formed by punching, serve as restricting openings which suppress the amount of the liquid refrigerant flowing from one of the adjacent inflow communicating chambers 44 into the other.

Figure 12A:
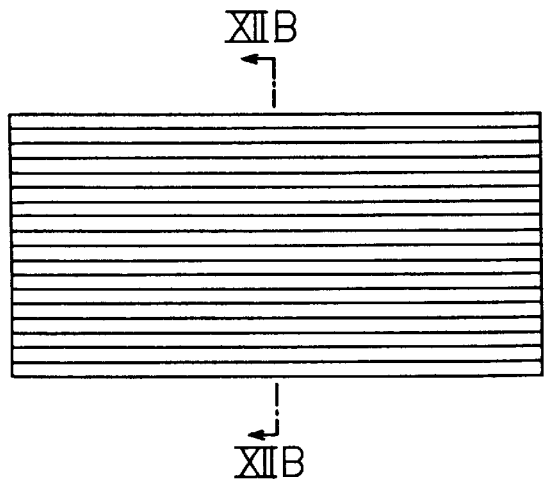
FIG. 12A is a front view of an inner fin and FIG. 12B is a cross sectional view taken along the line XIIB—XIIB of FIG. 12A.
Figure 12B:
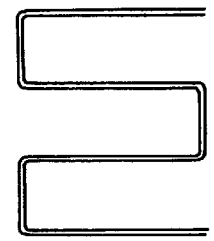

As shown in FIG. 11, wavy inner fins 43 made of thin aluminum plates are disposed in the flat radiating passages 42 of the radiating tubes 39. FIG. 12A is a plan view of the inner fin 43, and FIG. 12B is a cross sectional view taken along the line XIIB—XIIB of FIG. 12A.

As shown in FIG. 10, the radiating tubes 39 are laminated on one side of the connecting pipe 51 and communicate with each other through the small-diameter openings 41. The radiating tubes 39 communicates with the connecting pipe 51 through the small-diameter openings 41 of the plate 50 (on the side of the radiating tube 39) and the small-diameter openings of the radiating tubes 39. The radiating tubes 39 is attached to the connecting pipe 51 while being inclined entirely so that the level of the inflow communicating chamber 44 is higher than that of the outflow communicating chamber 45 as shown in FIG. 7. Ribs 50b formed in the plates 50 reinforce portions of the plate 50 joined to the radiating tube 39.

The small-diameter openings 41 of the radiating tube 39 communicate with the small-diameter openings 411 of the liquid refrigerant return unit 341. The inflow return chamber 461 and the inflow communicating chamber 44 are communicated with each other, and the outflow return chamber 471 and the outflow communicating chamber 45 are simultaneously communicated with each other. The radiator 4 is constructed as the above.

An operation of the second embodiment will be described hereinafter.

The refrigerant heated by heat generated by and transferred from IGBT modules 2 boils and ascends as bubbles through the vapor passages 9. After flowing through the tank outlet 35 into the inflow chamber 511 of the connecting pipe 51, the refrigerant flows from the inflow chamber 511 into the outflow passages, i.e., the inflow return chamber 461 and the inflow communicating chambers 44, and is distributed to the radiating passages 42 of the radiating tubes 39. The vaporized refrigerant flowing through the radiating passages 42 condenses on the inner surfaces of the radiating passages 42 and the surfaces of the inner fins, which are cooled by air blown by a cooling fan 5 (FIG. 8), to radiate heat of condensation. The refrigerant becomes droplets and flows along the bottom surfaces of the radiating passages 42 into the outflow passages, i.e., the outflow communicating chambers 45 and the outflow return chamber 471. Then, the condensed liquid flows from the outflow passages through the inflow chamber of the connecting pipe 51 and the tank inlet 36 of the refrigerant tank 3 into the condensed liquid passage 10. After flowing down through the condensed liquid passage 10, the refrigerant returns through a lower connecting passage 38 formed in an end cap to the vapor passages 9.

When the amount of radiating heat becomes large, the refrigerant blows up bubbles in the refrigerant tank 3 and both the gas-phase and the liquid-phase refrigerant flow into the inflow return chamber 461. The small-diameter opening 411 of the inflow return chamber 461 suppresses the liquid refrigerant of the mixed refrigerant from flowing into the radiating passages. That is, the liquid refrigerant of the mixed refrigerant is dammed by the small-diameter opening 411. The dammed liquid refrigerant is returned through the return passage 421 into the refrigerant tank 3. Therefore, an amount of the liquid refrigerant in the gas-liquid mixed refrigerant that flowing through the small-diameter opening 411 into the radiating passages 42 is reduced. Accordingly, it is possible to increase an effective area for condensation heat transfer in the radiating passages 42.

In other words, the inflow communicating chamber 461 of the radiator 4 includes the large-diameter portion (r1) and the small-diameter portions (r2) formed alternately, and the small-diameter portion (r2) suppresses the liquid refrigerant of the gas-liquid mixed refrigerant from flowing into the adjacent radiating passage 42. Therefore, the amount of the liquid refrigerant in the gas-liquid mixed refrigerant which flows through the small-diameter portion (r2) into the radiating passages 42 is reduced, so that it is possible to increase an effective area for condensation heat transfer in the radiating passages 42.

In the second embodiment, similarly to the first embodiment, the small-diameter openings 41 are provided in the inflow passage, the small-diameter openings 41 prevents the uneven distribution of the refrigerant to the radiating passages 42, so that the refrigerant is distributed evenly to the radiating passages 42 and hence the deterioration of the radiating performance of the radiator 4 can be prevented.

Since the radiating tubes 39 are attached to the connecting pipe 51 while being inclined, the condensed liquid refrigerant can flow smoothly from the radiating passages 42 toward the refrigerant tank 3. Consequently, the amount of the condensed liquid refrigerant which stays on the bottom surfaces of the radiating passages 42 is reduced and the vaporized refrigerant can be condensed efficiently. Therefore, the necessary amount of the refrigerant can be reduced, and the cost can be reduced.

Since the vapor passages 9 are separated by the plurality of partition walls 31, the flows of the gaseous refrigerant in the vapor passages 9 are smoothed, and the partition walls 31 increase the effective boiling area so that the radiating performance can be improved. Furthermore, the partition walls 31 enhance the strength of the refrigerant tank 3 against positive and negative pressures therewithin, and prevent the deformation of the wall surface to which IGBT modules 2 are attached.

Figure 13:
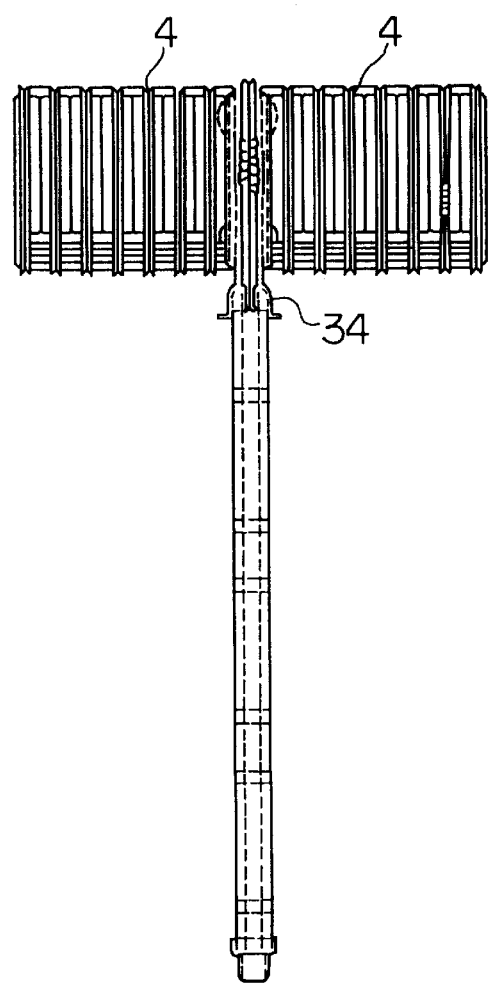
FIG. 13 is a side view of a modification of the cooling apparatus.

As a modification of the first and the second embodiment, as shown in FIG. 13, radiators 4 may be attached to both sides of the connecting plate 34 to further improve the radiating performance.

Third Embodiment

Figure 14:
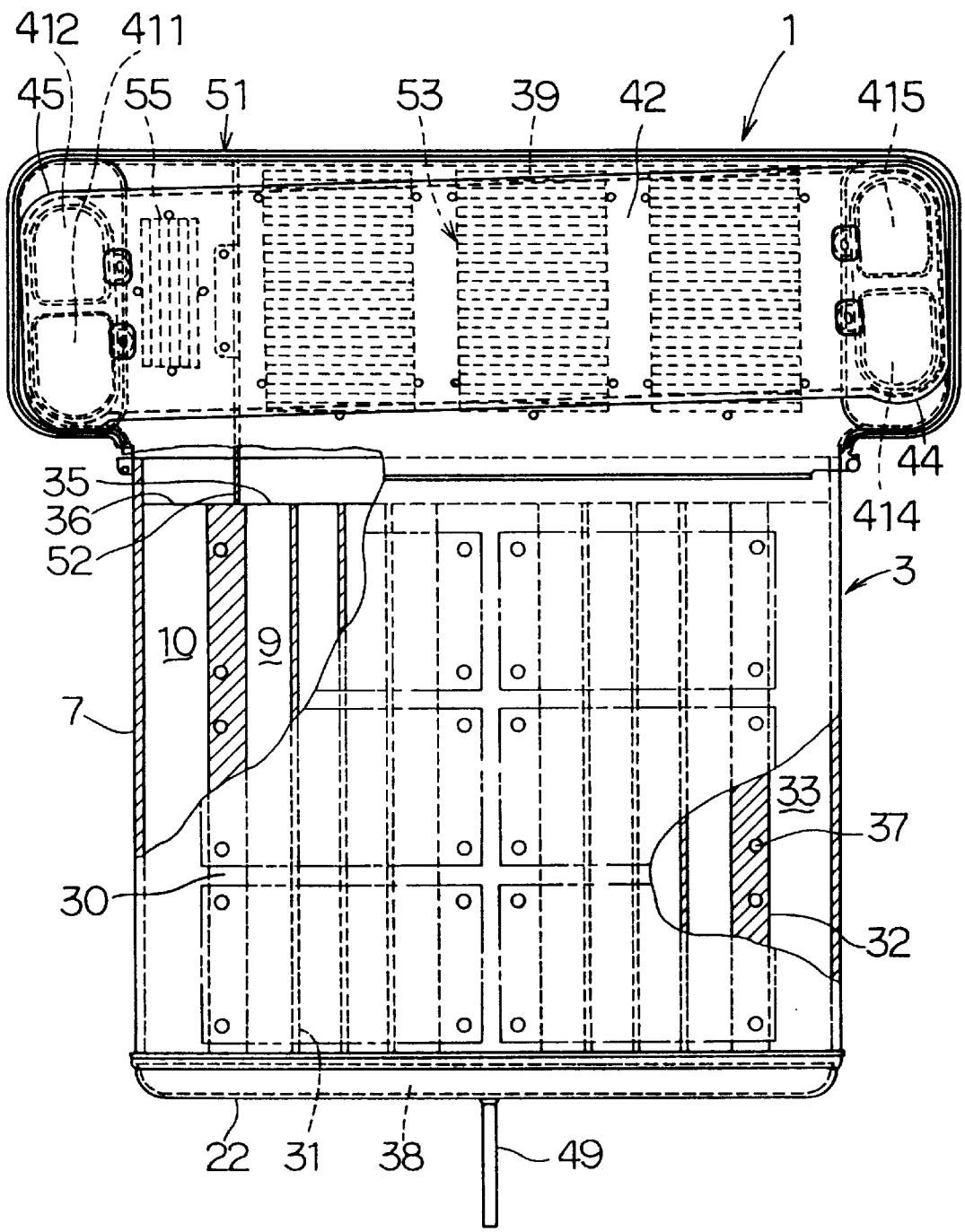
FIG. 14 is a front view of a cooling apparatus according to a third embodiment of the present invention.

FIG. 14 is a front view of a cooling apparatus according to the third embodiment. FIG. 15 is a side view of the cooling apparatus of FIG. 14.

In the third embodiment, a cooling apparatus 1 is a modification of the cooling apparatus 1 shown in FIG. 7. The cooling apparatus 1 in the third embodiment will be described mainly with reference to the portions different from those of the cooling apparatus 1 shown in FIG. 7. Parts and components having operations similar or equivalent to those of the cooling apparatus shown in FIG. 7 are indicated by the same reference numerals, and the description thereof will be omitted.

Referring to FIGS. 14 and 15, a radiator 4, similarly to the radiator shown in FIG. 7, is a so-called drawn cup type heat exchanger formed by laminating a connecting pipe 51 formed by joining two plates 50, and a plurality of radiating tubes 39 of the same hollow shape.

The connecting pipe 51 is formed by joining the two plates 50 shown in FIG. 16A. As shown in FIG. 16B, the connecting pipe 51 is provided in opposite end portions thereof respectively with two outflow opening 541 and 542 through which the refrigerant boiled and vaporized in a refrigerant tank 3 flows into the radiator 4, and two return openings 544 and 545 through which the liquid refrigerant condensed in the radiator 4 is returned to the refrigerant tank 3. As shown in FIG. 14, the connecting pipe 51 vertically covers an upper end of the refrigerant tank 3. An interior of the connecting pipe 51 is partitioned by partition walls 52 into an inflow chamber 511 (not shown) connected to a refrigerant tank outlet 35 formed in the refrigerant tank 3, and an outflow chamber 512 (not shown) connected to a refrigerant tank inlet 36 formed in the refrigerant tank 3.

In FIG. 16B, dotted lines around the outflow opening 542 and the return opening 544 indicate protrusions around the openings shown in FIG. 16A. Holding portions 543 and 546 are formed between the openings 541 and 542 and between the openings 544 and 545, respectively. A plurality of fins 53 are inserted in the inflow chamber of the connecting pipe 51.

As shown in FIG. 17A, the radiating tube 39 is a hollow structure formed by joining the peripheral edge portions of two pressed plates 40 of, for example, aluminum. As shown in FIG. 17B, small-diameter openings 411 and 412 are formed in one end portion of the radiating tube 39, and small-diameter openings 414 and 415 are formed in the other end portion thereof. Holding portions 413 and 416 are formed between the small-diameter openings 411 and 412 and between the small-diameter openings 414 and 415.

As shown in FIG. 15, the radiating tubes 39 are laminated on both sides of the connecting pipe 51, and fins 16 are disposed between the adjacent laminated radiating tubes 39. Protrusions are formed around the small-diameter openings 411 and 415 as shown in FIG. 17A, and the small-diameter openings 412 and 414 are formed in holes each having a width for receiving the protrusions formed around the small-diameter openings 411 and 415, respectively. When laminating the plates 40, the small-diameter opening 412 and the small-diameter opening 415 of the other plate are fitted, and the small-diameter opening 411 and the small-diameter opening 414 of the other plate are fitted, respectively. After the plates 40 are fitted, the plates 40 are joined together by brazing or the like. The plurality of plates 40 communicate with each other through the respective small-diameter openings 411, 412, 414 and 415 to construct the radiating tubes 39.

The connecting pipe 51 communicates with the radiating tubes 39 by communicating the outflow openings 541 and 542 and the return openings 544 and 545 thereof with the small-diameter openings 411, 412, 414 and 415 of the pressed plates 40. The outermost pressed plate 40 of the radiating tube 39 is provided with no small-diameter opening. The outermost pressed plate 40 may be provided with the small-diameter openings, and the small-diameter openings may be closed by end plates (not shown) from the outside of the pressed plate 40.

The radiating tube 39 forms therein a radiating passage 42 at an entire center portion thereof, and a plurality of radiating passages 42 are formed. Wavy inner fins formed of thin aluminum plates as shown in FIG. 12 are disposed in the radiating passage 42.

In other words, an inflow passage is formed by laminating a plurality of inflow communicating chambers 44 each formed by joining the two pressed plates 40, and an outflow passage is formed by laminating a plurality of outflow communicating chambers 45 each formed by joining the two pressed plates 40. The small-diameter openings 411, 412, 414 and 415 which are formed by punching serve as restricting openings which suppress the liquid refrigerant from one of the adjacent inflow communicating chambers 44 flowing into the other.

The small-diameter openings 411, 412, 414 and 415 (small-diameter portions, restricting openings) has a diameter r2 in a transverse direction, and large-diameter openings (large-diameter portions) having a diameter r1 in a transverse direction, which is greater than the diameter r2, is formed around the small-diameter openings 411, 412, 414 and 415. Each of the small-diameter openings 411, 412, 414 and 415 has a diameter r4 in a vertical direction, and large-diameter openings (large-diameter portions) each having a diameter r3 in a vertical direction, which is greater than twice of the diameter r4 (r3, 2~r4), are formed around the small-diameter openings 411, 412, 414 and 415.

The radiating tubes 39, similarly to that shown in FIG. 7, are attached to the connecting pipe 51 while being inclined entirely so that the level of the inflow communicating chamber 44 is higher than that of the outflow communicating chamber 45. As shown in FIGS. 18A and 18B, in the pressed plate 40 constructing each radiating tube 39, a level of the lowest portion 411a of the small-diameter opening 411 is lower by a distance d1 than that of the lowest portion of a portion of the pressed plate 40, forming the radiating passage 42, and a level of the bottom portion 414a of the small-diameter opening 414 is lower by a distance d2 than that of the lowest portion of a portion of the pressed plate 40, forming the radiating passage 42. The distances d1 and d2 may be equal to or different from each other.

An operation of the third embodiment will be described hereinafter.

The refrigerant heated by heat generated by and transferred from IGBT modules 2 boils, flows up as bubbles through the vapor passages 9, and flows through the tank outlet 35 into the inflow chamber 511 of the connecting pipe 51. Then, the refrigerant flows from the inflow chamber 511 through the small-diameter openings 541 and 542 into the inflow passages, i.e., the inflow return chamber 461 and the inflow communicating chambers 44, and is distributed to the radiating passages 42 of the radiating tubes 39. The vaporized refrigerant flowing through the radiating passages 42 condenses on the inner surfaces of the radiating passages 42 and the surfaces of the inner fins, which are cooled by air blown from a cooling fan 5 (FIG. 9) at a low temperature, to radiate heat of condensation. The refrigerant becomes droplets and flows along the bottom surfaces 40a of the radiating passages 42 into the outflow passages, i.e., the outflow communicating chambers 45 and the outflow return chamber 471. Then, the liquid refrigerant flows from the outflow passages through the small-diameter openings 544 and 545 of the connecting pipe 51 into the outflow chamber 512. (In this case, most part of the refrigerant flows around the lowest portion of the lower small-diameter opening 544.) Then, the refrigerant flows through the tank inlet 36 of the refrigerant tank 3 into the condensed liquid passage 10. After flowing down through the condensed liquid passage 10, the refrigerant returns through a lower connecting passage 38 formed in an end cap to the vapor passages 9.

When the amount of radiating heat becomes large, the refrigerant blows up bubbles in the refrigerant tank 3 and both the gas-phase and the liquid-phase refrigerant flow into the inflow return chamber 461. The small-diameter opening 414 of the inflow return chamber 461 suppresses the liquid refrigerant from flowing into the radiating passages. The dammed liquid refrigerant is returned through a return passage 421 into the refrigerant tank 3. Therefore, the amount of the liquid refrigerant in the gas-liquid mixed refrigerant which flows through the small-diameter opening 414 into the radiating passages 42 is reduced. Accordingly, it is possible to increase an effective area for condensation heat transfer in the radiating passages 42.

In the third embodiment, similarly to the first and the second embodiment, since the small-diameter openings 411, 412, 414 and 415 are provided in the inflow passages, it is possible to suppress the liquid refrigerant from flowing into the radiating passages 42. Therefore, heat is transferred in the radiating passages 42 from the refrigerant to the radiator 4 mainly by condensation, and the deterioration of radiating performance can be prevented. The small-diameter openings prevents the uneven distribution of the refrigerant to the radiating passages 42, and the refrigerant can be evenly distributed to the radiating passages 42. In this way, the deterioration of radiating performance can be prevented as well.

Since the radiating tubes 39 are attached to the connecting pipe 51 while being inclined, the condensed liquid refrigerant can flow smoothly in the radiating passages 42 of the radiating tubes 39 from the inflow communicating chambers 44 toward the outflow communicating chambers 45. Consequently, the amount of the condensed liquid refrigerant which stays on the bottom surfaces of the radiating passages 42 is reduced, and the vaporized refrigerant can be condensed efficiently. Therefore, the necessary quantity of the refrigerant can be reduced, and the cost can be reduced.

When the small-diameter openings 411, 412, 414 and 415 are formed in the outflow passage, the refrigerant which flows from the radiating passages 42 into the outflow passage may be dammed by the small-diameter openings and stay there, and the amount of the refrigerant which circulates through the cooling apparatus 1 to radiate heat may be reduced. However, since the level of the lowest portion 411a of the small-diameter opening of the outflow passage is lower than that of the lowest portion 40a of the radiating passage 42, the amount of the refrigerant which stays in the lower portions of the small-diameter openings 411 and 414 can be reduced. Therefore, the necessary amount of the refrigerant can be reduced, and the cost can be reduced.

Joined portions are formed around the small-diameter openings 411, 412, 414 and 415, and the joined portions of the plurality of pressed plates 40 are joined to construct the radiator. Since the holding portions 413 and 416 are formed between the small-diameter openings 411 and 412 and between the small-diameter openings 414 and 415, a large uniform load can be applied to the joined portions when joining the pressed plates 40. Therefore, the joined portions of the pressed plates 40 can be airtightly joined with each other when brazed to each other; as a result, the heat radiating performance can be improved.

Fourth Embodiment

Figure 19:
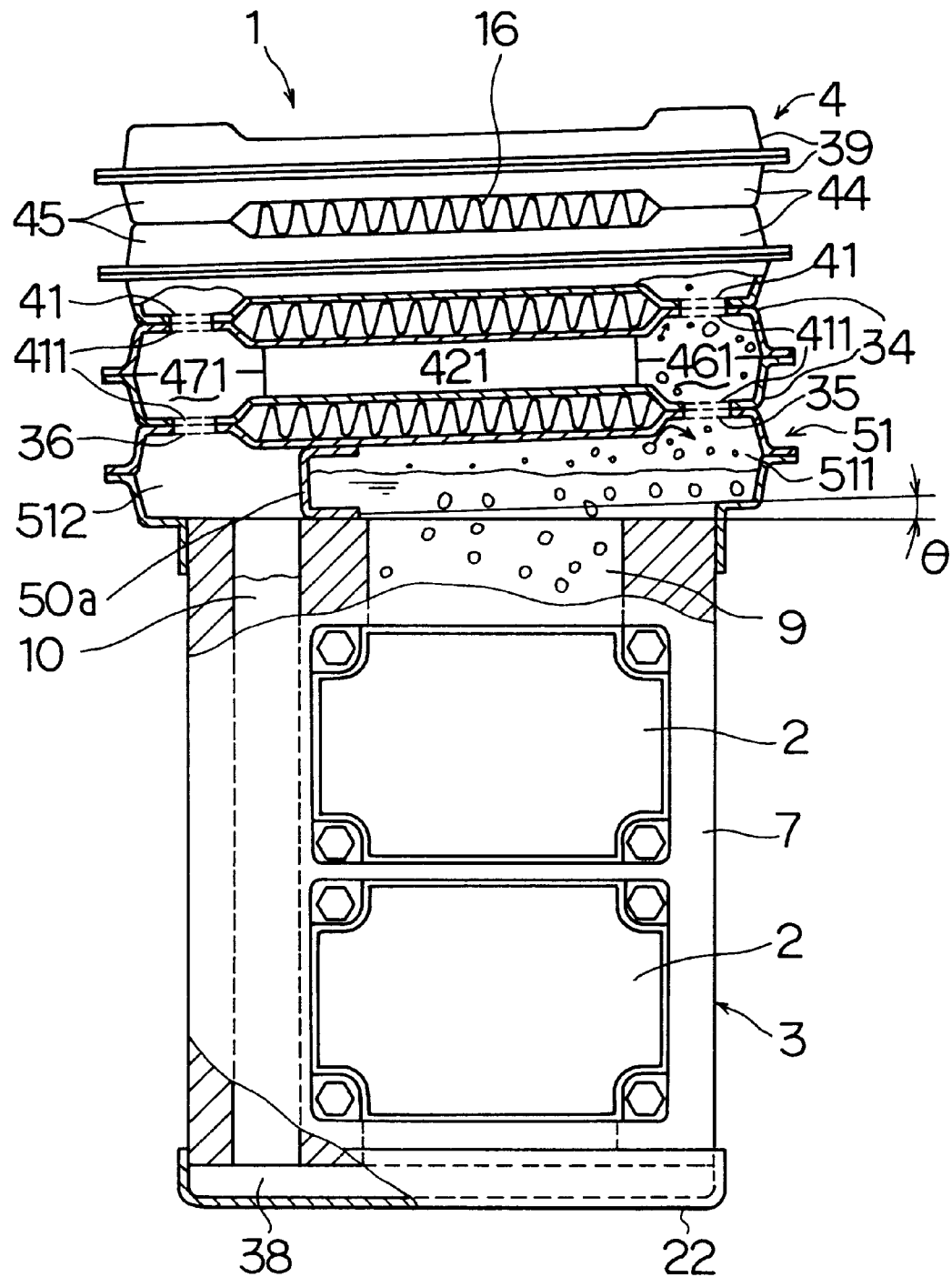
FIG. 19 is a front view of a cooling apparatus according to a fourth embodiment of the present invention.

FIG. 19 is a front view of a cooling apparatus according to the fourth embodiment of the present invention.

In the fourth embodiment, a cooling apparatus 1 is a modification of the cooling apparatus 1 shown in FIG. 7. The cooling apparatus 1 will be described mainly with reference to portions different from those of the cooling apparatus 1 shown in FIG. 7. Parts and components having operations similar or equivalent to those of the cooling apparatus shown in FIG. 7 are indicated by the same reference numerals, and the description thereof will be omitted.

A connecting pipe 51 vertically covers an upper end of a refrigerant tank 3. An interior of the connecting pipe 51 is partitioned by partition walls 50a into an inflow chamber 511 connected to a tank outlet 35 formed in the refrigerant tank 3, and an outflow chamber 512 connected to a tank inlet 36 formed in the refrigerant tank 3.

Two connecting plates 34 are joined to form a liquid refrigerant return unit 341. The liquid refrigerant return unit 341 is hermetically joined to the upper wall of the connecting pipe 51 to form an inflow return chamber 461 communicating with a vapor passage 9 through the tank outlet 35, an outflow return chamber 471 communicating with a condensed liquid passage 10 through the tank inlet 36, and a radiating passage 421 interconnecting between the inflow return chamber 461 and the outflow return chamber 471. The connecting plates 34, similarly to the pressed plates 40, are provided with small-diameter openings 411. The return chambers 461 and 471 communicate with radiating tubes 39 through the small-diameter openings 411.

When the amount of radiating heat becomes large, the refrigerant blows up bubbles in the refrigerant tank 3 and both the gas-phase and the liquid-phase refrigerant flow into the inflow return chamber 461. The small-diameter opening 411 of the inflow return chamber 461 suppresses the liquid refrigerant of the mixed refrigerant from flowing into the radiating passages. That is, the refrigerant of the mixed refrigerant is dammed by the small-opening 411. The dammed liquid refrigerant is returned through a return passage 421 into the refrigerant tank 3. Therefore, the amount of the liquid refrigerant in the gas-liquid mixed refrigerant which flows through the small-diameter opening 411 into the radiating passages 42 is reduced. Accordingly, it is possible to increase an effective area for condensation heat transfer in the radiating passages 42.

Furthermore, when the amount of radiating heat becomes large, the bubbles increase in the refrigerant in the refrigerant tank 3, and the liquid level of the refrigerant rises. The lowest portion of the small-diameter opening 411 is narrower by a predetermined value (r1–r2) than the bottom surface of the inflow return chamber 461. Therefore, the refrigerant is blocked and the liquid refrigerant can be suppressed from flowing into the radiating passages when the liquid level of the refrigerant rises.

According to the first to fourth embodiments, the following effects can be obtained.

Since the radiator can be constructed by laminating the plurality of radiating tubes each having the same hollow shape, and connecting the assembly of the radiating tubes to the connecting unit joined to the refrigerant tank, the capacity of the radiator can be readily changed by laminating additional radiating tubes each having the same hollow shape to the assembly of the radiating tubes when the number of heating bodies attached to the refrigerant tank is increased and the total amount of generating heat is increased. Thus, it is possible to provide a radiator having a capacity corresponding to a necessary amount of generating heat at a low cost.

Since the refrigerant tank 3 is provided internally with the lower communicating passage 38 communicating the vapor passages with the condensed liquid passage in the lower end of the refrigerant tank 3, the cooled liquid refrigerant is supplied continuously from the condensed liquid passage into the vapor passages. Therefore, the flooding (the mutual interference when the vaporized refrigerant and the liquid refrigerant move) can be prevented.

Since the radiating tubes 39 are connected through the connecting pipe 51 to the refrigerant tank 3, the direction or the position where the radiating tubes 39 are installed can be properly changed by changing the shape of the connecting pipe 51. Thus, the degree of freedom when designing the cooling apparatus is improved. In this way, the cooling apparatus can be downsized.

Since the bottom surfaces of the radiating tubes 39 are declined from the inflow communicating chambers 44 toward the outflow communicating chambers 45, the condensed liquid refrigerant can flow smoothly through the radiating passages 42 from the inflow communicating chamber toward the outflow communicating chamber. Consequently, the amount of the condensed liquid refrigerant which stays on the bottom surfaces of the radiating passages 42 is reduced, and the vaporized refrigerant can be condensed efficiently.

Since the refrigerant tank 3 is structured by the extrusion member 7, it is possible to manufacture the refrigerant tank 3 at a high productivity.

Since there is provided the partition walls formed integrally with the extrusion member and dividing the interior of the refrigerant chamber, the vapor passages 9 and the condensed liquid passage 10 can be formed easily.

Since the plurality of vapor passages 9 can be communicated with the tank outlet 35 simply by cutting an upper end portion of the partition wall 31 of the extrusion member, the circulation of the refrigerant can be controlled at a low cost without using any special parts.

The vapor passages and the condensed liquid passage can be communicated in the lower portion of the refrigerant chamber by cutting lower end portions of the partition walls of the extrusion member and joining a closing member to the lower end portion of the extrusion member. Therefore, the closing member may be of a simple shape (e.g., a simple flat plate), and it becomes easy to manufacture the closing member.

When the cooling apparatus for cooling a plurality of heating bodies, a plurality of refrigerant chambers can be formed within the refrigerant tank 3 for the respective heating bodies. By communicating the refrigerant chambers with each other, the refrigerant can circulate uniformly through the overall refrigerant tank, and the deterioration of radiating performance due to the uneven distribution of the refrigerant in the refrigerant tank can be prevented.

By forming the refrigerant tank in a flat shape, an amount of the refrigerant used therein can be reduced. Therefore, even if expensive fluorocarbon type refrigerant is used, the cost can be minimized.

The vapor passages and the condensed liquid passage may be formed by refrigerant flow control plates disposed within the refrigerant chamber. In this case, in addition to the effect of preventing the flooding, by disposing the refrigerant flow control plates in contact with the inner surfaces of the refrigerant chamber, the rigidity of the refrigerant chamber can be enhanced, and the radiating area of the refrigerant chamber can be increased so that the radiating performance can be improved.

Not only the refrigerant tank, but also the radiator may be structured by using an extrusion member formed by extruding integrally with the refrigerant tank. In this way, it is possible to reduce the cost of the radiator and to omit the work for assembling the radiator and the refrigerant tank, so that the total cost of the cooling apparatus can be reduced.

The radiator 4 is structured by a plurality of plate members having joined portions and is formed by joining the joined portions of the plate members. Since the joined portion is formed by bending the plate member, it is easy to form the radiator.

Although the present invention has been described when the heating body is employed as the high-temperature medium; however, high-temperature fluid, such as high-temperature gas or high-temperature liquid may be employed as he high-temperature medium. In this case, heat absorbing fins may be formed on the surface corresponding to the surface to which the semiconductor devices are attached of the cooling apparatus in the above-described embodiments. A heating body is disposed away from the cooling apparatus, and the high-temperature fluid is cooled by circulating the high-temperature fluid around the heating body and by absorbing the heat of the high-temperature fluid with the heat absorbing fins.

Fifth Embodiment

Figure 26:
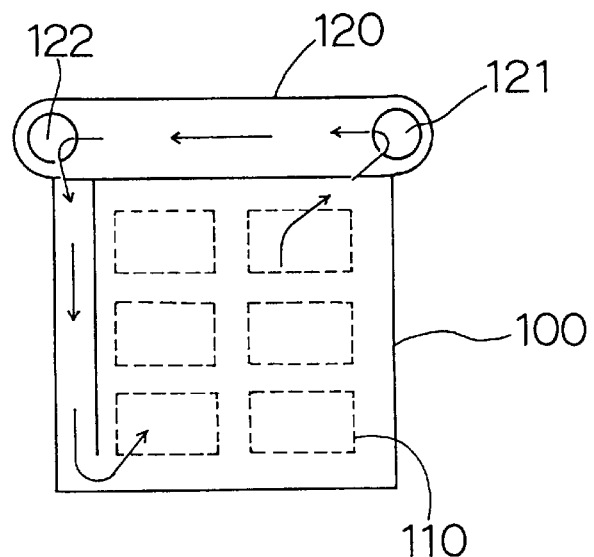
FIG. 26 is a schematic view of a conventional cooling apparatus, for showing a flow of refrigerant.
Figure 27:
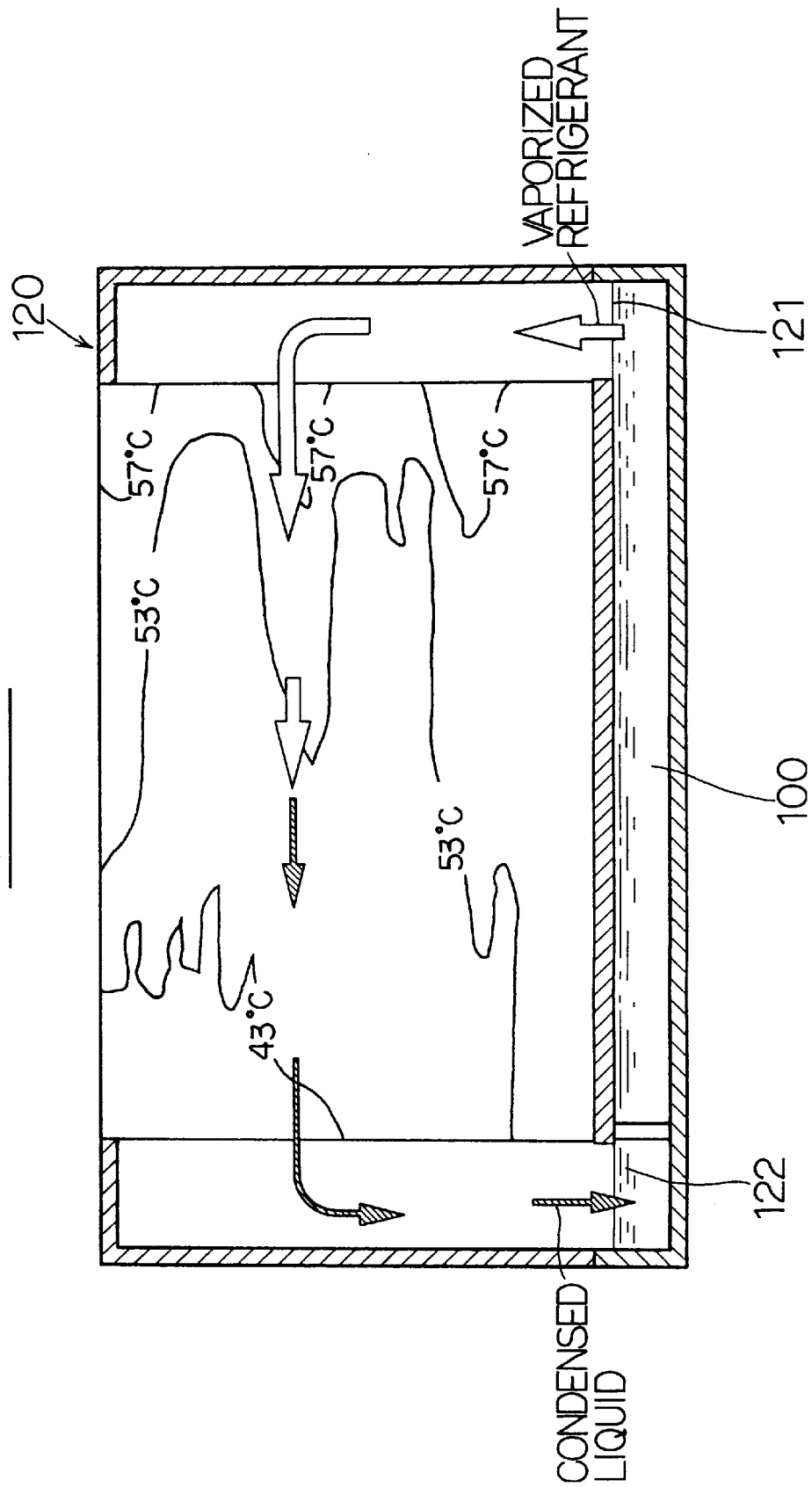
FIG. 27 is a view showing a temperature distribution of outer fins of a radiator in the conventional cooling apparatus.

The inventors have examined the conventional cooling apparatus shown in FIG. 26. In this cooling apparatus, vaporized refrigerant which has been boiled and vaporized by absorbing heat of a heating body 110 of a refrigerant tank 100 releases condensation latent heat and is liquefied (to be a condensed liquid) when the refrigerant flows in one direction from an inlet 121 toward an outlet 122 within a radiator 120, and the condensed liquid refrigerant circulates from the radiator 120 to the refrigerant tank 100 (A flow of the refrigerant is shown by the solid line arrow in FIG. 26).

However, the above-described cooling apparatus is constructed such that the refrigerant flows in one direction within the radiator 120. Therefore, in the case where the core of the radiator 120 is large-sized in accordance with an increase in the heating amount generated by the heating body 100, the temperature of the outer fin of the radiator 120 lowers as being away from the inlet 121 of the core, as shown in FIG. 8. The temperature in the figure indicates the temperature distribution of the outer fin. As a result, since the temperature difference from atmosphere cannot be taken large at a portion in which the fin temperature is low, it cannot be greatly contributed to radiation. Because of this, there occurs a problem in that even when the core is large-sized, the radiating performance cannot be improved efficiently. That is, the radiating performance corresponding to the larger-size of the core cannot be obtained.

In view of the above-described problems, the fifth embodiment will be described with reference to FIGS. 20–22.

Figure 20:
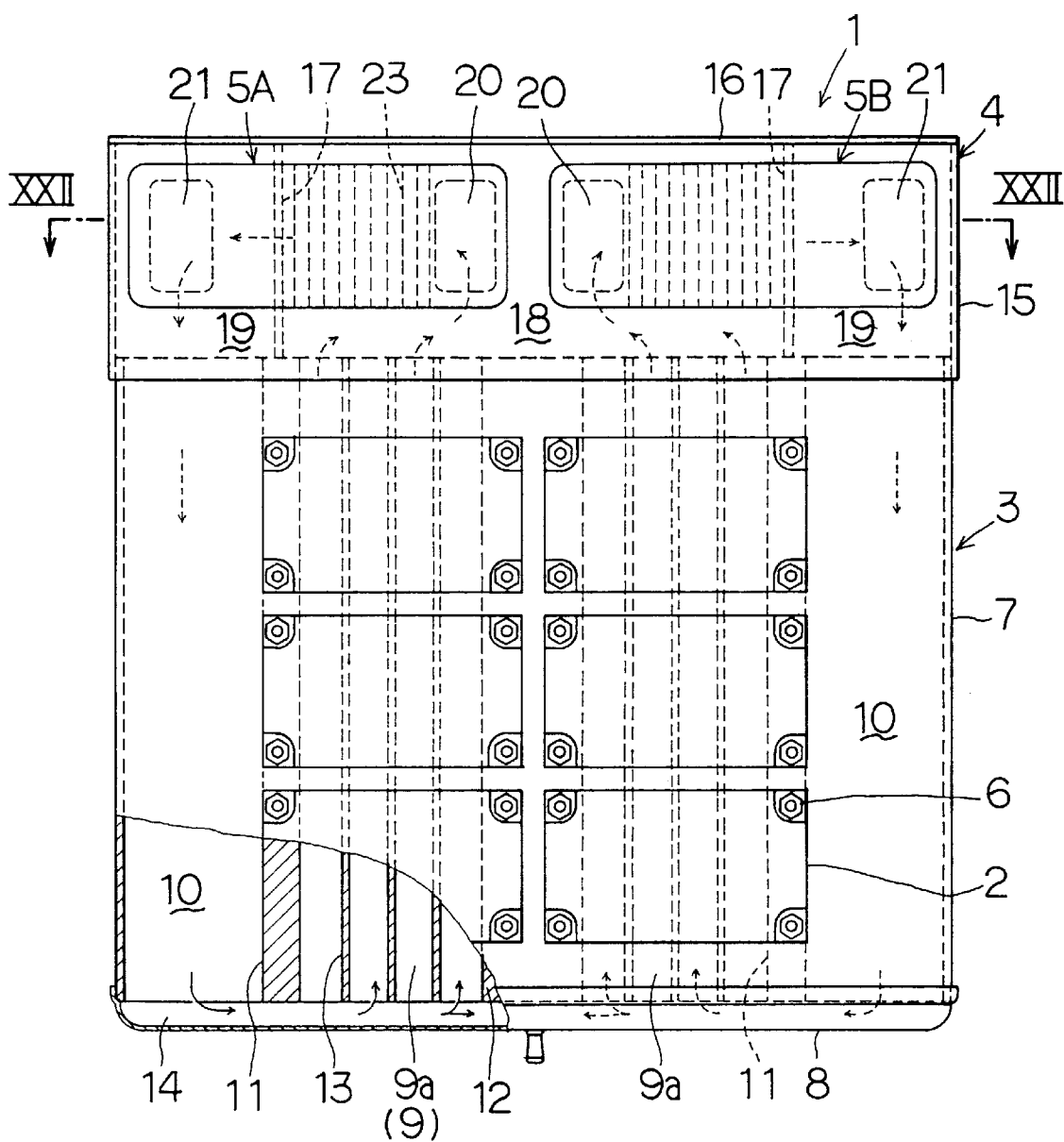
FIG. 20 is a front view of a cooling apparatus according to the fifth embodiment.
Figure 22:
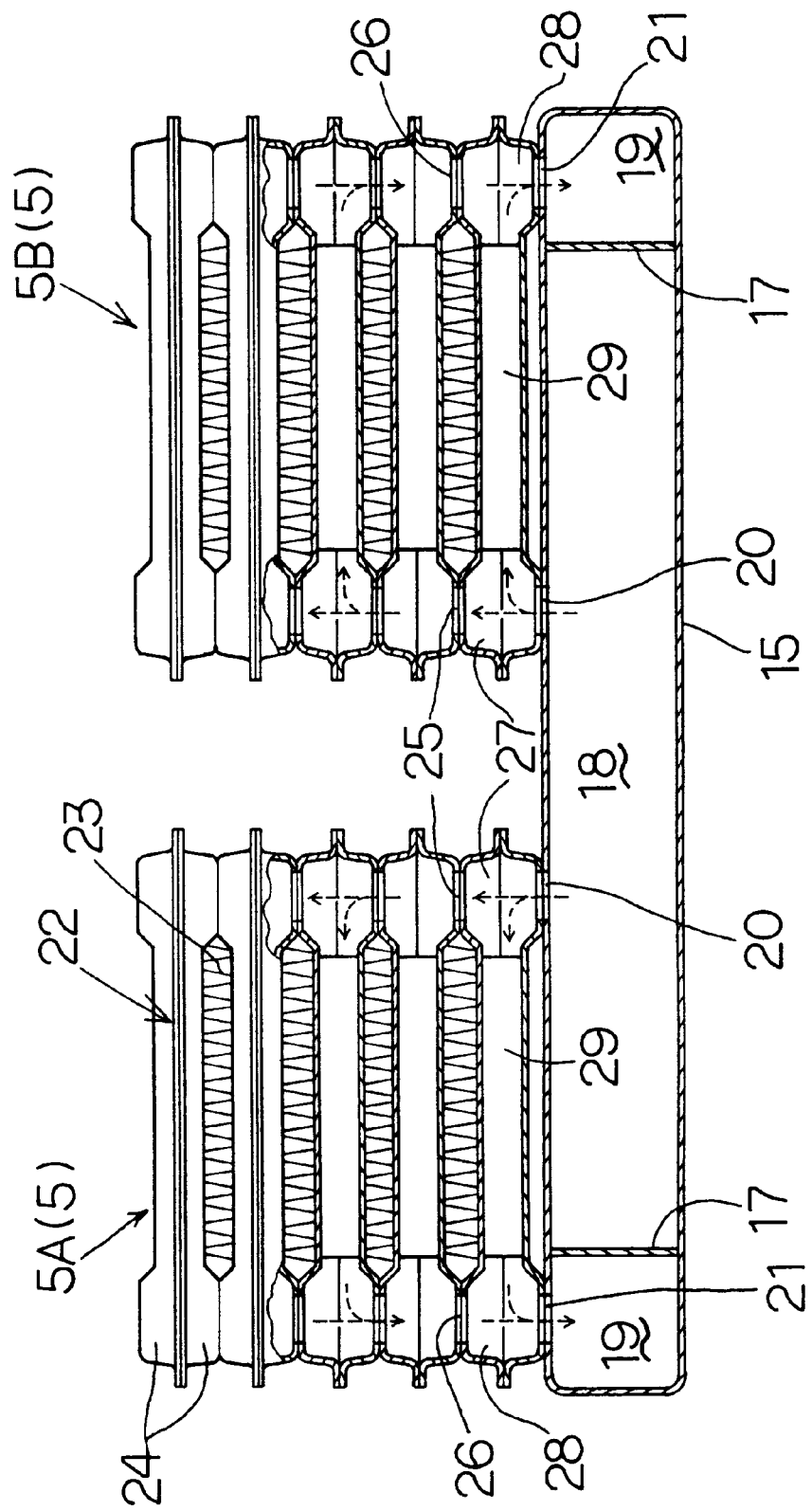
FIG. 22 is a cross sectional view taken along the line XXII—XXII of FIG. 20.

FIG. 20 is a front view of a cooling apparatus, FIG. 21 is a side view of the cooling apparatus, and FIG. 22 is a cross sectional view taken along the line XXII—XXII of FIG. 20.

The cooling apparatus 1 is for cooling a heating body 2 by the heat transfer in which boiling and condensing of the refrigerant is repeated, and includes a refrigerant tank 3, a connecting portion 4, a radiator 5 (see FIG. 21) and a cooling fan (not shown).

The heating body 2 is an IGBT module constituting an inverter circuit of, for example, an electric vehicle and a general electric power control equipment, and the radiating surface of the heating body 2 is fixed to the refrigerant tank 3 by fastening a bolt 6 while being in close contact with an outer wall surface of the refrigerant tank 3.

The refrigerant tank 3 includes an extrusion member 7 formed by extruding a block material made of aluminum, for example, and a cap 8 covering a lower end surface of the extrusion member 7.

The extrusion member 7 is provided in a flat shape in which a width of a thickness is thinner than a lateral width, and has a vapor passage 9 and a condensed liquid passage 10 which extend through in an extrusion direction (vertical direction in FIG. 21). The vapor passage 9 is a passage through which vaporized refrigerant which absorbs heat of the heating body and is boiled and vaporized ascends, and there are formed two vapor passages 9 in regions corresponding to portion on which the heating body 2 is mounted. The condensed liquid passage 10 is a passage into which condensed liquid refrigerant which is cooled and liquefied by the radiator 5 flows, and there are formed two condensed liquid passages 10 in regions deviated from the portion on which the heating body 2 is mounted (both left and right outer sides of the vapor passage 9 in this embodiment). A portion between the vapor passage 9 and the condensed liquid passage 10 and a portion between two vapor passages 9 are divided by a plurality of passage walls 11 and 12 which extend in the extrusion direction, and each vapor passage 9 is divided into small passages 9a by a plurality of ribs 3 which extend in the extrusion direction.

The cap 8 is made of the same aluminum as the extrusion member 7, and is connected to hermetically cover an outer peripheral portion of the lower end of the extrusion member 7. A communication passage 14 for communicating with each other the passages 9 and 10 which are formed in the extrusion member 7 is provided between an inner wall surface of the cap 8 and the lower end surface of the extrusion member 7.

The connecting portion 4 airtightly connects the refrigerant tank 3 with the radiator 5, and includes an extrusion member 15 formed by extruding a block material made of aluminum, for example, and an end plate 16 for closing an upper open end of the extrusion member 15. The connecting portion 4 is fitted to an upper portion of the extrusion member 7 for forming the refrigerant tank 3.

The extrusion member 15 has two partition walls 17 extending in the extrusion direction (in the vertical direction in FIG. 20). An interior of the extrusion member is divided by the partition walls 17 into a first communication chamber 18 communicating with the vapor passage 9 of the refrigerant tank 3 and a second communication chamber 19 communicating with the condensed liquid passage 10 of the refrigerant tank 3. The second communication chamber 19 is formed on both left and right sides of the first communication chamber 18. The partition wall 17 is provided substantially at the same position as the passage wall 11 which divides between the vapor passage 9 and the condensed liquid passage 10 provided in the extrusion member 7 of the refrigerant tank 3 in the lateral width direction (in the lateral direction in FIG. 20) of the extrusion member 15, and the lower end surface of the partition wall 17 is in contact with the upper end surface of the passage wall 11. The extrusion member 15 is provided on both sides with four first communication openings 20 (two at each side) which open to the first communication chamber 18, and four second communication openings 21 (two at each side) which open to the second communication chamber 19.

The end plate 16 is made of the same aluminum as the extrusion member 15 and is joined with an upper open end of the extrusion member 15 while being in close contact therewith to close the upper open end of the extrusion member 15.

The radiator 5 is a heat exchanger of a so-called drawn cup type, and includes a first core 5A and a second core 5B disposed in parallel with the connecting portion 4. The first core 5A and the second core 5B are provided on both sides of the connecting portion 4. In FIG. 22, the first core 5A and the second core 5B are shown on only one side of the connecting portion 4. Each of the first core 5A and the second core 5B is constructed by laminating a plurality of flat radiating tubes 22 and radiating fins 23.

The radiating tube 22 is a hollow structure formed by joining outer peripheral edge portions of two pressed plates 24. Communication holes 25 and 26 (see FIG. 22) punched during being pressed are opened to longitudinal both ends and are communicated with other laminated radiating tubes 22 through the communication holes 25 and 26. The radiating tube 22 has an inflow chamber 27 to which one communication hole 25 is opened, an outflow chamber 28 to which the other communication hole 26 is opened, and a refrigerant passage 29 for communicating the inflow chamber 27 with the outflow chamber 28.

The first core 5A and the second core 5B are constructed such that the inflow chamber 27 of the radiating tube 22 communicates with the first communication chamber 18 of the connecting portion 4 through one communication hole 25 of the radiating tube 22 and the first communication opening 20 of the connecting portion 4, and the outflow chamber 28 of the radiating tube 22 communicates with the second communication chamber 19 of the connecting portion 4 through the other communication hole 26 of the radiating tube 22 and the second communication opening 21 of the connecting portion 4.

The radiating fins 23 are inserted into a flat space for blowing air, formed between the radiating tubes 2 adjacent to the laminating direction, and are joined to the outer wall surface of the radiating tubes 22.

The cooling fan for blowing air toward the radiator 5 is disposed above or below the radiator 5 so that the direction of the blown-air is substantially vertical to the radiator 5.

An operation of the cooling apparatus 1 according to this embodiment will be described hereinafter.

The refrigerant boiled by heat generated from the heating body 2 ascends as bubbles through the vapor passages 9, and flows into the inflow chamber 27 of the radiating tubes 22 of the first core 5A and the second core 5B passing through the first communication chamber 18 of the connecting portion 4 from the vapor passages 9. In the first core 5A and the second core 5B, the vaporized refrigerant having flowed into the radiating tube 22 releases condensation latent heat, becomes condensed and liquefied when flowing through the refrigerant passage 29. The refrigerant which has been liquefied to be droplets flows out of the outflow chamber 28 of the radiating tube 22, flows into the second communication chamber 19 of the connecting portion 4 and further flows into the condensed liquid passage 10 of the refrigerant tank 3 from the second communication chamber 19. The condensed liquid having flowed down from the condensed liquid passage 10 is again supplied to the vapor passage 9 passing through the communication passage 14 in the cap 8. On the other hand, the condensation latent heat released when the vaporized refrigerant condenses in the radiating tube 22 is transferred to the radiating fins 23 from the wall surface of the radiating tube 22 and released into air blown by the cooling fan.

According to the fifth embodiment, the first core 5A and the second core 5B constructing the radiator 5 are disposed in parallel with the connecting portion 4. Therefore, in the radiating tube 22 forming the cores 5A and 5B, the refrigerant passage 2 becomes shorter as compared with the conventional radiating tube of the radiating core. In this way, the temperature of the vaporized refrigerant at the outlet of the refrigerant passage 29 of the radiant tube 22 rises as compared with the conventional type, and therefore, the temperature of the radiating fin 23 of the radiator 5 rises so that a temperature difference from atmosphere can be taken larger. As a result, it is possible to considerably reduce (eliminate) the region which does not contribute to the radiation greatly, thus improving the radiating performance. In other words, the radiator 5 can be downsized in order to obtain the same degree of radiating performance as the conventional type.

In the present embodiment, the inflow chamber 27 and the outflow chamber 28 are provided inside and outside the radiating tubes 22 of the first core 5A and the second core 5B, respectively; however, the position of the vapor passage 9 of the refrigerant tank 3 and the position of the condense passage 20 may be changed from one another so that the outflow chamber 28 can be provided inside the radiating tube 22 and the inflow chamber 27 can be provided outside.

Sixth Embodiment

Figure 23:
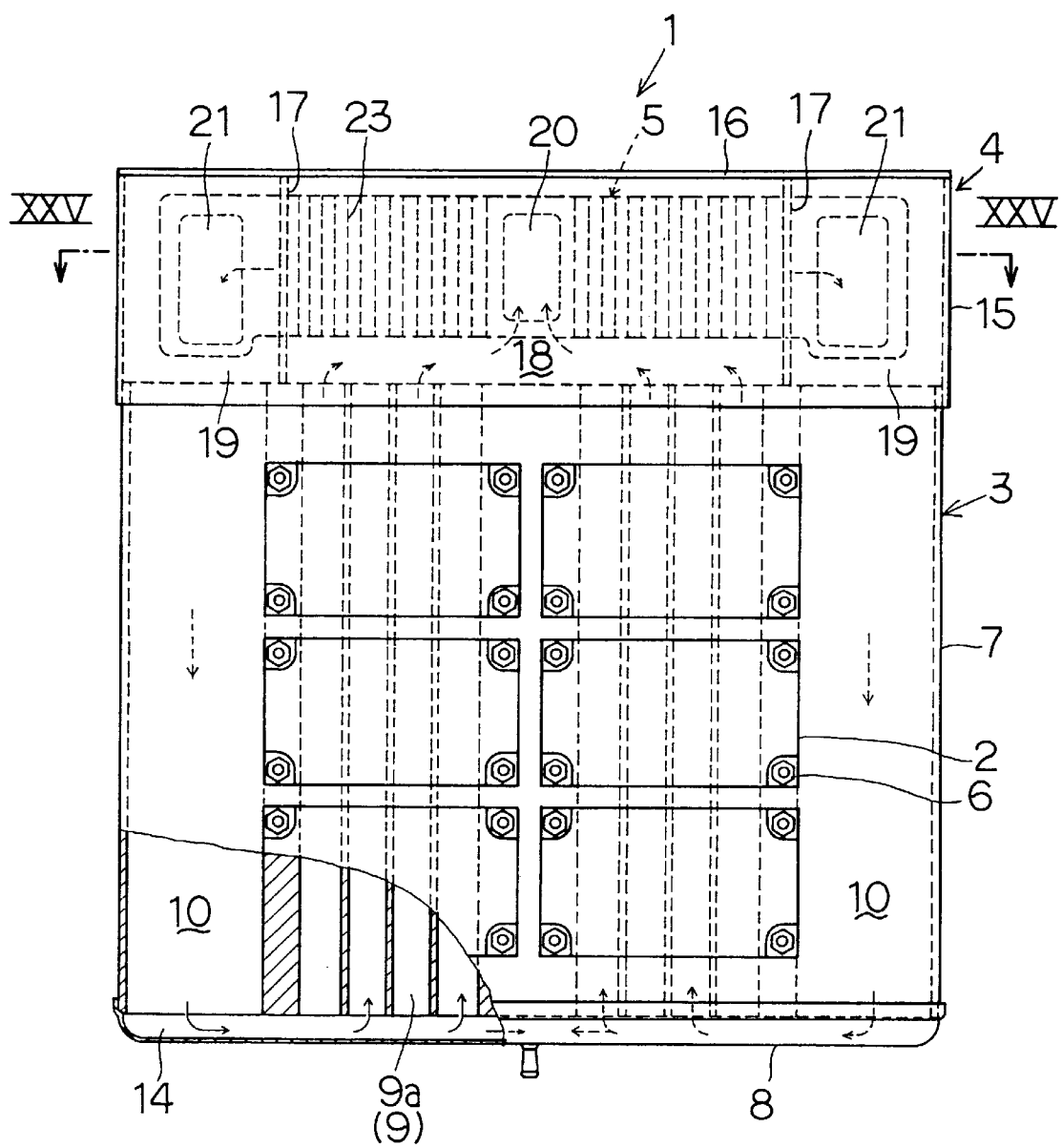
FIG. 23 is a front view of a cooling apparatus according to a sixth embodiment of the present invention.
Figure 25:
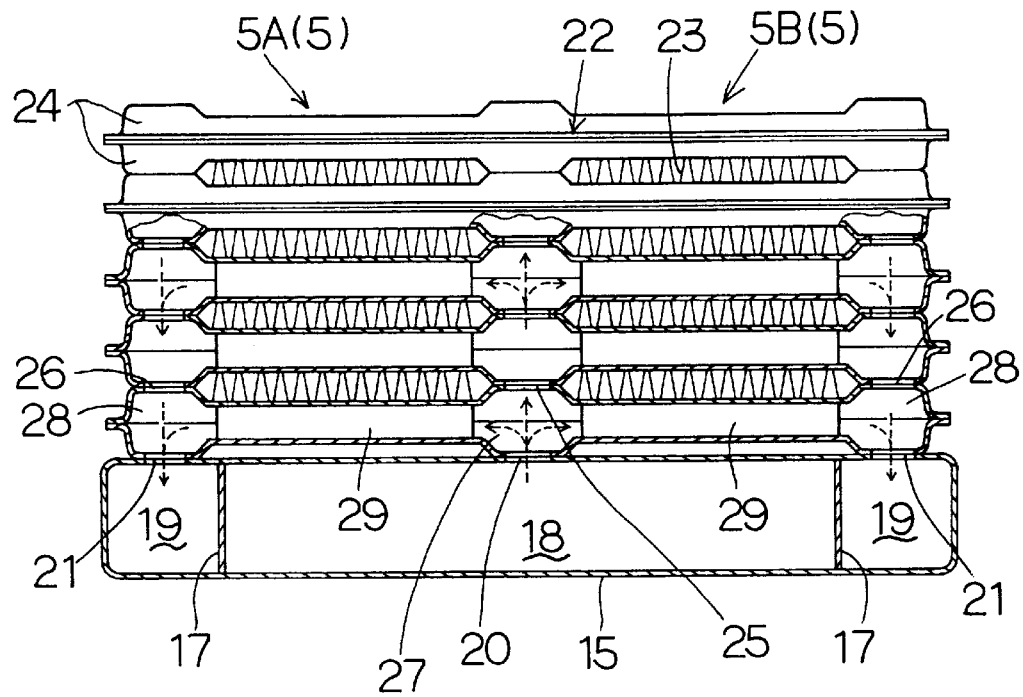
FIG. 25 is a cross sectional view taken along the line XXV—XXV of FIG. 23.

FIG. 23 is a front view of the cooling apparatus, FIG. 24 is a side view of the cooling apparatus, and FIG. 25 is a cross sectional view taken along the line XXV—XXV of FIG. 23.

In this embodiment, the radiating tube 22 of the first core 5A and the second core 5B are integrally structured. In this case, since each inflow chamber 27 of the radiating tubes 22 can be commonly employed, an area to which the radiating fin 23 is mounted can be taken larger; and therefore, the radiating performance can be further improved.

In this embodiment, the inflow chamber 27 is provided in the central portion of the radiating tube 22 and the outflow chambers 28 are provided on both sides; however, the position of the vapor passage 9 of the refrigerant tank 3 and the position of the condense passage 10 may be changed from one another so that the outflow chamber 28 can be provided in the central portion of the radiating tube 22 and the inflow chambers 27 can be provided on both sides.

Seventh Embodiment

In this embodiment, radiating tubes 39 constructing a radiator 4 are disposed while being inclined to return condensed liquid refrigerant which has been liquefied in the radiator 4 to a refrigerant tank 3 smoothly.

Figure 28:
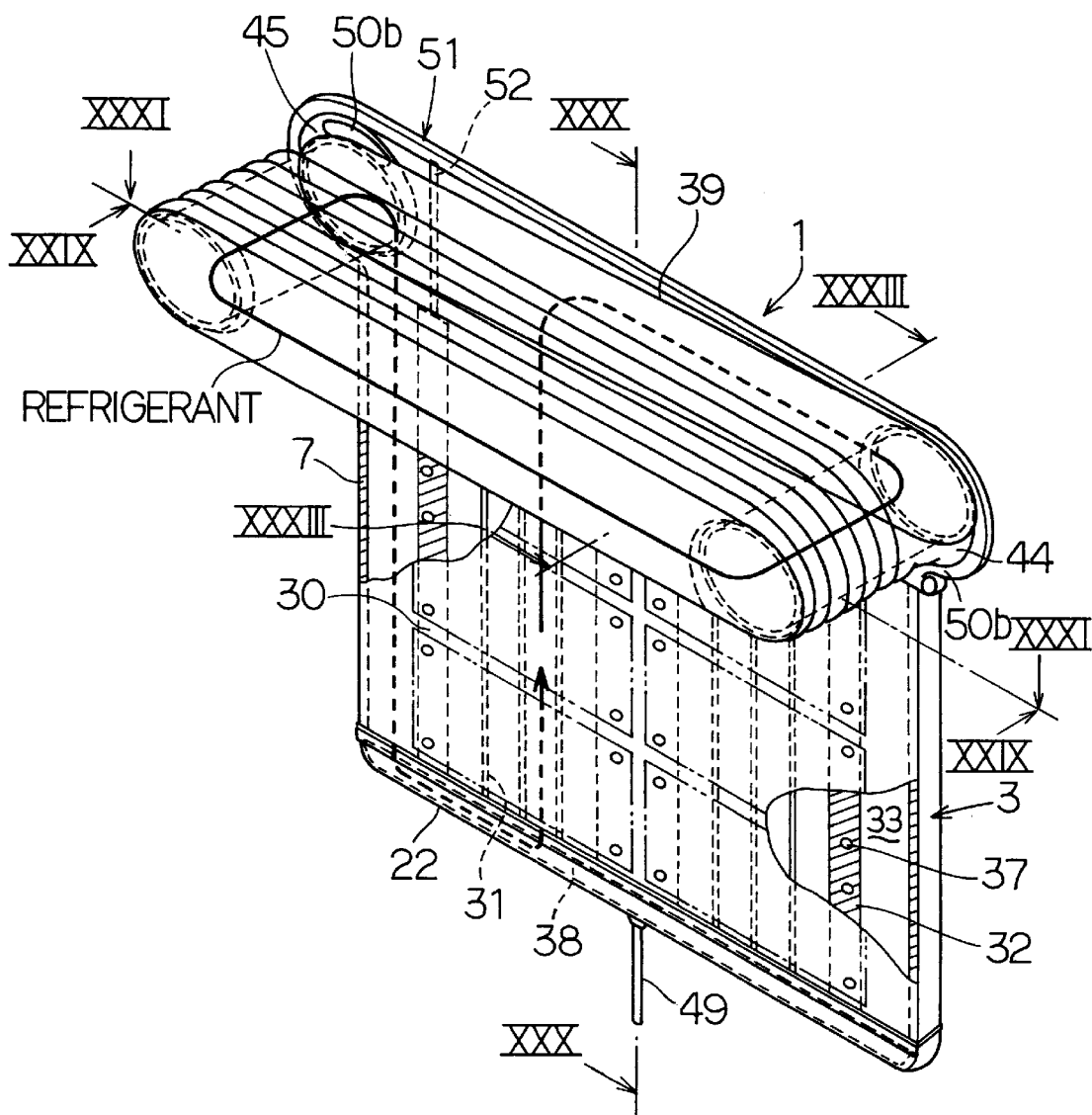
FIG. 28 is a perspective view of a cooling apparatus according to a seventh embodiment of the present invention.
Figure 29:
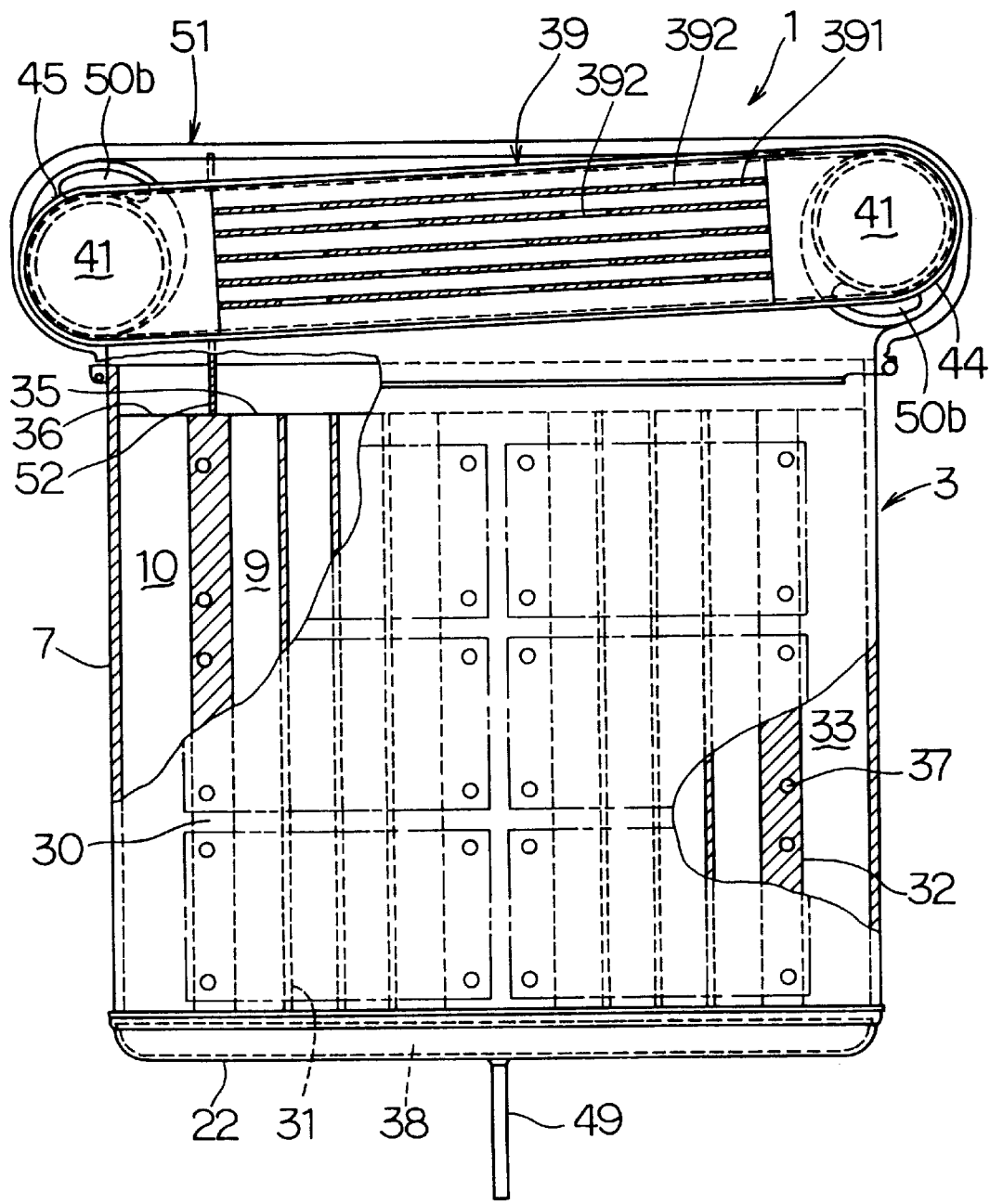
FIG. 29 is a cross sectional view taken along the line XXIX—XXIX of FIG. 28.

Referring to FIGS. 28 and 29, the refrigerant tank 3 comprises an extrusion member 7 formed by extruding, for example, an aluminum block, and an end cap 22 covering a lower open end of the extrusion member 7. An interior of the extrusion member 7 is partitioned by partition walls 30, 31 and 32 extending vertically into a plurality of vapor passages 9, i.e., gas-phase refrigerant passages, a condensed liquid passage 10, i.e., a condensed liquid refrigerant passage, and an inoperative passage 33. The open ends of the vapor passages 9 and the open end of the condensed liquid passage 10 are connected to a refrigerant tank outlet 35 and a refrigerant tank inlet 36, respectively.

The end cap 22 is made of the same material, i.e., aluminum, as the extrusion member 7, and is brazed to a lower end of the extrusion member 7 so as to form a lower communicating chamber 38 communicating the vapor passages 9, the condensed liquid passage 10 and the inoperative passage 33 of the extrusion member 7 with each other. A tube 49 for sealing the refrigerant is attached to the end cap 22, through which washing, supplying the refrigerant, and degassing for the cooling apparatus 1 are performed. When degassing the cooling apparatus 1, the cooling apparatus 1 is turned over vertically after filling the refrigerant therein, the radiator 4 is immersed in a hot water bath (maintained to a temperature at which the saturated vapor pressure of the refrigerant is higher than the atmospheric pressure). Thus, the refrigerant is evaporated in the cooling apparatus 1 to release air from the cooling apparatus 1 by the vapor of the refrigerant, which has a specific gravity greater than that of air. After the cooling apparatus 1 has been degassed, the tube 49 is caulked and closed by welding or the like to seal the refrigerant in the cooling apparatus 1.

Figure 30:
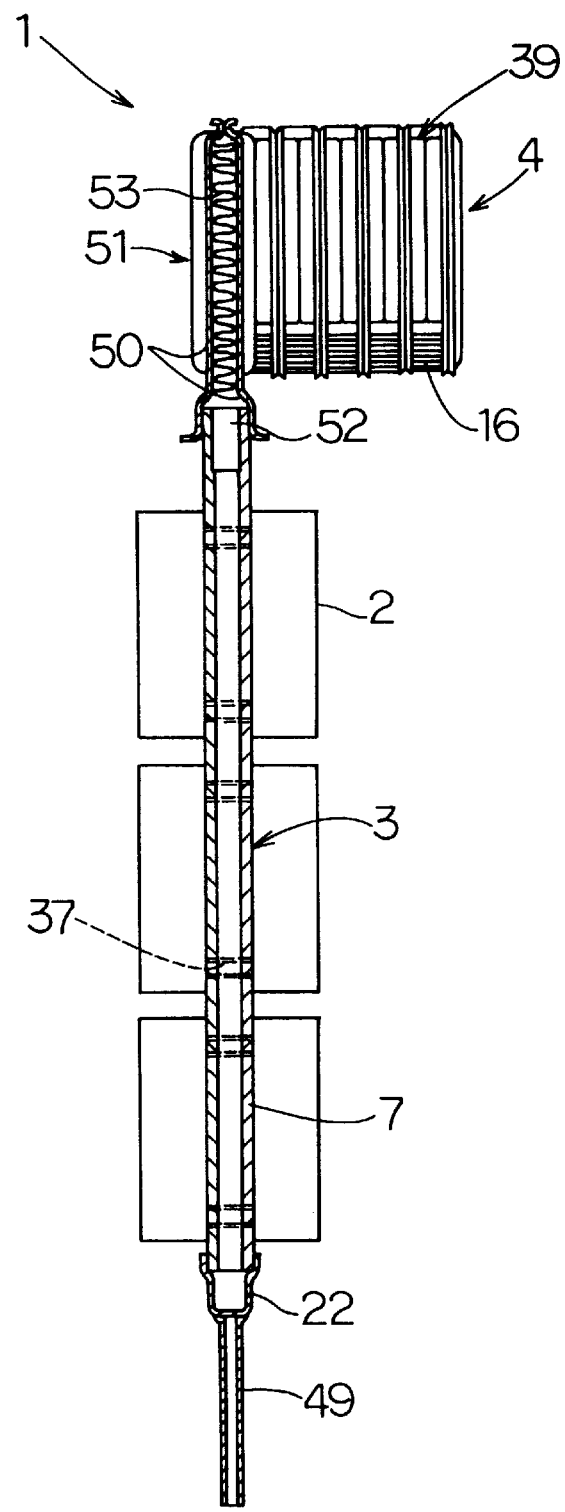
FIG. 30 is a cross sectional view taken along the line XXX—XXX of FIG. 28.

The radiator 4 is a heat exchanger of so-called a drawn cup type. The radiator 4 is constructed by laminating a plurality of radiating tubes 39 of the same hollow shape as shown in FIG. 30.

Figure 32A:
FIGS. 32A and 32B are a side view and a plan view, respectively, of pressed plates.
Figure 32B:
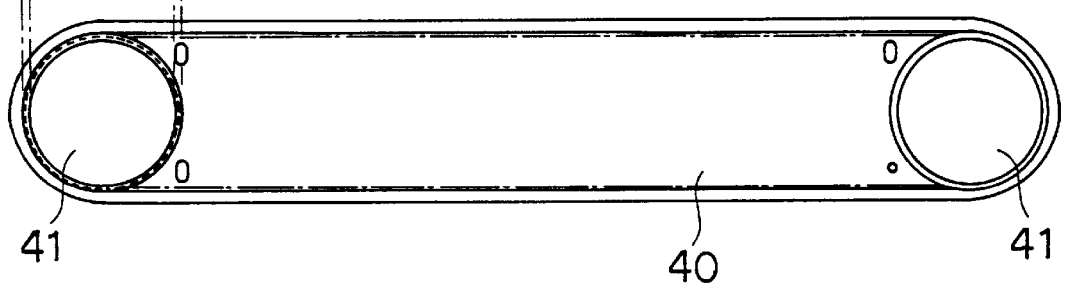
Figure 33:
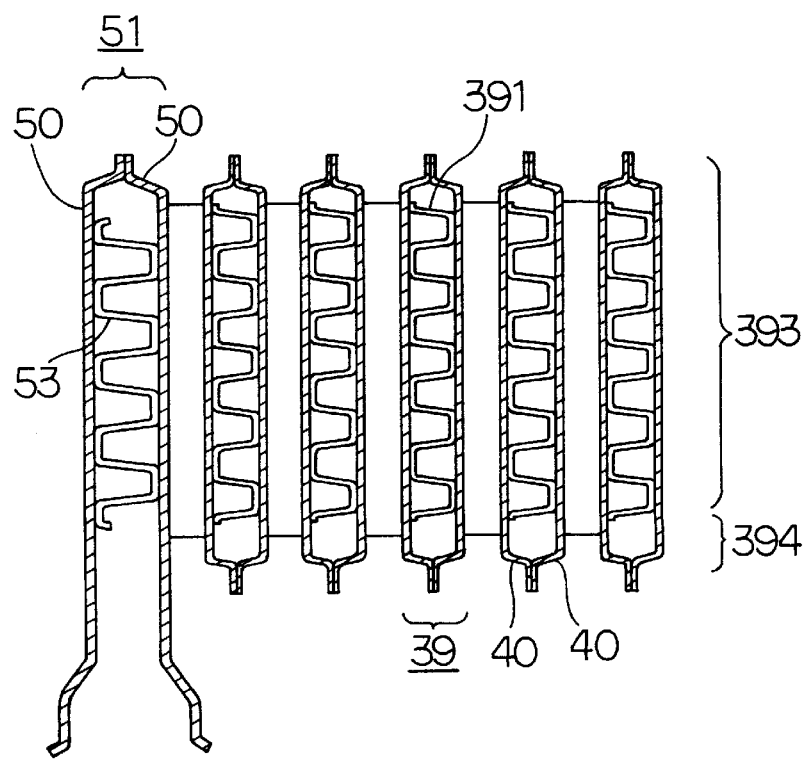
FIG. 33 is a cross sectional view taken along the line XXXIIV—XXXIIV of FIG. 28.

The radiating tube 39 is a hollow structure formed by joining peripheral edge portions of two pressed plates 40 of, for example, aluminum shown in FIG. 32. The radiating tube 39 is provided at both ends with an inflow communicating portion 44 and an outflow communicating portion 45 provided with small-diameter openings 41, respectively. The radiating tube 39 forms therein a heat radiating passage 42 at an entire center portion. As shown in FIG. 33, wavy inner fins 391 (condensing fins) formed by bending a thin aluminum plate are inserted in the refrigerant passages 42.

A connecting pipe 51 is formed by joining two plates 50. The connecting pipe 51 covers an upper end of the refrigerant tank 3 as shown in FIG. 30. The radiator 4 communicates with the refrigerant tank 3 through the connecting pipe 51. As shown in FIG. 29, an interior of the connecting pipe 51 is divided by a partition plate 52 into an inflow chamber 511 communicating with a refrigerant tank outlet 35 formed in the refrigerant tank 3 and an outflow chamber 512 communicating with a refrigerant tank inlet 36 formed in the refrigerant tank 3. A plurality of inner fins 53 for the connecting pipe 51 are inserted in the inflow chamber 511 of the connecting pipe 51.

Figure 34A:
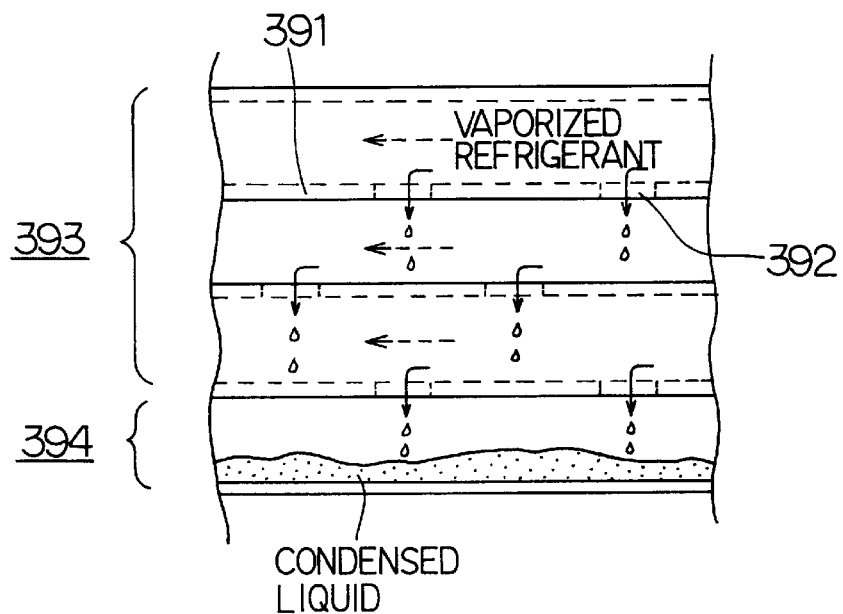
FIGS. 34A and 34B are a fragmentary enlarged side view and a fragmentary enlarged end view, respectively, of an inner fin shown in FIG. 33.
Figure 34B:
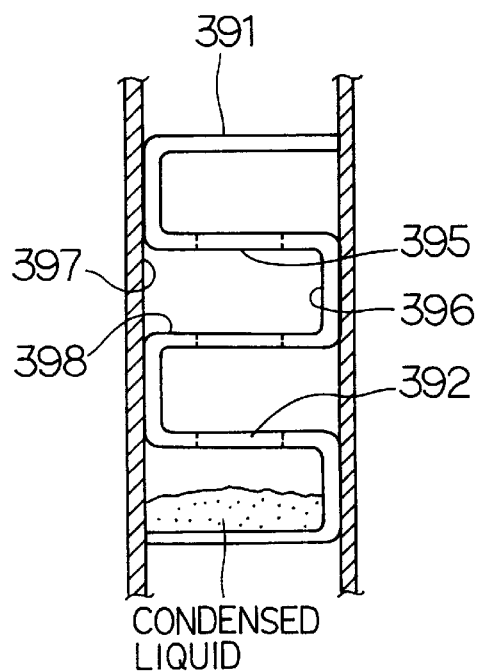
Figure 35:
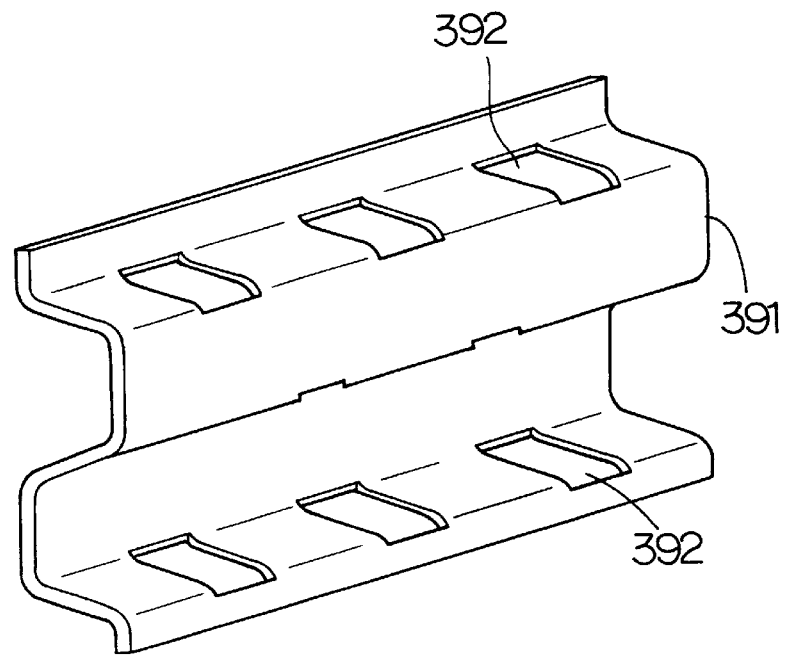
FIG. 35 is a fragmentary perspective view of an inner fin shown in FIG. 34.

As shown in FIGS. 29, 34 and 35, the inner fin 391 is provided with a plurality of slits 392 (openings) to drop the condensed liquid refrigerant to the lower portion of the refrigerant passage 42. In other words, there are formed a gas-phase refrigerant passage 393 composed of a plurality of small passages through which the gas-phase refrigerant flows and a condensed liquid passage 394 through which the condensed and liquefied refrigerant flows in the refrigerant passage 42, and the inner fins 391 are provided in the gas-phase refrigerant passages 393 for condensing the vaporized refrigerant. The inner fin 391 is formed with a plurality of slits for dropping the condensed and liquefied refrigerant into the condensed liquid passage 394. Each of the small passages is defined by an upper wall 395, a side wall 297 and a bottom wall 398 of the inner fin 391, and a side wall 397 of the pressed plate 40. In this embodiment, the slits 392 are formed at different positions from each other in the inner fin 391 with respect to the direction where the refrigerant moves.

As shown in FIG. 31, the radiating tubes 39 are laminated on one side of the connecting pipe 51 and communicated with each other through the respective small-diameter openings 41. The connecting pipe 51 and the radiating tubes 39 communicate with each other through the small-diameter openings 41 formed in the plate 50 of the connecting pipe 51 (the plate 50 at the side of the radiating pipe 39) and the small-diameter openings formed in the adjacent radiating tube 39. The radiating tubes 39 are attached to the connecting pipe 51 while being inclined so that the level of the inflow communicating portions 44 is higher than that of the outflow communicating portions 45 as shown in FIG. 29. The plate 50 is provided with ribs 50b to reinforce portions of the plate 50 to be joined to the adjacent radiating tube 39.

An operation of the seventh embodiment will be described hereinafter.

As shown in FIG. 28, the refrigerant boiled by heat generated by and transferred from IGBT modules 2 ascends as bubbles through the vapor passages 9, flows through the refrigerant tank outlet 35 of the refrigerant tank 3 into the inflow chamber of the connecting pipe 51, and is distributed through the inflow communicating portions 44 of the radiating tubes 39 to the refrigerant passages 42 of the radiating tubes 39. The flow of the refrigerant is indicated simply by a single line in FIG. 28. As the vaporized refrigerant flows through the refrigerant passages 42, the vaporized refrigerant condenses on the inner surfaces of the refrigerant passages 42 and the surfaces of the inner fins 391, which are cooled by air blown by the cooling fan 5 to be at a low temperature, and radiates latent heat of condensation to be droplets. When the condensed and liquefied refrigerant flows in each refrigerant passage along the surfaces of the inner fin 391 toward the outflow communicating portion 45, the liquid refrigerant drops through the slits 392 on the way to the outflow communicating portion 45, to the lower inner fin 391. In this embodiment, there are formed a plurality of slits 392, the refrigerant becomes droplets in turn and reaches the bottom surface of each refrigerant passage 42. In other words, the refrigerant condensed and liquefied in each of the small passages of the gas-phase refrigerant passage 393 in the refrigerant passage 42 flows down through the slits 392 to the lower small passage, and further to the condensed liquid passage 394. Finally, the refrigerant flows into the outflow communicating portions 45 of each radiating tube 39 while flowing on the bottom surface of the refrigerant passage 42.

Then, the condensed liquid refrigerant flows from the outflow communicating portions 45 into the outflow chamber of the connecting pipe 51, flows further through the refrigerant tank inlet 36 of the refrigerant tank 3 into the condensed liquid passage 10, flows down through the condensed liquid passage 10, and is returned through the communicating passage 38 formed in the end cap 22 to each of the vapor passages 9.

As shown in FIG. 34A, the inner fin 391 is provided with the slits 392 through which the condensed liquid refrigerant drops down to the lower portion in the refrigerant passage 42. Thus, a region where the condensed and liquefied refrigerant flows is formed in the lower side of the refrigerant passage 42, and the upper side of the refrigerant passage 42 can be a region where the gas-phase refrigerant flows. As a result, the bottom surface of the small passage, defined by each inner fin 391, in the refrigerant passage 42, can be suppressed from being covered with the condensed liquid refrigerant. That is, as shown in FIG. 34B, heat of the vaporized refrigerant can be transferred efficiently not only to the upper wall 395 and the side walls 396 and 397, but also to the bottom wall 398 of the small passage. As a result, the radiating area to which the heat of the vaporized refrigerant is transferred can be prevented from being reduced, and the radiating performance can be prevented from being deteriorated.

Since the slits 392 are formed at different positions in the inner fin 392 with respect to the flowing direction of the refrigerant, the amount of the condensed liquid refrigerant which stays in the refrigerant passages 42 is reduced, so that the vaporized refrigerant can efficiently be condensed.

According to the seventh embodiment, the following effects can be obtained.

Since the small-diameter opening 41 of the small-diameter portion is formed in the wall defining the inflow communicating portion, it is possible to suppress the liquid-phase refrigerant from flowing into the refrigerant passages 42. Therefore, heat can be transferred in the refrigerant passage 42 by condensation, and the radiating performance can be prevented from being deteriorated. By providing the small-diameter openings, it is possible to prevent the uneven flow of the refrigerant into the refrigerant passages 42, and further to distribute the refrigerant evenly to the refrigerant passages 42, so that the radiating performance can be prevented from being deteriorated.

Since the radiating tubes 39 are inclined with respect to the connecting pipe 51, the condensed liquid refrigerant is more likely to flow easily through the refrigerant passages 42 from the side of the inflow communicating portion 44 toward the outflow communicating portion 45. Therefore, the amount of the refrigerant which stays on the bottom surface of the refrigerant passages 42 is reduced, and hence the vaporized refrigerant can be condensed efficiently. Consequently, the necessary amount of the refrigerant is reduced, the cost of the cooling apparatus can be minimized.

Since the interior of the extrusion member 7 is divided into the plurality of vapor passages 9 by the partition walls 31, the vaporized refrigerant flowing through the vapor passages 9 can be smoothed. Further, by means of the partition walls 31, the effective boiling area can be increased, and the radiating performance of the cooling apparatus can be improved. Further, the strength of the refrigerant tank 3 against positive and negative pressures can be enhanced, and the deformation of the wall of the refrigerant tank 3, to which the IGBT modules 2 are attached, can be prevented.

Since the radiator can be constructed by laminating the plurality of radiating tubes each having the same hollow shape, and connecting the assembly of the radiating tubes to the connecting unit joined to the refrigerant tank, the capacity of the radiator can be readily changed by laminating additional radiating tubes each having the same hollow shape to the assembly of the radiating tubes when the number of heating bodies attached to the refrigerant tank is increased and the total amount of generating heat is increased. Thus, it is possible to provide a radiator having a capacity corresponding to a necessary amount of generating heat at a low cost.

Since the refrigerant tank 3 is provided internally with the lower communicating passage 38 communicating the vapor passages with the condensed liquid passage in the lower end of the refrigerant tank 3, the cooled liquid refrigerant is supplied continuously from the condensed liquid passage into the vapor passages. Therefore, the flooding (the mutual interference when the vaporized refrigerant and the liquid refrigerant move) can be prevented.

Since the radiating tubes 39 are connected through the connecting member 51 to the refrigerant tank 3, the direction or the position where the radiating tubes 39 are installed can be properly changed by changing the shape of the connecting member 51. Thus, the degree of freedom when designing the cooling apparatus is improved. In this way, the cooling apparatus can be downsized.

Since the bottom surfaces of the radiating tubes 39 are declined from the inflow communicating chambers 44 toward the outflow communicating chambers 45, the condensed liquid refrigerant can flow smoothly through the radiating passages 42 from the inflow communicating chamber toward the outflow communicating chamber. Consequently, the amount of the condensed liquid refrigerant which stays on the bottom surfaces of the radiating passages 42 is reduced, and the vaporized refrigerant can be condensed efficiently.

Since the refrigerant tank 3 is structured by the extrusion member 7, it is possible to correspond to the variation in the number of IGBT modules easily. Thus, the productivity can be improved.

Since there is provided the partition walls formed integrally with the extrusion member and dividing the interior of the refrigerant chamber, the vapor passages 9 and the condensed liquid passage 10 can be formed easily.

Since the plurality of vapor passages 9 can be communicated with the tank outlet 35 simply by cutting an upper end portion of the partition wall 31 of the extrusion member, the circulation of the refrigerant can be controlled at a low cost without using any special parts.

The vapor passages and the condensed liquid passage can be communicated in the lower portion of the refrigerant chamber by cutting lower end portions of the partition walls of the extrusion member and joining a closing member to the lower end portion of the extrusion member. Therefore, the closing member may be of a simple shape (e.g., a simple flat plate), and it becomes easy to manufacture the closing member.

When the cooling apparatus for cooling a plurality of heating bodies, a plurality of refrigerant chambers can be formed within the refrigerant tank 3 for the respective heating bodies. By communicating the refrigerant chambers with each other, the refrigerant can circulate uniformly through the overall refrigerant tank, and the deterioration of radiating performance due to the uneven distribution of the refrigerant in the refrigerant tank can be prevented.

By forming the refrigerant tank in a flat shape, an amount of the refrigerant used therein can be reduced. Therefore, even if expensive fluorocarbon type refrigerant is used, the cost can be minimized.

The vapor passages and the condensed liquid passage may be formed by refrigerant flow control plates disposed within the refrigerant chamber. In this case, in addition to the effect of preventing the flooding, by disposing the refrigerant flow control plates in contact with the inner surfaces of the refrigerant chamber, the rigidity of the refrigerant chamber can be enhanced, and the radiating area of the refrigerant chamber can be increased so that the radiating performance can be improved.

Not only the refrigerant tank, but also the radiator may be structured by using an extrusion member formed by extruding integrally with the refrigerant tank. In this way, it is possible to reduce the cost of the radiator and to omit the work for assembling the radiator and the refrigerant tank, so that the total cost of the cooling apparatus can be reduced.

The radiator 4 is structured by a plurality of plate members having joined portions and is formed by joining the joined portions of the plate members. Since the joined portion is formed by bending the plate member, it is easy to form the radiator.

Through the slits 392, the condensed liquid refrigerant drops down to the lower portion in the refrigerant passage 42. A region where the condensed and liquefied refrigerant flows is formed in the lower side of the refrigerant passage 42, and the upper side of the refrigerant passage 42 can be a region where the gas-phase refrigerant flows. Therefore, the refrigerant can be prevented from being likely to clog up in the refrigerant passages 42. As a result, it is possible to prevent the minimum flow path cross sectional area through which the gas-phase refrigerant passages 393 can pass from being reduced and also prevent the radiating performance from being deteriorated.

Figure 36:
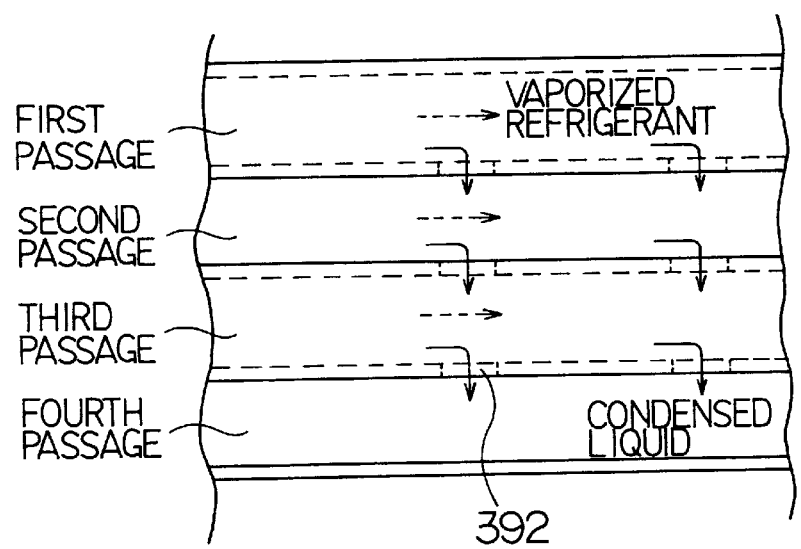
FIG. 36 is a fragmentary side view of another inner fin.

As shown in FIG. 34, the slits 392 are formed in the inner fin 391 at different positions from each other; however, the slits 392 may be formed substantially at the same positions as shown in FIG. 36. In this way, it is easy to form the slits 392.

Figure 37A:
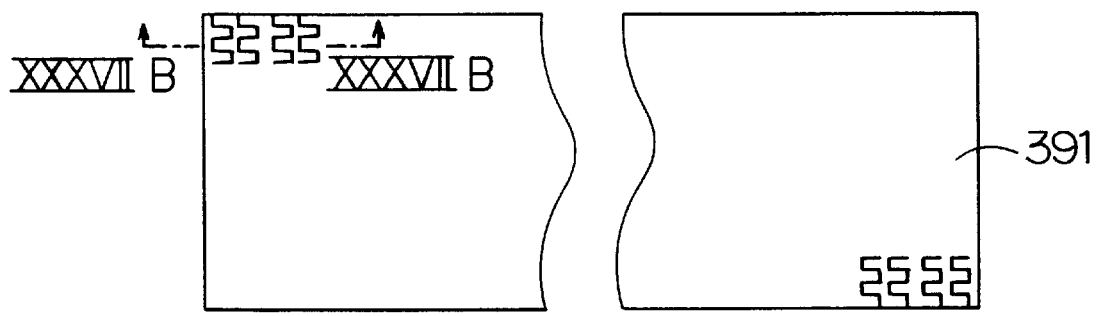
FIG. 37A is a plan view of a third inner fin.
Figure 37B:
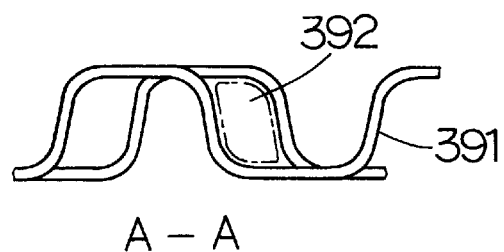
FIG. 37B is a fragmentary cross sectional view taken along line XXXVIIB—XXXVIIB of FIG. 37A.
Figure 37C:
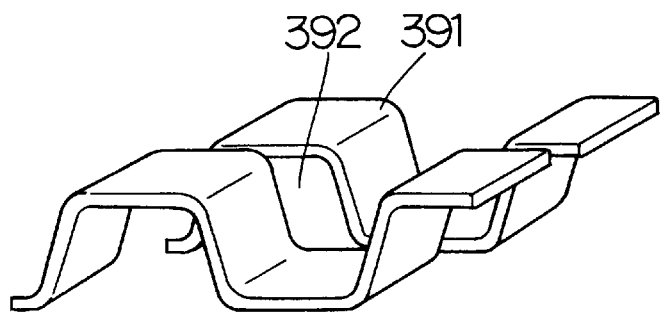
FIG. 37C is a fragmentary perspective view of the inner fin of FIG. 37B.

Further, as shown in FIGS. 37A, 37B and 37C, the inner fin 391 may be structured by two wavy members, which are shifted from one another, and the slit 392 may be formed between the shifted two wavy members.

Eighth Embodiment

In this embodiment also, radiating tubes 39 constructing a radiator 4 are disposed while being inclined to return condensed liquid refrigerant which has been liquefied in the radiator 4 to a refrigerant tank 3 smoothly.

The radiating tube 39 has a hollow structure formed by joining peripheral edge portions of two pressed plates 40 of, for example, aluminum shown in FIGS. 42A, 42B. Here, FIG. 42A is a side view of the pressed plate 40, and FIG. 42B is a front view thereof. The small diameter openings 41 formed at both ends of the radiating tube 39 construct the inflow communicating portion 44 and the outflow communicating portion 45 respectively. Both inflow and outflow communicating portions 44, 45 have large-diameter (r1) portions and small-diameter (r2) openings 41. The inflow communicating portions 44 and the outflow communicating portions 45 communicate respectively through the small-diameter openings 41. The radiating tube 39 forms therein a flat refrigerant passage 42 between both communicating portions 44, 45.

As shown in FIG. 33, the wavy inner fins 391 are inserted in the refrigerant passages 42.

Figure 39:
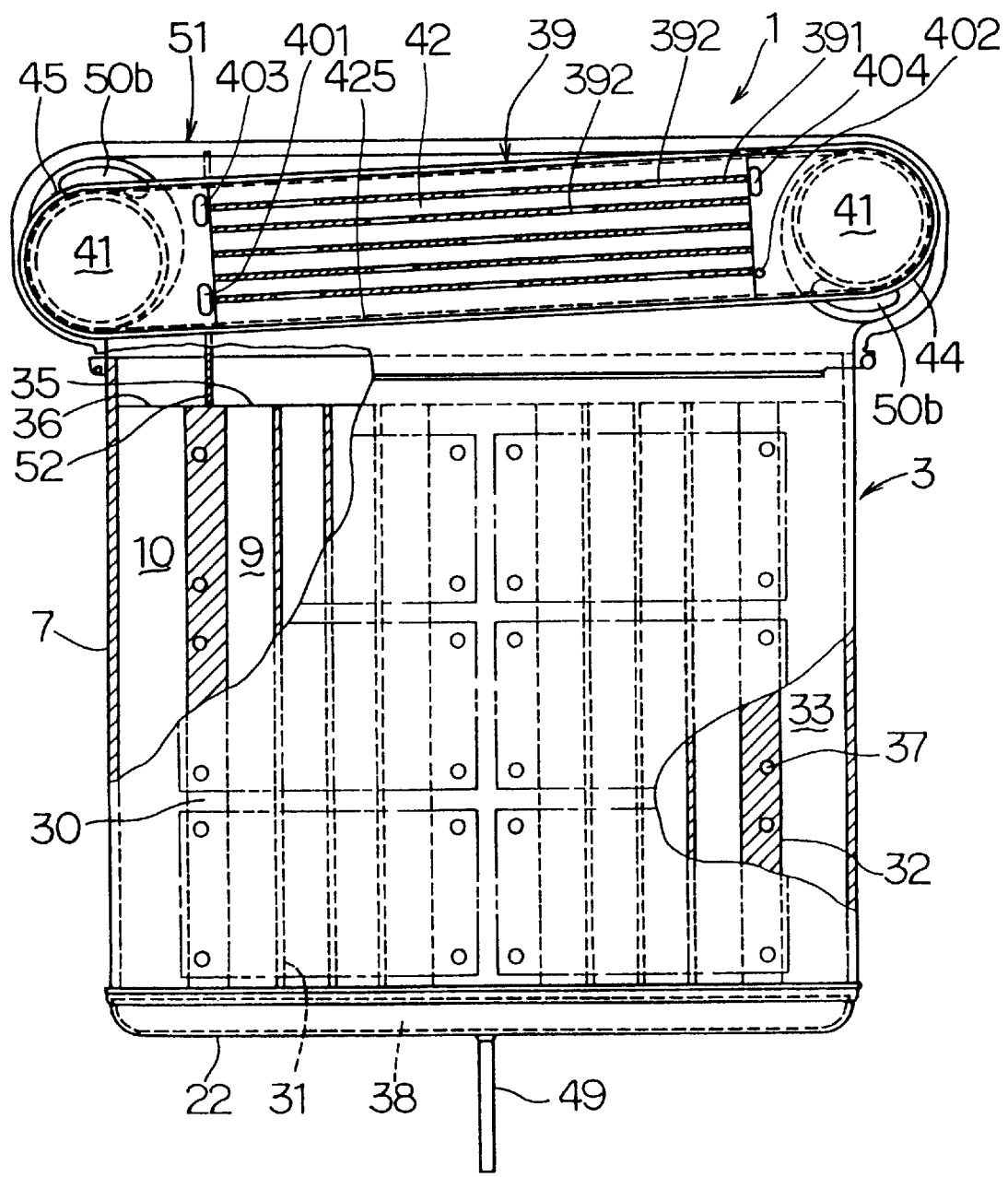
FIG. 39 is a cross sectional view taken along line 39—39 in FIG. 38.
Figure 40:
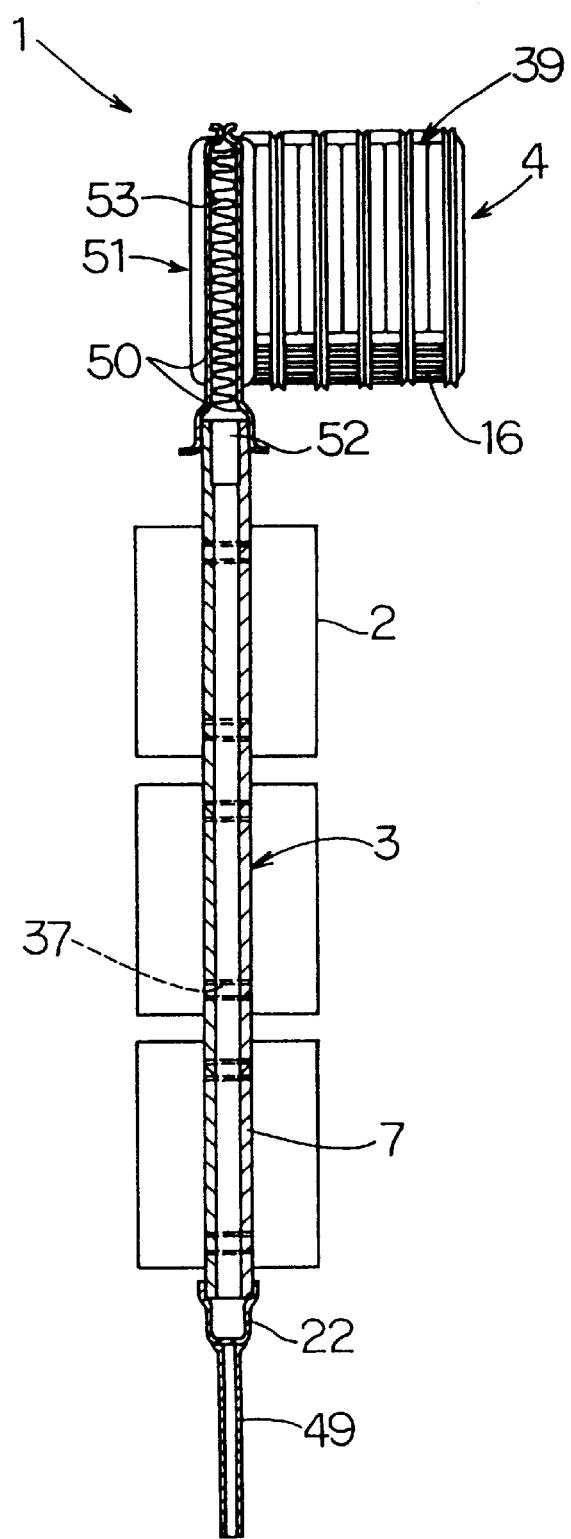
FIG. 40 is a cross sectional view taken along line 40—40 in FIG. 38.

As shown in FIGS. 39, 42A and 42B, the inner fin 391 is positioned and fixed by projections 401, 402, 403, 404 formed as ribs on the pressed plate 40. The inner fin 391 is sandwiched between two pressed plates 40 facing to each other when the pressed plates 40 are joined. The strength of the pressed plate 40 is enhanced because the projections 401, 402, 403, 404 are formed as the ribs on the pressed plate 40.

Figure 43A:
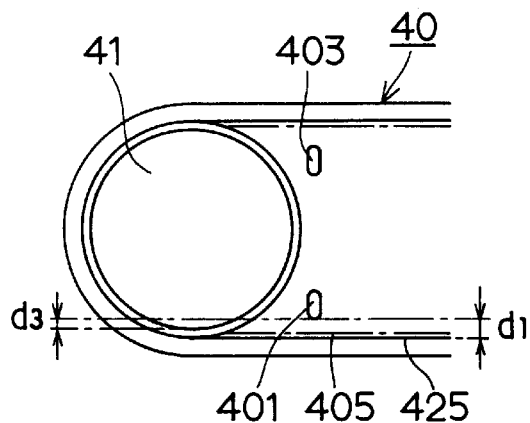
FIG. 43A and 43B are enlarged views of formed plates for forming a radiating tube.

The projection 401 arranged at the side of the outflow communicating portion 45, as shown in FIG. 43A, is formed to be distant from the bottom surface 425 of the refrigerant passage 42 by a predetermined distance d1. That is, the projection 401 provides a fluid passage 405 formed by a predetermined gap d1. Here, it is preferable that the lower end of the projection 401 is disposed upper than the lower end of the small-diameter opening 41 in the outflow communicating portion 45 by a predetermined distance d3 (>0). However, when the fluid passage 405 is provided sufficiently (d3 is sufficiently large), it is preferable that d3 is set to be larger than d1 to prevent the refrigerant from being stored between the lower end of the small-diameter opening 41 and the bottom surface 425 of the refrigerant passage 42.

Figure 43B:
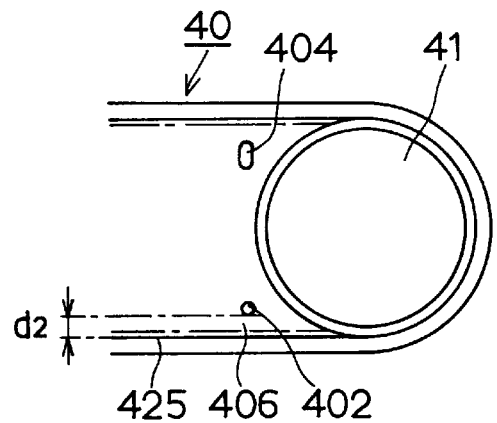

The projection 402 arranged at the side of the inflow communicating portion 44, as shown in FIG. 43B, is also formed to be distant from the bottom surface 425 of the refrigerant passage 42 by a predetermined distance d2. That is, the 5 projection 402 provides a fluid passage 406 formed by a predetermined gap d2.

Figure 44:
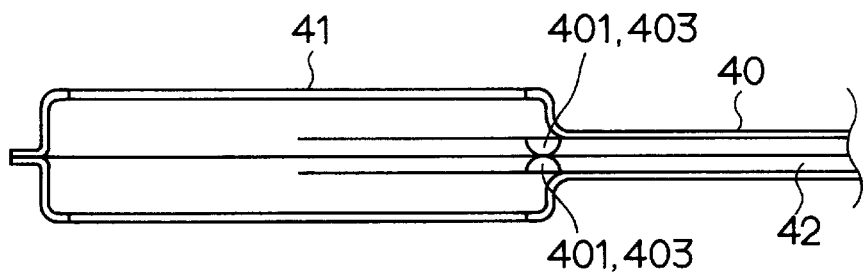
FIG. 44 is a cross sectional view of the radiating tube.

The projections 401–404 of the coupled pressed plates 40 are made to contact each other as shown in FIG. 44.

An operation of the eighth embodiment will be described hereinafter.

Figure 38:
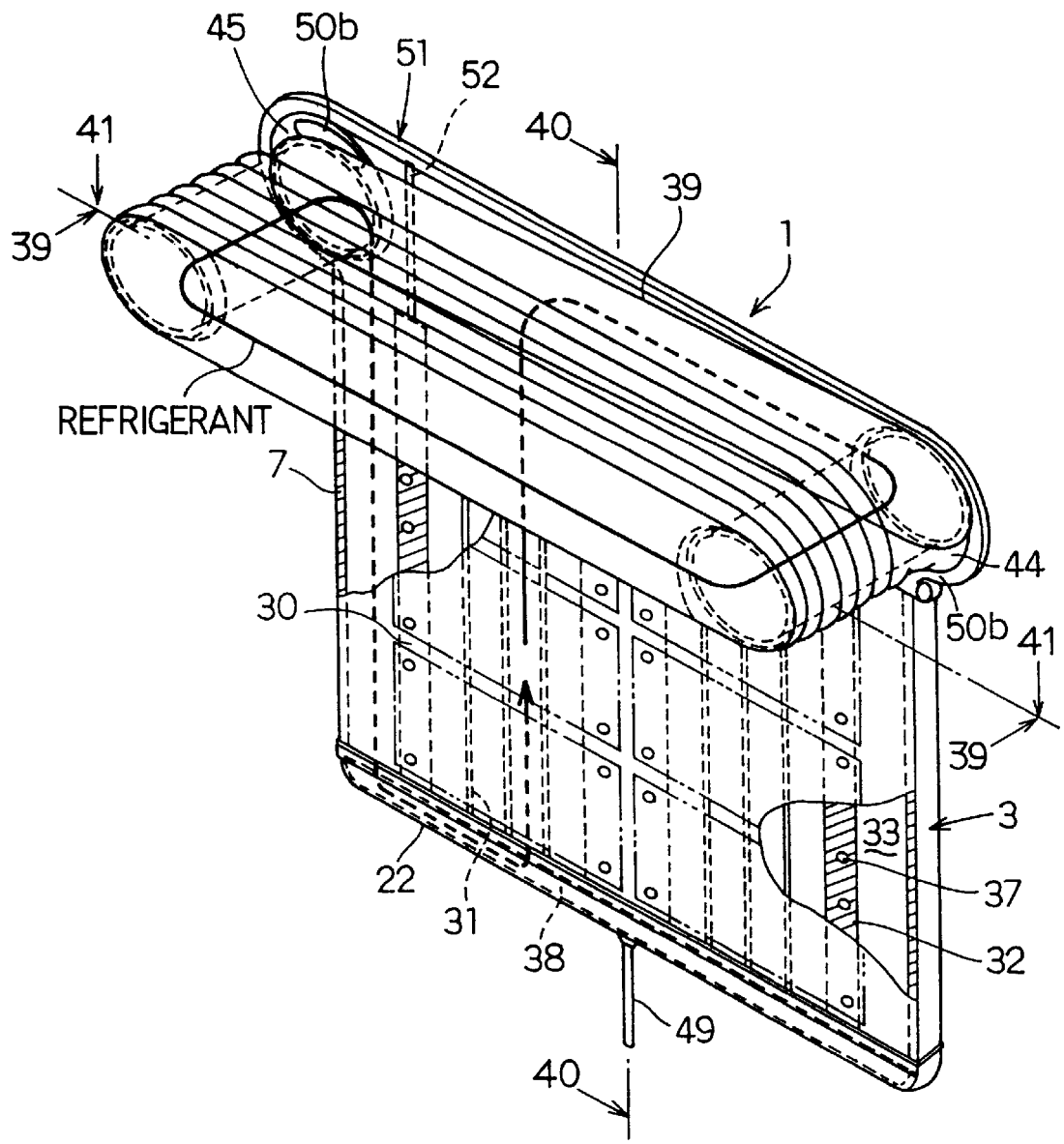
FIG. 38 is a perspective view of a cooling apparatus according to an eighth embodiment of the present invention.

As shown in FIG. 38, the refrigerant boiled by heat generated by and transferred from IGBT modules 2 ascends as bubbles through the vapor passages 9, flows through the refrigerant tank outlet 35 of the refrigerant tank 3 into the inflow chamber of the connecting pipe 51, and is distributed through the inflow communicating portions 44 of the radiating tubes 39 to the refrigerant passages 42 of the radiating tubes 39. Here, the flow of the refrigerant is indicated simply by a single line in FIG. 38. As the vaporized refrigerant flows through the refrigerant passages 42, the vaporized refrigerant condenses on the inner surfaces of the refrigerant passages 42 and the surfaces of the inner fins 391, which are cooled by air blown by the cooling fan 5 to be at a low temperature, and radiates latent heat of condensation to be droplets. When the condensed and liquefied refrigerant flows in each refrigerant passage along the surfaces of the inner fin 391 toward the outflow communicating portion 45, the liquid refrigerant drops through slits 392 on the way to the outflow communicating portion 45, to the lower inner fin 391. In this embodiment, there are formed a plurality of slits 392, the refrigerant becomes droplets in turn and reaches the bottom surface of each refrigerant passage 42. In other words, the refrigerant condensed and liquefied in each of the small passages of the gas-phase refrigerant passage 393 in the refrigerant passage 42 flows down through the slits 392 to the lower small passage, and further to the condensed liquid passage 394. Finally, the refrigerant flows into the outflow communicating portions 45 of each radiating tube 39 while flowing on the bottom surface 425 of the refrigerant passage 42 and through below the projection 401.

Figure 41:
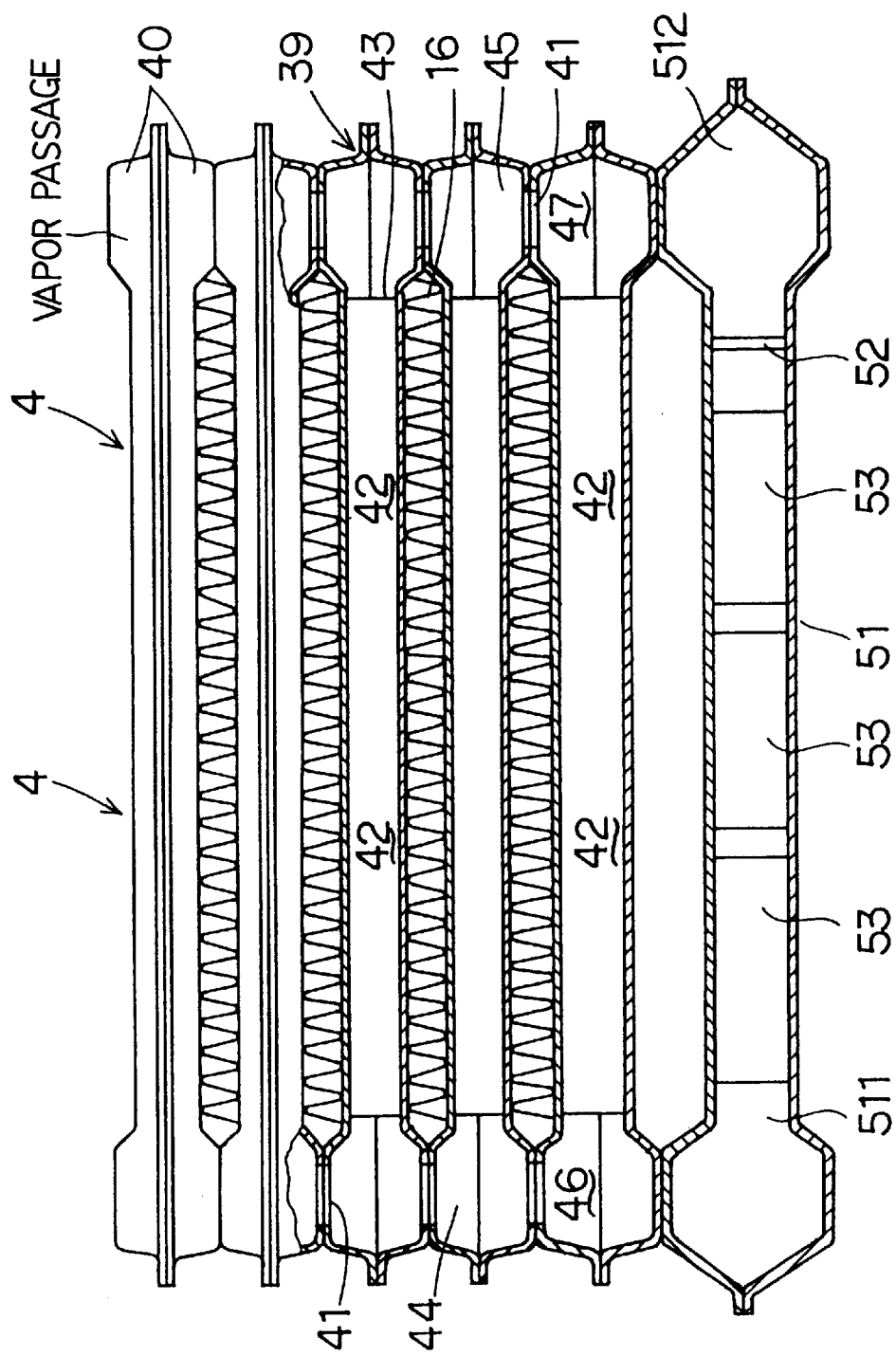
FIG. 41 is a cross sectional view taken along line 41—41 in FIG. 38.

Further, the liquid phase refrigerant blown up and introduced into the inflow communicating chamber 44 of the radiator 4 directly from the refrigerant tank 3 collide with the small-diameter opening 41 shown in FIG. 41 and is stored in one communicating chamber 46. The refrigerant flows on the bottom surface 425 below the projection 402 from the communicating chamber 46, and flows below the projection 401 to the other communicating chamber 47 forming the outflow communicating portion.

Then, the condensed liquid refrigerant flows from the outflow communicating portions 45 into the outflow chamber 512 of the connecting pipe 51, flows further through the refrigerant tank inlet 36 of the refrigerant tank 3 into the condensed liquid passage 10, flows down through the condensed liquid passage 10, and is returned through the communicating passage 38 formed in the end cap 22 to each of the vapor passages 9.

According to the eighth embodiment, the following effects can be obtained.

Since the predetermined gap d1 is provided between the projection 401 and the bottom surface 425, the refrigerant condensed and liquefied in the refrigerant passage 42 can reach the outflow communicating chamber 45 while flowing through the fluid passages 405, 406 without getting over the projection. Further, since the predetermined gap d2 is provided between the projection 402 and the bottom surface 425, the liquid phase refrigerant around the inflow communicating chamber (the refrigerant blown up and introduced directly from the refrigerant tank 3) can reach the outflow communicating chamber 45 while flowing through the fluid passages 406 without getting over the projection.

Accordingly, as the refrigerant is suppressed from being stored in the refrigerant passage, the refrigerant amount used in the refrigerant circuit can be prevented from being reduced, and the radiating area in the refrigerant passage can be prevented from being reduced thereby improving the radiating performance.

According to the eighth embodiment, the projections 401, 402 of the coupled pressed plates 40 are formed in such a manner that they contact each other when the coupled plates 40 are joined, thus the strength of the refrigerant passage is enhanced.

Since the projection 401 is formed at a position being upper than the lower end of the small-diameter opening 41, the liquid phase refrigerant can flow into the small-diameter opening 41 in the outflow communicating portion 45 before the liquid surface of the liquid phase refrigerant is clog up by the lower end of the projection 401. As a result, the speed of the refrigerant flowing into the small-diameter opening 41 can be increased in the refrigerant passage 42. Thus, the radiating area is prevented from being reduced thereby improving the radiating performance.

Here, in the above explanation, the inner fin 391 has a plurality of slits 392 as the seventh embodiment for allowing the liquid phase refrigerant to drop therethrough. However these slits are not necessary in the present eighth embodiment.

Ninth Embodiment

Figure 45:
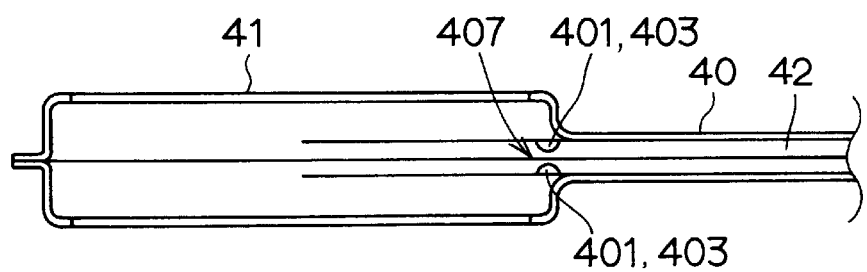
FIG. 45 is a cross sectional view of the radiating tube according to a ninth embodiment of the present invention.

In the ninth embodiment, as shown in FIG. 45, the projections 401–404 of the coupled pressed plates 40 facing to each other do not contact. In this case, a gap between each projection forms a fluid passage 407.

Here, the projections 401–404 are not needed to be formed on both pressed plates 40 facing to each other, and may only be formed on one of the pressed plates 40. That is, the projections 401–404 may also be provided so that the fluid passages 407 are formed as gaps between the opposing projection or the inside surface of the pressed plate 40 and themselves.

According to the above described structure, the refrigerant condensed and liquefied in the refrigerant passage 42 can reach the outflow communicating chamber 45 without getting over the projection 401. Further, the liquid phase refrigerant blown up and introduced directly from the refrigerant tank 3 can reach the outflow communicating chamber 45 without getting over the projection 402. Accordingly, as the refrigerant is suppressed from being stored in the refrigerant passage, the refrigerant amount used in the refrigerant circuit can be prevented from being reduced, and the radiating area in the refrigerant passage can be prevented from being reduced thereby improving the radiating performance.

Figure 46:
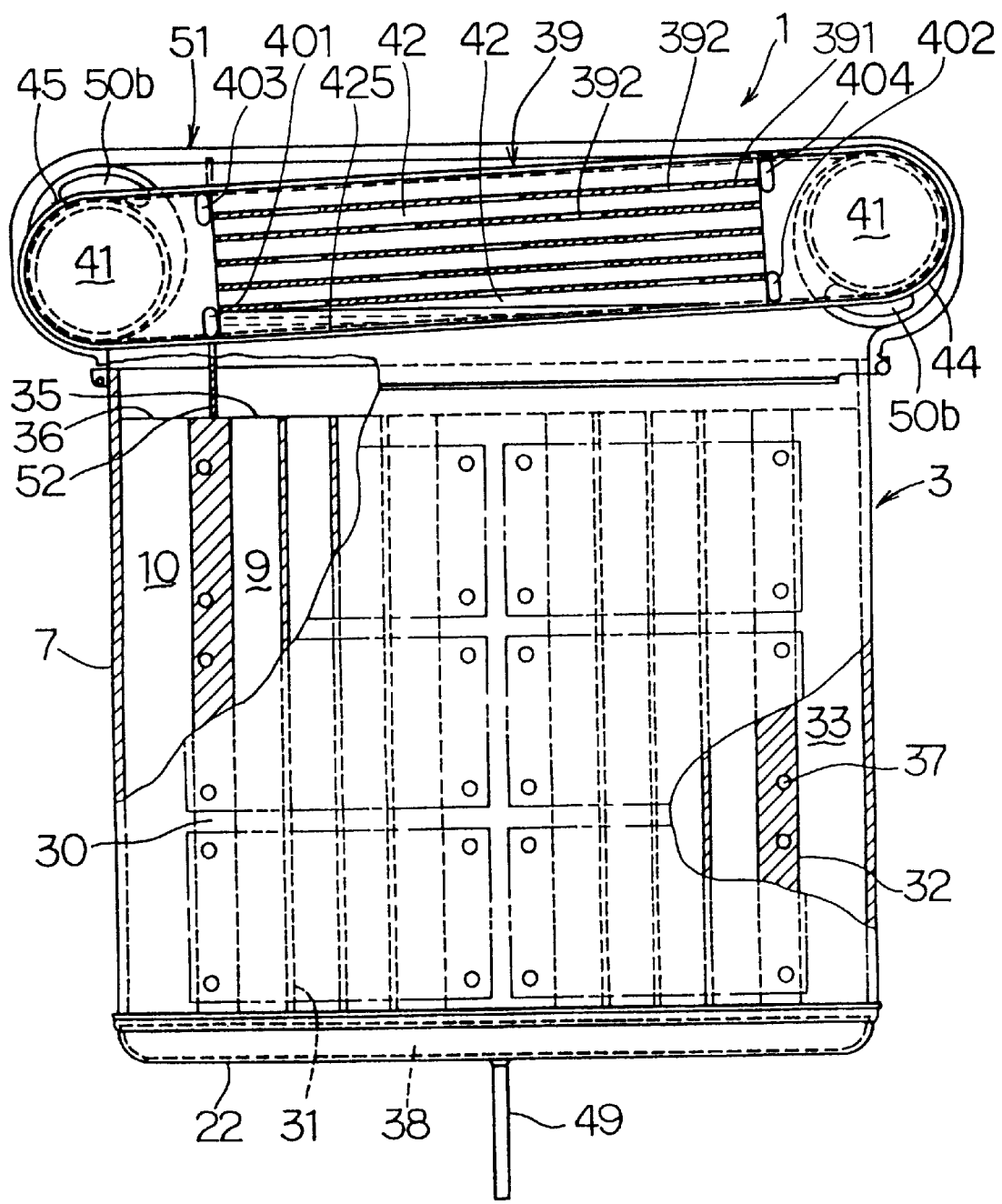
FIG. 46 is a cross sectional view of a cooling apparatus according to a modification.

Here, in the ninth embodiment, the projections 401–404 are not needed to separate from the bottom surface 425 of the refrigerant passage 42 as described in the eighth embodiment, and they are allowed to contact the bottom surface 425 as shown in FIG. 46.

Each projection 401–404 of the coupled plates facing to each other may be disposed at each position the distance from the bottom surface 425 of which are different from each other. The gaps formed by shifting these positions provide the fluid passages 405, 406, 407, and the refrigerant flows through these fluid passages and flows out to the outflow communicating portion 45.

In the above described eighth and ninth embodiments, the projections are formed as ribs protruded from the inside surface of the pressed plate 40. Alternately, the projections can be constructed by protrusion members (for example, of aluminum) formed independently of the pressed plate 40 and protruding to the inside surface of the pressed plate 40. Further, the number of projections is not limited to four, it can be attained that the tube has at least one projection at each side of the inflow communicating portion 44 and the outflow communicating portion 45.

The slits 392 are formed in the inner fin 391 at different positions from each other. However, the slits 392 may be formed substantially at the same positions as shown in FIG. 36. In this way, it is easy to form the slits 392.

Further, the inner fin 391 may be structured by two wavy members, which are shifted from one another, and the slit 392 may be formed between the shifted two wavy members.

Tenth Embodiment

Referring to FIGS. 47–56, a tenth embodiment will be described.

The cooling apparatus 1 according to the tenth embodiment includes a refrigerant tank 3 storing a liquid phase refrigerant inside thereof and a radiator 4 disposed above the refrigerant tank 3.

The refrigerant tank 3 includes a hollow extrusion member 7 formed by extruding an aluminum block, and end cap 22 attached to a lower open end of the extrusion member 7.

Figure 47:
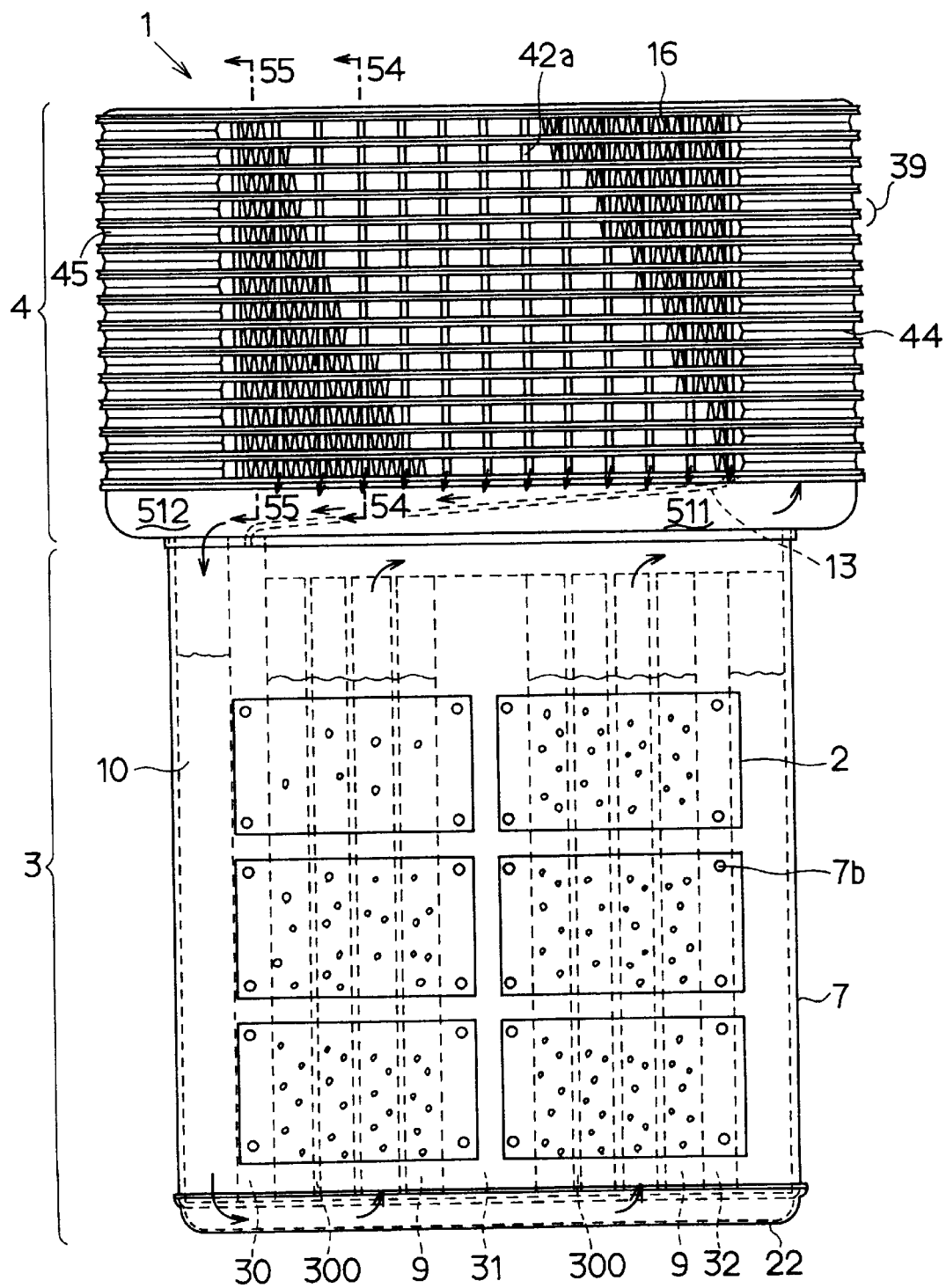
FIG. 47 is a front view of a cooling apparatus according to a tenth embodiment of the present invention.
Figure 48:
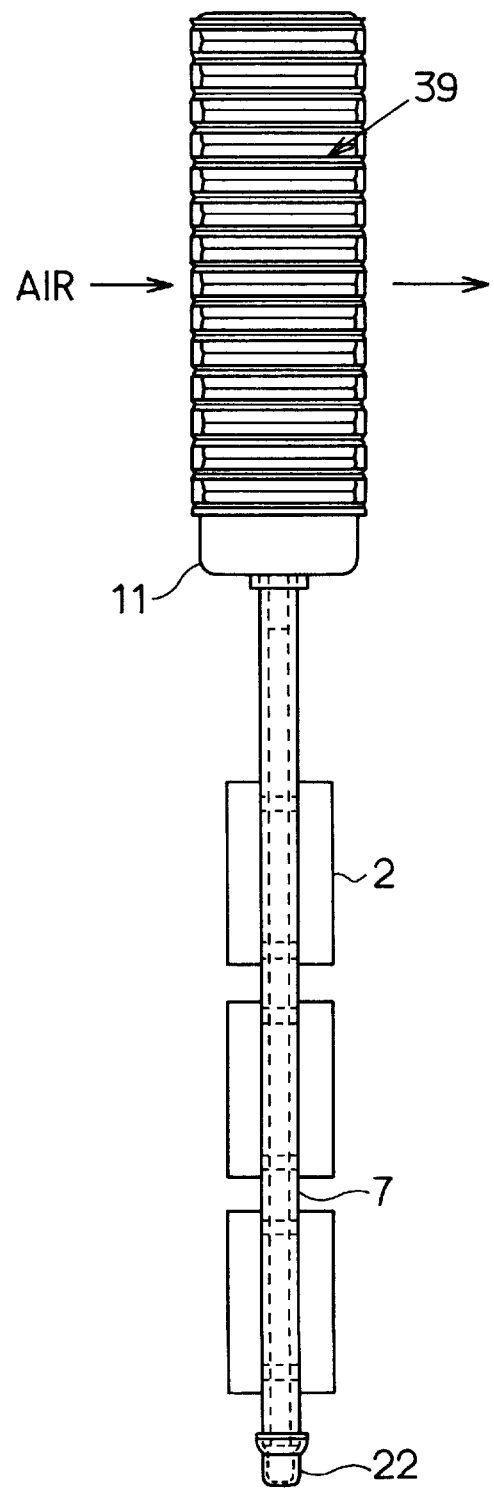
FIG. 48 is a side view of a cooling apparatus according to a tenth embodiment of the present invention.

As shown in FIGS. 47, 48, the extrusion member 7 has a flat shape of a thickness (dimension in the right and left direction in FIG. 48) being less than the width (dimension in the right and left direction in FIG. 47) of the wall thereof. An interior of the extrusion member 7 is partitioned by partition walls 30, 31, 32, 300 extending vertically with vapor passages 9, and a condensed liquid passage 10, which pass through the extrusion member 7 longitudinally.

The partition walls 30, 31, 32, 300 include a thick wall 31 disposed at the substantially center portion in the left and right direction, a medium walls 30, 32 disposed at both left and right sides, and a plurality of thin walls 300 disposed between the thick wall 31 and the medium walls 30, 32. The upper end of the thick wall 31, the medium wall 32 and the thin walls 300 are cut away shortly. In the thick wall 31 and medium walls 30, 32, plural holes 7*b* are formed for receiving bolts (not illustrated) to connect the heat emitter 2 to the extrusion member 7. These holes 7*b* are formed such that they penetrate the extrusion member 7 in the width direction thereof.

The vapor passages 9 are partitioned by the thin walls 300 between the thick wall 31 and medium walls 30, 32. The condensed liquid passages 10 is formed outside of both medium walls 30, 32.

The end cap 22 is formed by press-forming and is joined to the lower end of the extrusion member 7. The end cap 22 has a predetermined space inside thereof so that a lower communicating passage communicating the vapor passages 9 and the condensed liquid passage 10 with each other is formed.

The heat emitter 2 is, for example, an IGBT module, which constitute an inverter circuit included in an electric vehicle, a general electric controller or the like. The heat emitter 2 is fixed to the outer surface of a wall of the refrigerant tank 3 with bolts and nuts.

As a refrigerant, for example, water, alcohol, ammonia, fluorocarbon or the like is used, and the refrigerant is injected into the refrigerant tank 3 through an injection pipe (not illustrated).

The radiator 4 includes a lower tank connected to the upper end of the refrigerant tank 3 (extrusion member 7), a plurality of radiating tubes 39 laminated on the lower tank, and a plurality of radiating fins 16 disposed between the adjacent radiating tubes 39.

Figure 49A:
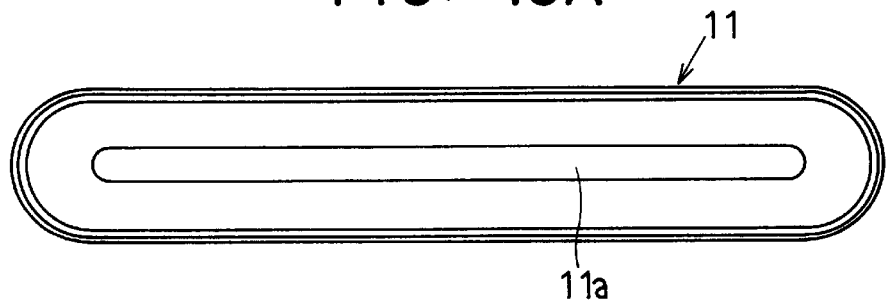
FIGS. 49A and 49B are a plan view and a side view, respectively, of tank plate for forming a lower tank.
Figure 49B:
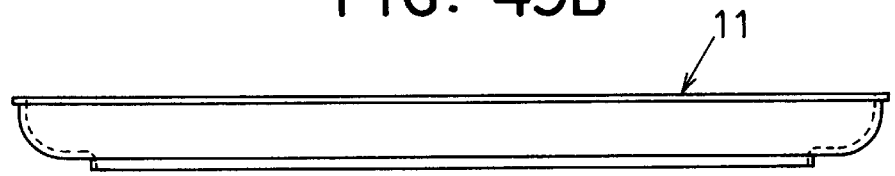
Figure 50A:
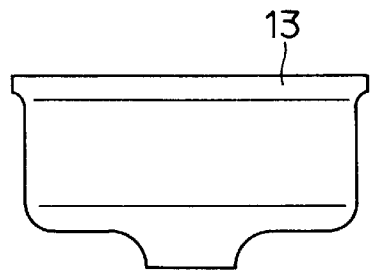
FIGS. 50A and 50B are a side view and a front view, respectively, of a refrigerant flow control plate.
Figure 50B:
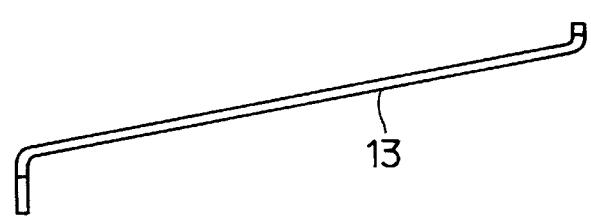

The lower tank includes a tank plate 11 and a core plate 40. The tank plate 11 is press-formed into a long cup shape as shown in FIGS. 49A, 49B, and has a long hole for receiving the upper end portion of the extrusion member 7 at the center thereof. The core plate 40 is press-formed into the same shape as a pressed plate 40 (see FIGS. 52A, 52B) forming a radiating tube 39 and covers the opening of the tank plate 11.

A refrigerant flow control plate 13 (described herein after) is provided inside the lower tank for partitioning the inside of the lower tank into an inflow chamber 511 and an outflow chamber 512.

Figure 51:
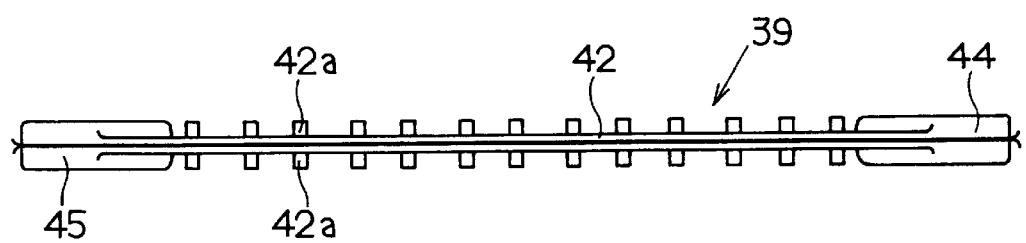
FIG. 51 is a side view of a radiating tube according to the tenth embodiment of the present invention.

The radiating tube 39 is, as shown in FIG. 51, formed by joining coupled pressed plates 40 and has communicating portions 44, 45 which communicate with other radiating tubes 39 at both ends thereof in the longitudinal direction (upper and lower direction in FIG. 51). The radiating tube 39 forms a refrigerant passage 42 between both communicating portions 44, 45. The refrigerant passage 42 has a plurality of communicating openings 42a to communicate with the refrigerant passages 42 of the other radiating tubes 39.

Figure 52A:
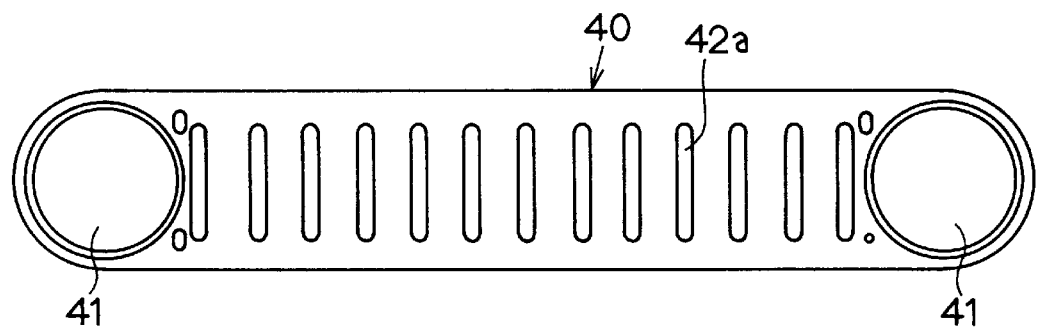
FIGS. 52A and 52B are a plan view and a side view, respectively, of a pressed plate according to the tenth embodiment of the present invention.
Figure 52B:
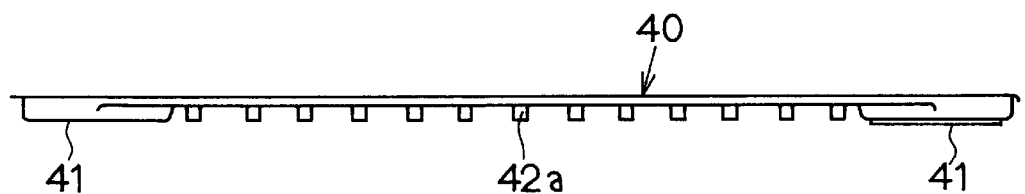

The pressed plate 40 has, as shown in FIG. 52A, small-diameter openings 41 for forming the inflow communicating portion 44 and the outflow communicating portion 45 at both ends in the longitudinal direction thereof. The communicating openings 42a of oval shape are provided with a constant pitch between both small-diameter openings 41. The outer peripheries of the small-diameter openings 41 and the communicating openings 42a are protruded toward the one side (lower side in FIG. 52B) thereof by a predetermined amount.

Figure 53:
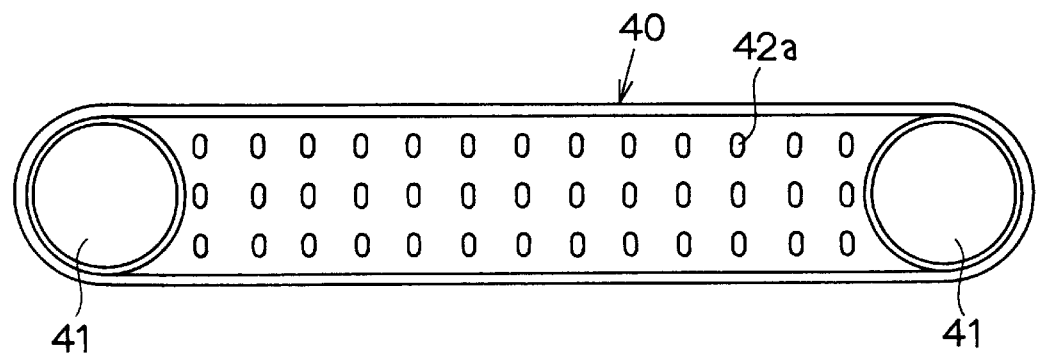
FIG. 53 is a plan view of a pressed plate according to a modification of the tenth embodiment of the present invention.

Here, the communicating openings 42a formed in the pressed plate 40, as shown in FIG. 53, may be separated in the width direction (right and left direction in FIG. 53) of the pressed plate 40.

The plurality of radiating tubes 39 are laminated in the thickness direction thereof and disposed on the lower tank.

The laminated plural radiating tubes 39 are communicated with each other through the communicating portions 44, 45 and the communicating openings 42a thereof facing to each other respectively. The lowest radiating tube 39 and the lower tank are communicated with each other through the small-diameter openings 41 and the communicating openings 42a thereof facing to each other respectively. In the upper pressed plate 40 of the uppermost radiating tube 39, the small-diameter openings 41 and the communicating openings 42a are not formed.

Figure 54:
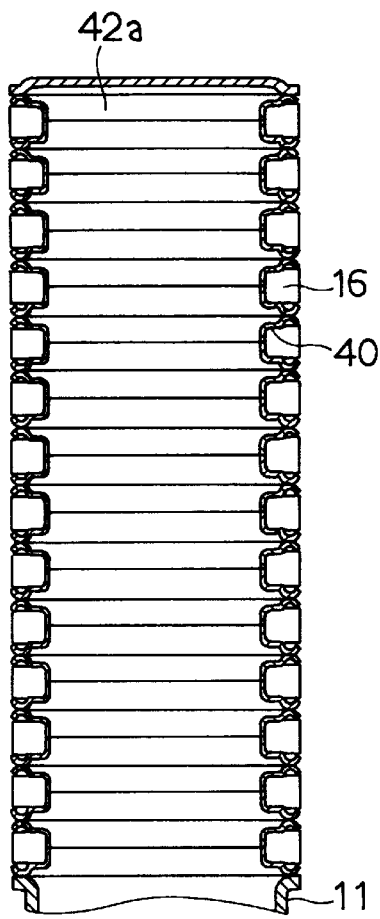
FIG. 54 is a cross sectional view taken along line 54—54 in FIG. 47.
Figure 55:
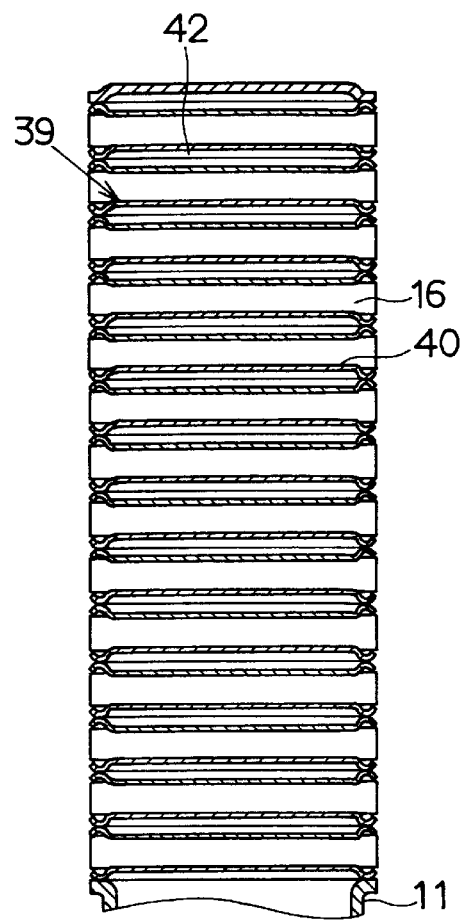
FIG. 55 is a cross sectional view taken along line 55—55 in FIG. 47.

An inflow communicating space is formed by communicating the inflow communicating portions 44 of each radiating tube 39 with each other, and an outflow communicating space is formed by communicating the outflow communicating portions 45 with each other. As shown in FIG. 54, communicating passages are formed by communicating the communicating openings 42a of each radiating tube 39 with each other in the laminating direction thereof. That is, in the tenth embodiment, a plurality of communicating passages are formed between the inflow communicating space and the outflow communicating space.

The refrigerant flow control plate 13 is, as shown in FIG. 47, disposed in the lower tank while being inclined with respect to the horizontal direction. The lower end of the refrigerant flow control plate 13 is connected to upper end of the medium wall 30, while the upper end thereof is connected to the position between the small-diameter opening 41 of the lower tank which communicates with the inflow communicating space and the communicating opening 42a being most adjacent to the inflow communicating space.

Next, an operation of the tenth embodiment will be described.

The refrigerant is boiled by heat generated by and transferred from the heat emitter 2 at a refrigerant area in the refrigerant tank 3. Here, the refrigerant area is defined as an area where the refrigerant boils by receiving the heat from the heat emitter 2.

The boiled refrigerant ascends as bubbles through the vapor passages 9, flows through the inflow chamber 511 into the inflow communicating portions 44. At this time, the vaporized refrigerant flowing in the lower tank 13 is led to the inflow communicating portion 44 while being restricted by the refrigerant flow controlling plate 13. As the vaporized refrigerant flows through the inflow communicating portions 44 and into the refrigerant passages 42, the vaporized refrigerant condenses on the inner surfaces of the refrigerant passages 42 to be droplets. When the condensed and liquefied refrigerant flows in each refrigerant passage 42 toward the outflow communicating portion 45, a part of the liquid refrigerant drops through the communicating passages 42a to the lower tank and flows along the refrigerant flow controlling plate 13 into the condensed liquid passage 10 in the refrigerant tank 3. The rest of condensed liquid flows into the outflow communicating portion 45 while being pushed by the vaporized refrigerant flowing in the refrigerant passage 42. This condensed liquid flows through the outflow chamber 512 in the lower tank and drops into the condensed liquid passage 10 in the refrigerant tank 3.

The condensed liquid introduced into the condensed liquid passage 10 is supplied to the boiling area (vapor passage 9) in the refrigerant tank 3 through the communicating passage formed inside the end cap 22.

The heat transferred from the heat emitter 2 to the refrigerant is radiated as the latent heat of condensation when the vaporized refrigerant condenses in the radiator 4 and is emitted to the atmosphere through the radiating fin 16.

Next, an operation of the cooling apparatus 1 when the entire apparatus is inclined in the direction by which the condensed liquid flows in reverse in the refrigerant passage 42 will be described with referring to FIG. 56.

Figure 56:
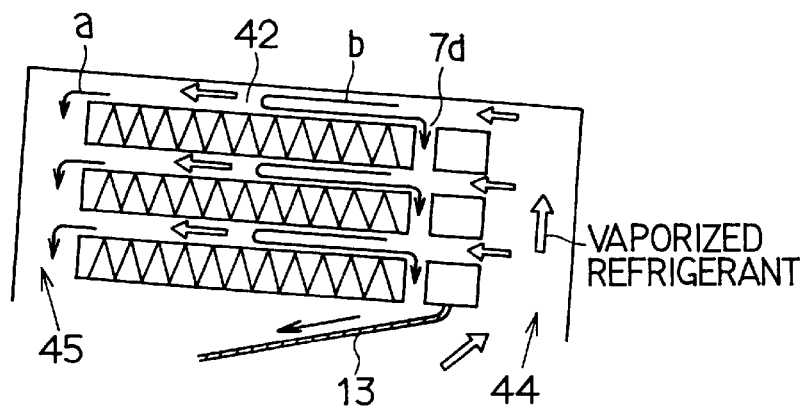
FIG. 56 is a schematic view of the cooling apparatus to explain an operation of the tenth embodiment.

A part of the refrigerant condensed and liquefied in the refrigerant passage 42 flows into the outflow communicating portion 45 while being pushed by the vaporized refrigerant flowing in the refrigerant passage 42 as denoted by the arrow 'a' in FIG. 56. This condensed liquid drop into the condensed liquid passage 10 through the outflow chamber 512 in the lower tank. However, the rest of condensed liquid flows in reverse in the refrigerant passage 42 by gravitational force as denoted by the arrow 'b' in FIG. 56 (the condensed liquid flows from the left side to the right side in the refrigerant passage 42 in FIG. 56). The condensed liquid having flown in reverse drops through the communicating opening 42a, i.e., communicating passage, on the refrigerant flow control plate 13 in the lower tank. After that, this condensed liquid flows down on the surface of the refrigerant flow control plate 13 into the condensed liquid passage 10 in the refrigerant tank 3.

According to the tenth embodiment, even when the cooling apparatus 1 is inclined in the direction where the condensed liquid flows in reverse in the refrigerant passage 42, the condensed liquid having flown in reverse does not flow into the inflow communicating portion 44, and drops on the refrigerant flow control plate 13 through the communicating passage. After that, the condensed liquid flows on the surface of the refrigerant control plate 13 and returns into the condensed liquid passage 10 in the refrigerant tank 3. Therefore, the refrigerant having flown in reverse does not interfere with the vaporized refrigerant flowing into the inflow communicating portion 44, and returns into the condensed liquid passage 10. Accordingly, a burn-out occurring when the entire apparatus 1 is inclined and the condensed liquid cannot return to the condensed liquid passage 10 is prevented thereby attaining a sufficient radiating performance.

Further, according to the tenth embodiment, the height and the width of the apparatus are not enlarged, thus the size thereof is prevented from being enlarged.

Eleventh Embodiment

Figure 57:
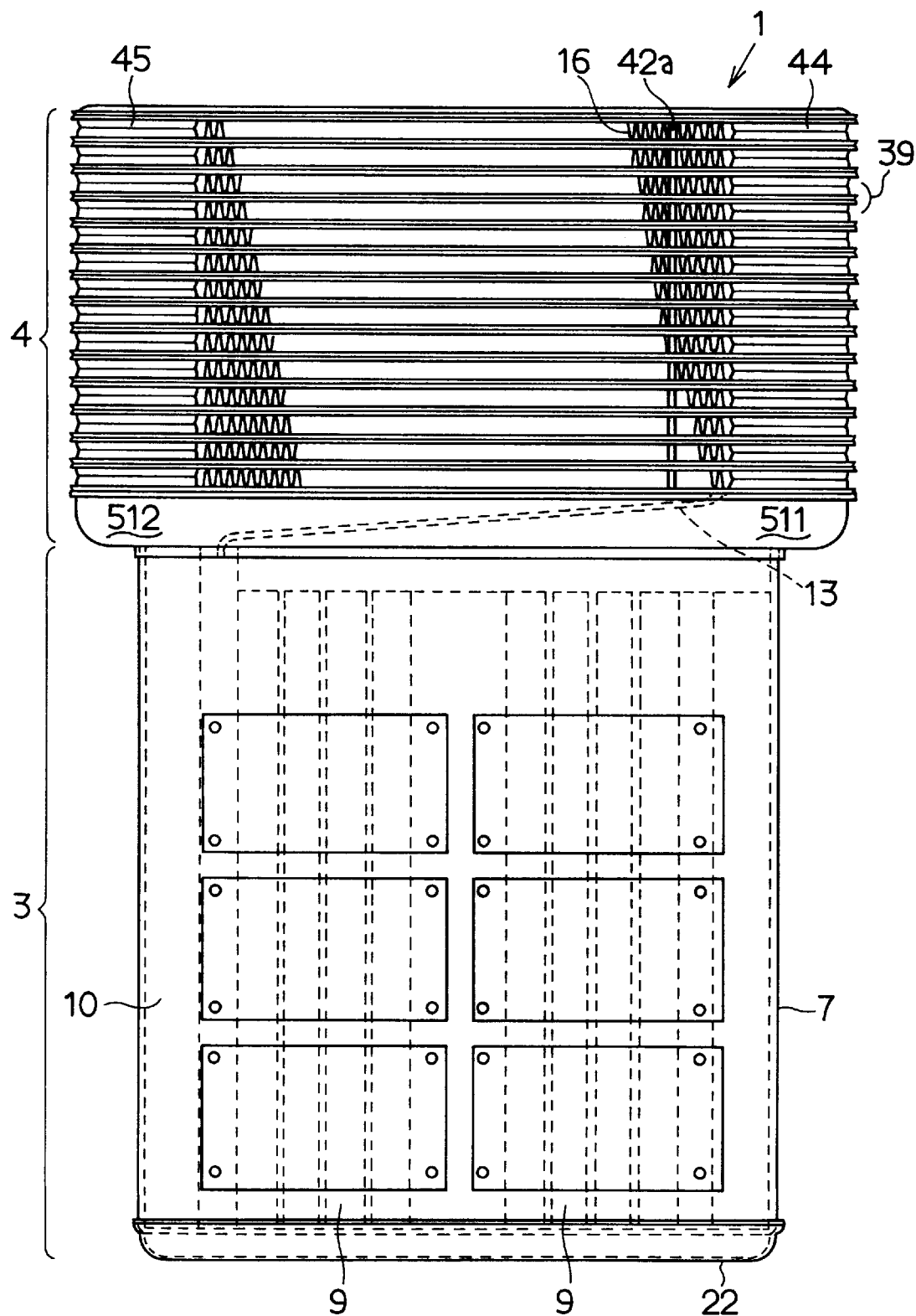
FIG. 57 is a front view of a cooling apparatus according to an eleventh embodiment of the present invention.
Figure 58A:
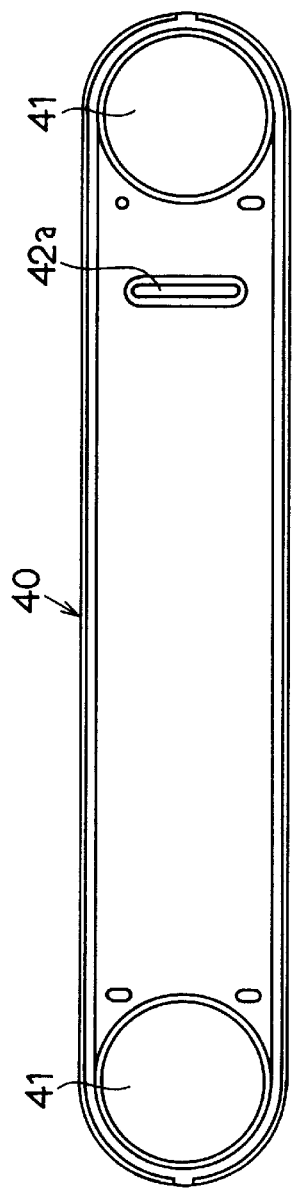
FIGS. 58A and 58B are a plan view and a side view, respectively, of a pressed plate according to the eleventh embodiment of the present invention.
Figure 58B:
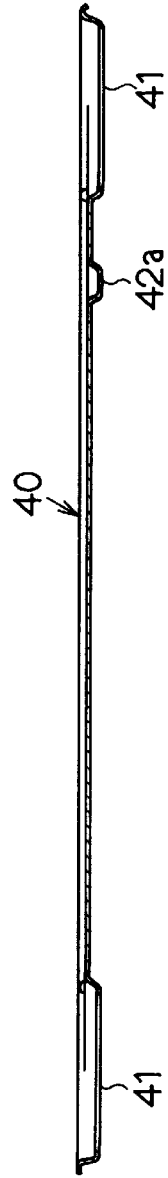
Figure 60A:
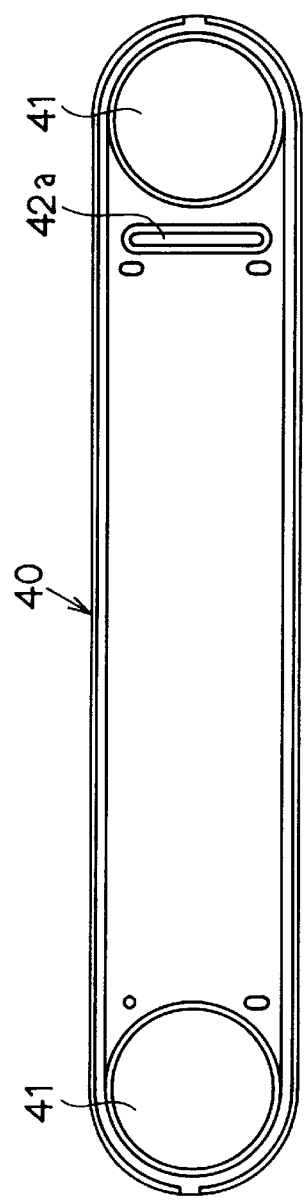
FIGS. 60A and 60B are a plan view and a side view, respectively, of a pressed plate according to the twelfth embodiment of the present invention.
Figure 60B:
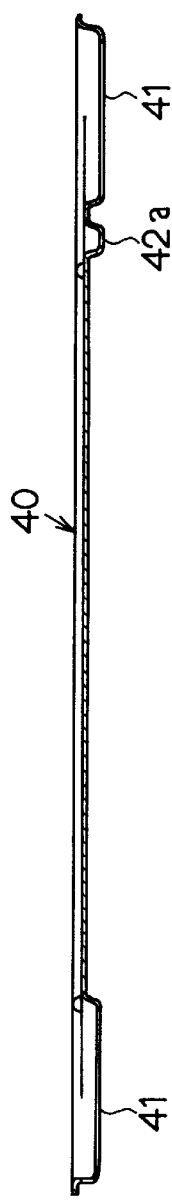

According to the eleventh embodiment, as shown in FIG. 57, only one communicating passage is provided near the inflow communicating portion 44. That is, in the pressed plate 40 forming the radiating tube 39, as shown in FIGS. 58A, 58B, only one communicating opening 42a of the oval shape is provided near the one small-diameter opening 41. According to the present embodiment, the large radiating area of the radiating fin 16 can be attained thereby improving the radiating performance.

Twelfth Embodiment

Figure 59:
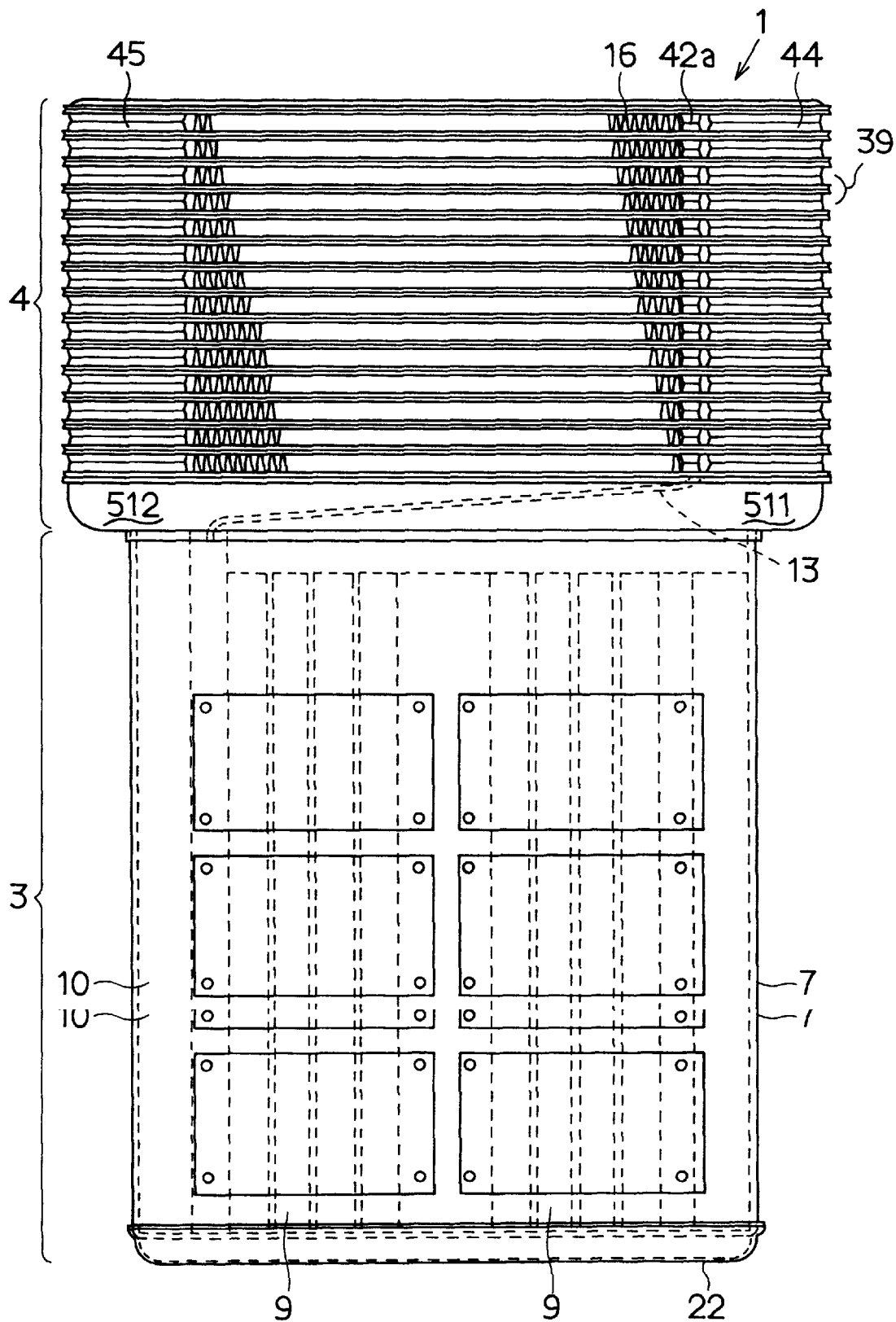
FIG. 59 is a front view of a cooling apparatus according to a twelfth embodiment of the present invention.

According to the twelfth embodiment, as shown in FIG. 59, the communicating passage is provided near the inflow communicating portion 44 more than that in the eleventh embodiment. That is, only one communicating opening 42a of the oval shape is provided just near the small-diameter opening 41. An operation of the twelfth embodiment is the same as in the eleventh embodiment.

In the above-described tenth through twelfth embodiments, it is preferable that the passage area in cross section of the communicating passage is smaller than that of the refrigerant passage 42. In this case, the vaporized refrigerant introduced from the inflow communicating portion 44 into the refrigerant passage 42 tends to flow in the refrigerant passage 42 rather than in the communicating passage thereby suppressing the vaporized refrigerant from flowing through the communicating passage to the outflow chamber 512. However, the passage areas of all the communicating openings 42a forming the communicating passages are not needed to be smaller than that of the refrigerant passage 42. That is, it is sufficient that the passage area of at least the communicating openings 42a facing the outflow chamber 512 (the communicating openings 42a of the lowest refrigerant passage 42) is smaller than that of the refrigerant passage 42.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined in the appended claims.

What is claimed is:

1. A cooling apparatus for a cooling high-temperature medium by boiling and condensing refrigerant, said cooling apparatus comprising:

a refrigerant tank for containing liquid refrigerant which is partially boiled and vaporized into gaseous refrigerant by heat transferred from said high-temperature medium, and for sending out gas-liquid mixed refrigerant of the gaseous refrigerant and the liquid refrigerant; and a radiator communicating with said refrigerant tank to receive the gas-liquid mixed refrigerant from said refrigerant tank, for transferring heat of the gas-liquid mixed refrigerant to a low-temperature medium to condense the gaseous refrigerant and for returning the liquid refrigerant and the condensed liquid refrigerant to said refrigerant tank, said radiator including;

a radiating passage arranged substantially horizontally or with inclination against a horizontal and defining a bottom surface, for condensing the gaseous refrigerant;

an inner fin disposed in said radiating passage for improving a radiating performance; and a projection provided in said radiating passage for positioning and fixing said inner fin, and disposed to be distant from the bottom surface of said radiating passage by a predetermined distance.

2. A cooling apparatus according to claim 1, wherein said radiating passage is formed by joining a pair of pressed plates facing to each other at their outer peripheries, said projection is formed as a rib protruding from an inside surface of said pressed plate and disposed at a position separated inwardly from said outer periphery by a predetermined distance, and said inner fin is sandwiched between said pair of pressed plates and fixed by said projection.

3. A cooling apparatus according to claim 2, wherein said ribs of said pair of pressed plates are formed to contact each other when said pair of pressed plates are joined.

4. A cooling apparatus according to claim 2, wherein said ribs of said pressed plates to be joined are formed such that they provide a gap therebetween when the pressed plates are joined.

5. A cooling apparatus according to claim 1, wherein said inner fin includes a plurality of slits for allowing the liquid refrigerant and the condensed liquid refrigerant to drop therethrough to a lower portion of said radiating passage.

6. A cooling apparatus for cooling a high-temperature medium by boiling and condensing refrigerant, said cooling apparatus comprising:

a refrigerant tank for containing liquid refrigerant which is partially boiled and vaporized into gaseous refrigerant by heat transferred from said high-temperature medium, and for sending out gas-liquid mixed refrigerant of the gaseous refrigerant and the liquid refrigerant; and a radiator communicating with said refrigerant tank to receive the gas-liquid mixed refrigerant from said refrigerant tank, for transferring heat of the gas-liquid mixed refrigerant to a low-temperature medium to condense the gaseous refrigerant and for returning the liquid refrigerant and the condensed liquid refrigerant to said refrigerant tank, said radiator including:

a radiating passage arranged substantially horizontally or with inclination against a horizontal and defining a bottom surface, for condensing the gaseous refrigerant; and an inner fin disposed in said radiating passage for improving a radiating performance, wherein said radiating passage is formed by joining a pair of pressed plates facing to each other at their outer peripheries, and has a projection formed as a rib protruding from an inside surface of at least one of said pair of pressed plates and disposed to be distant from the bottom surface of said radiating passage by a predetermined distance, said inner fin is sandwiched between said pair of pressed plates and fixed by said projection, and said projection has a shape so that a fluid passage is provided by a gap between said projection and an inside surface of said pressed plate opposing thereto.

7. A cooling apparatus according to claim 6, wherein said inside surface of said pressed plate defines the bottom surface of said radiating passage, and said gap is provided between said projection and said bottom surface.

8. A cooling apparatus according to claim 6, wherein said pressed plated opposing said projection has another projection opposing said projection, and said gap is defined between said projection and said another projection opposing each other.

9. A cooling apparatus for cooling a high-temperature medium by boiling and condensing refrigerant, said cooling apparatus comprising:

a refrigerant tank for containing liquid refrigerant which is partially boiled and vaporized into gaseous refrigerant by heat transferred from said high-temperature medium, and for sending out gas-liquid mixed refrigerant of the gaseous refrigerant and the liquid refrigerant, said refrigerant tank including:

a vapor passage where said liquid refrigerant is boiled and vaporized; and a condensed liquid passage to which a condensed liquid refrigerant returns;

a radiator communicating with said refrigerant tank to receive the gas-liquid mixed refrigerant from said refrigerant tank, for transferring heat of the gas-liquid mixed refrigerant to a low-temperature medium to condense the gaseous refrigerant and for returning the liquid refrigerant and the condensed liquid refrigerant to said refrigerant tank, said radiator including:

a radiating passage arranged substantially horizontally or with inclination against a horizontal and defining a bottom surface, for condensing the gaseous refrigerant;

an inner fin disposed in said radiating passage for improving a radiating performance;

a projection provided in said radiating passage for positioning and fixing said inner fin, and disposed to be distant from the bottom surface of said radiating passage by a predetermined distance;

an inflow communicating portion communicating with an upstream end of said radiating passage;

an outflow communicating portion communicating with a downstream end of said radiating passage;

an inflow chamber allowing said vapor passage to communicate with said inflow communicating portion; and an outflow chamber allowing said condensed liquid passage to communicate with said outflow communicating portion.

* * * * *